US009318682B2

(12) United States Patent
Lorimer et al.

(10) Patent No.: US 9,318,682 B2
(45) Date of Patent: Apr. 19, 2016

(54) MODULAR THERMOELECTRIC UNITS FOR HEAT RECOVERY SYSTEMS AND METHODS THEREOF

(71) Applicant: Alphabet Energy, Inc., Hayward, CA (US)

(72) Inventors: Adam Lorimer, Walnut Creek, CA (US); Matthew L. Scullin, San Francisco, CA (US); Sravan Kumar R. Sura, Fremont, CA (US); Christopher Hannemann, Berkeley, CA (US)

(73) Assignee: Alphabet Energy, Inc, Hayward, CA (US)

( * ) Notice: Subject to any disclaimer, the term of this patent is extended or adjusted under 35 U.S.C. 154(b) by 0 days.

(21) Appl. No.: 13/749,470

(22) Filed: Jan. 24, 2013

(65) Prior Publication Data

US 2013/0186445 A1 Jul. 25, 2013

Related U.S. Application Data

(60) Provisional application No. 61/590,597, filed on Jan. 25, 2012.

(51) Int. Cl.
*H01L 35/02* (2006.01)
*H01L 35/32* (2006.01)
*F28F 9/02* (2006.01)
(Continued)

(52) U.S. Cl.
CPC .............. *H01L 35/32* (2013.01); *F28F 9/0246* (2013.01); *F28F 9/0253* (2013.01); *H01L 35/30* (2013.01); *H01L 35/34* (2013.01);
(Continued)

(58) Field of Classification Search
None
See application file for complete search history.

(56) References Cited

U.S. PATENT DOCUMENTS 3,212,274 A * 10/1965 Eidus ...................... F25B 21/04
165/110
4,292,579 A 9/1981 Constant
(Continued)

FOREIGN PATENT DOCUMENTS

JP 2009/260173 11/2009
WO WO 2006/049285 5/2006
(Continued)

OTHER PUBLICATIONS

Patent Cooperation Treaty, International Search Report, mailed Jan. 27, 2015, in Application No. PCT/US2014/053102.
(Continued)

*Primary Examiner* — James Lin
*Assistant Examiner* — Liesl C Baumann
(74) *Attorney, Agent, or Firm* — Jones Day

(57) ABSTRACT

Apparatus and method for generating electricity. The apparatus includes one or more first components configured to extract heat from at least a first fluid flow at a first temperature to one or more devices configured to convert thermal energy to electric energy. The first fluid flow is in a first direction. Additionally, the apparatus includes one or more second components configured to transfer heat from the one or more devices to at least a second fluid flow at a second temperature. The second temperature is lower than the first temperature, and the second fluid flow is in a second direction. Each first part of the first fluid flow corresponds to a first shortest distance to the one or more devices, and the first shortest distance is less than half the square root of the total free flow area for a corresponding first cross-section of the first fluid flow.

14 Claims, 27 Drawing Sheets

(51) Int. Cl.
*H01L 35/34* (2006.01)
*H01L 35/30* (2006.01)

(52) U.S. Cl.
CPC ...... *F28F 2009/029* (2013.01); *F28F 2250/06* (2013.01); *F28F 2250/106* (2013.01)

(56) References Cited

U.S. PATENT DOCUMENTS

| | | | |
|---|---|---|---|
| 4,959,119 | A | 9/1990 | Lantzer |
| 5,723,799 | A | 3/1998 | Murayama et al. |
| 5,959,341 | A | 9/1999 | Tsuno et al. |
| 6,314,741 | B1 | 11/2001 | Hiraishi |
| 6,389,983 | B1 * | 5/2002 | Coester et al. ............... 104/155 |
| 6,397,618 | B1 * | 6/2002 | Chu .................... F25B 25/00 165/104.22 |
| 6,410,971 | B1 | 6/2002 | Otey |
| 6,700,052 | B2 | 3/2004 | Bell et al. |
| 6,410,971 | C1 | 4/2008 | Otey |
| 7,531,739 | B1 | 5/2009 | Moczygemba |
| 7,999,172 | B2 | 8/2011 | Yu |
| 9,065,017 | B2 | 6/2015 | Reifenberg et al. |
| 2001/0002319 | A1 | 5/2001 | Tauchi et al. |
| 2006/0017170 | A1 | 1/2006 | Chen et al. |
| 2006/0053969 | A1 | 3/2006 | Harada et al. |
| 2006/0179820 | A1 | 8/2006 | Sullivan |
| 2007/0095383 | A1 | 5/2007 | Tajima |
| 2007/0290322 | A1 | 12/2007 | Zhao et al. |
| 2008/0023057 | A1 | 1/2008 | Nakajima et al. |
| 2008/0308140 | A1 | 12/2008 | Nakamura |
| 2009/0025771 | A1 | 1/2009 | Stark |
| 2009/0205342 | A1 * | 8/2009 | Jang .................. B60H 1/00478 62/3.3 |
| 2010/0011781 | A1 | 1/2010 | Lents et al. |
| 2010/0167444 | A1 | 7/2010 | Chen et al. |
| 2010/0236595 | A1 * | 9/2010 | Bell et al. ................. 136/205 |
| 2011/0016888 | A1 | 1/2011 | Haass et al. |
| 2011/0018155 | A1 | 1/2011 | Stefan et al. |
| 2011/0020969 | A1 | 1/2011 | Haas et al. |
| 2011/0114146 | A1 | 5/2011 | Scullin |
| 2011/0167839 | A1 * | 7/2011 | Kobayashi .............. H01L 35/30 62/3.2 |
| 2011/0168223 | A1 | 7/2011 | Dede et al. |
| 2011/0204500 | A1 | 8/2011 | Lim et al. |
| 2011/0252774 | A1 | 10/2011 | Spieth et al. |
| 2011/0258995 | A1 | 10/2011 | Limbeck et al. |
| 2012/0000500 | A1 | 1/2012 | Iida et al. |
| 2012/0017575 | A1 * | 1/2012 | Sloss .................... F01N 5/02 60/320 |
| 2012/0042661 | A1 | 2/2012 | Danenberg et al. |
| 2012/0057305 | A1 | 3/2012 | Morisaku et al. |
| 2012/0097206 | A1 | 4/2012 | Sadaoka et al. |
| 2012/0098162 | A1 | 4/2012 | Snyder et al. |
| 2012/0118343 | A1 | 5/2012 | Iida et al. |
| 2012/0152294 | A1 | 6/2012 | Kim et al. |
| 2012/0152295 | A1 | 6/2012 | Matus et al. |
| 2012/0207641 | A1 | 8/2012 | Rubio et al. |
| 2012/0247527 | A1 | 10/2012 | Scullin et al. |
| 2012/0295074 | A1 | 11/2012 | Yi et al. |
| 2012/0319082 | A1 | 12/2012 | Yi et al. |
| 2013/0001480 | A1 | 1/2013 | Malik et al. |
| 2013/0146116 | A1 | 6/2013 | Jovovic et al. |
| 2013/0175654 | A1 | 7/2013 | Muckenhirn et al. |
| 2013/0187130 | A1 | 7/2013 | Matus et al. |
| 2013/0199337 | A1 | 8/2013 | Udono et al. |
| 2014/0024163 | A1 | 1/2014 | Aguirre et al. |
| 2014/0116491 | A1 | 5/2014 | Reifenberg et al. |
| 2014/0182644 | A1 | 7/2014 | Aguirre et al. |
| 2014/0193982 | A1 | 7/2014 | Yi et al. |
| 2014/0318588 | A1 | 10/2014 | Kouma et al. |

FOREIGN PATENT DOCUMENTS

| | | |
|---|---|---|
| WO | WO 2009/026466 | 2/2009 |
| WO | WO 2011/060149 | 5/2011 |
| WO | WO 2012/068426 | 5/2012 |
| WO | WO 2012/075359 | 6/2012 |
| WO | WO 2012/088085 | 6/2012 |
| WO | WO 2012/161757 | 11/2012 |
| WO | WO 2013/010547 | 1/2013 |
| WO | WO 2013/112710 | 8/2013 |
| WO | WO 2013/119755 | 8/2013 |
| WO | WO 2014/084315 | 6/2014 |

OTHER PUBLICATIONS

Patent Cooperation Treaty, Written Opinion, mailed Jan. 27, 2015, in Application No. PCT/US2014/053102.
Patent Cooperation Treaty, International Search Report, mailed May 28, 2013, in Application No. PCT/US2013/022930.
Patent Cooperation Treaty, Written Opinion, mailed May 28, 2013, in Application No. PCT/US2013/022930.
Patent Cooperation Treaty, International Search Report, mailed Mar. 10, 2014, in Application No. PCT/US2013/064812.
Patent Cooperation Treaty, Written Opinion, mailed Mar. 10, 2014, in Application No. PCT/US2013/064812.
United States Patent and Trademark Office, Notice of Allowance issued in U.S. Appl. No. 14/469,404, mailed Feb. 23, 2015.
Sakamoto et al., "The Use of Transition-Metal Silicides to Reduce the Contact Resistance Between the Electrode and Sintered n-Type Mg2Si," J. Electronic Materials 41(6):1805-1810 (2012).
Sakamoto et al., "Formation of Ni Electrodes on Sintered N-type Mg2Si Using Monobloc Sintering and Electroless Plating Methods," AIP Conf. Proc., 1449:223-226 (2012).
United States Patent and Trademark Office, Office Action issued in U.S. Appl. No. 13/947,400, mailed Oct. 3, 2014.
Australian Patent Office, Patent Examination Report, mailed Nov. 11, 2015 in Application No. 2013212087.
Chen et al., "Dispenser-printed thick film thermoelectric materials," Proceedings of PowerMEMS Conference, Dec. 2010, pp. 223-226.
Goncalves et al., "Fabrication of flexible thermoelectric microcoolers using planar thin film technologies," J. Micromec. Microeng. 17: S168-S173 (2007).
Patent Cooperation Treaty, International Search Report, mailed Jul. 23, 2015, in Application No. PCT/US2015/024484.
Patent Cooperation Treaty, Written Opinion, mailed Jul. 23, 2015, in Application No. PCT/US2015/024484.
United States Patent and Trademark Office, Notice of Allowance issued in U.S. Appl. No. 13/947,400, mailed Mar. 24, 2015.
United States Patent and Trademark Office, Notice of Allowance issued in U.S. Appl. No. 13/947,400, mailed Jul. 6, 2015.

* cited by examiner

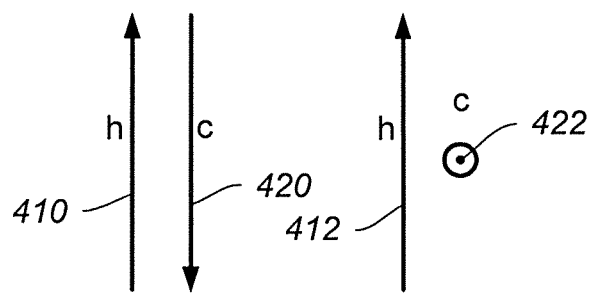
FIG. 5C     FIG. 5D

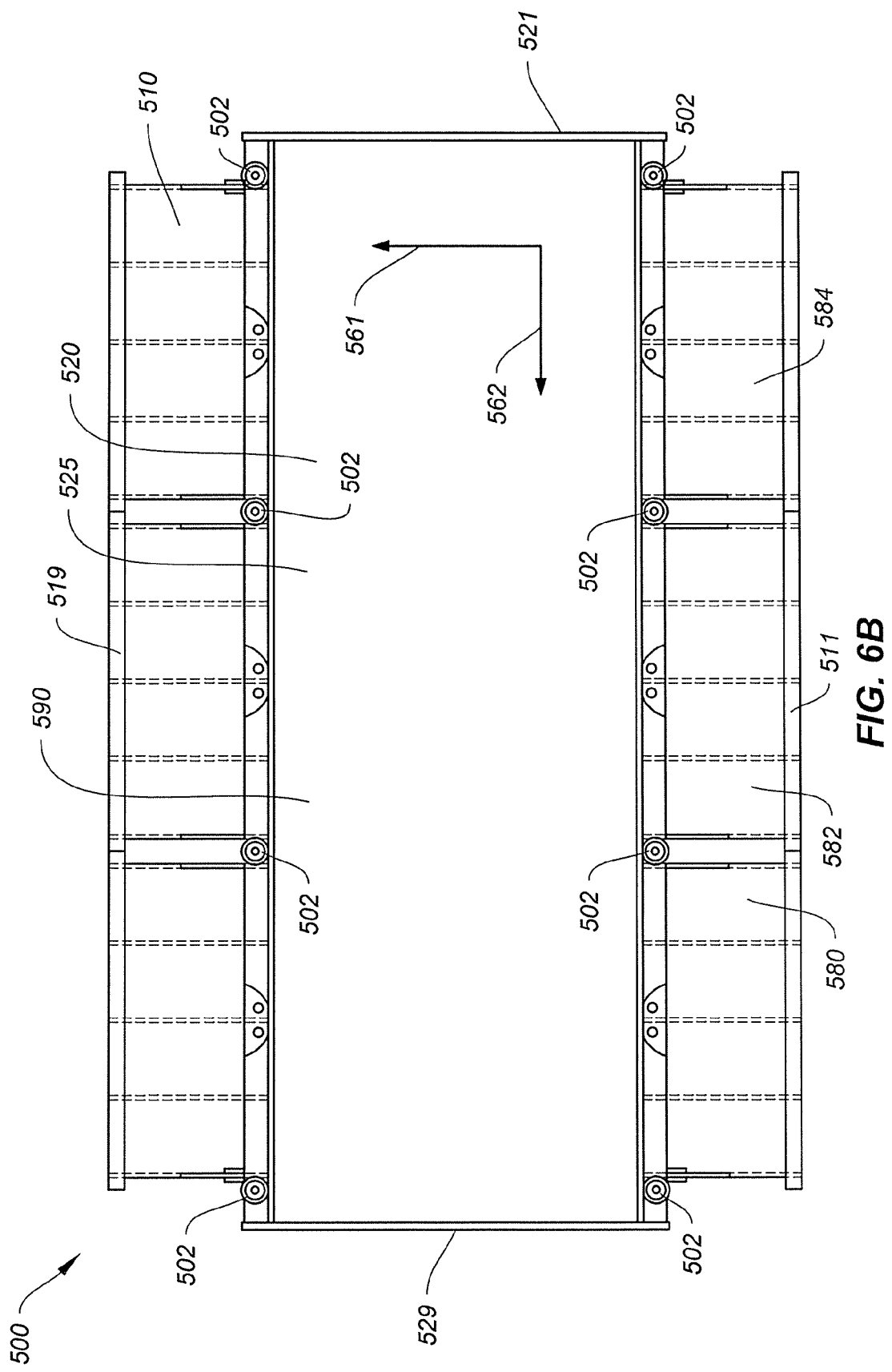

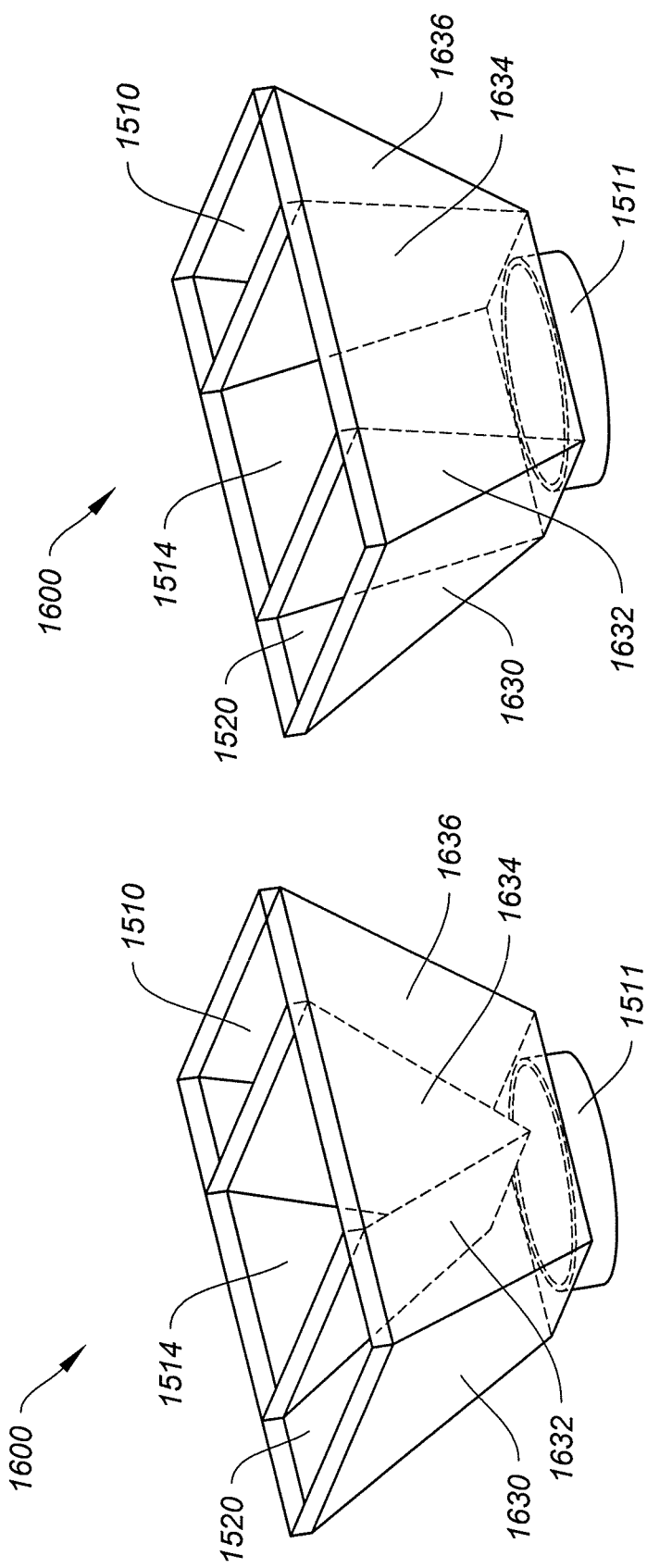

MODULAR THERMOELECTRIC UNITS FOR HEAT RECOVERY SYSTEMS AND METHODS THEREOF

1. CROSS-REFERENCES TO RELATED APPLICATIONS

This application claims priority to U.S. Provisional Application No. 61/590,597, filed Jan. 25, 2012, commonly assigned and incorporated by reference herein for all purposes.

2. BACKGROUND OF THE INVENTION

The present invention is directed to conversion between heat and electricity. More particularly, the invention provides systems and methods for recovery of waste heat. Merely by way of example, the invention has been applied to a modular thermoelectric unit that can be easily assembled and scaled up to an optimal sized system for providing solutions for various heat recovery applications including industrial combustion processes with enhanced power output, reduced parasitic power losses, and lowered manufacture cost. However, it would be recognized that the invention has a much broader range of applicability.

Any process that consumes energy usually is not 100% efficient and often generates waste energy, usually in the form of heat. For example, the industrial combustion process generates a substantial amount of waste heat via an exhaust gas flow at high temperature. In order to improve the efficiency of the combustion process, effectively capturing and converting some of this waste heat into a useful form without disturbing the primary operation would be desired. A conventional technique that has been considered is to place thermoelectric (TE) devices onto the exhaust system associated with the combustion process.

The thermoelectric devices are made from thermoelectric materials that can convert an appreciable amount of thermal energy into electricity in an applied temperature gradient (e.g., the Seebeck effect) or pump heat in an applied electric field (e.g., the Peltier effect). Interest in the use of thermoelectric devices that comprise thermoelectric materials has grown in recent years partly due to the heightened need for systems that recover waste heat as electricity to improve energy efficiency in the industrial combustion process.

To date, thermoelectrics have had limited commercial applicability often due to poor cost effectiveness and low conversion performance in comparison with other technologies that accomplish similar energy generation or refrigeration. Where there are almost no other technologies as suitable as thermoelectrics for lightweight and low footprint applications, thermoelectrics have nonetheless been limited by their high costs in thermoelectric materials and the manufacture of high-performance thermoelectric devices. The thermoelectric materials in conventional thermoelectric modules are generally comprised of bismuth telluride or lead telluride, which are toxic, difficult to manufacture with, and expensive to procure and process.

More recently, advances in developing and manufacturing nano-structured materials with enhanced thermoelectric performance have been initiated. In particular, the thermoelectric performance of the nano-structured material is characterized by, e.g., high efficiency, high power density, or high "thermoelectric figure of merit" ZT (where ZT is equal to $S^2\sigma/k$, and S is the Seebeck coefficient, $\sigma$ is the electrical conductivity, and k is the thermal conductivity). This technical development drives a need for devices and/or systems in both alternative energy production and microelectronics that usually requires high manufacturability and low cost. This technical development also drives the need for converting waste heat in exhaust from many industrial systems, such as industrial combustion process, into useful electrical power.

FIG. 1 is a simplified diagram showing a conventional heat recovery system using one or more thermoelectric device components for generating power from a waste heat source. As shown, in a conventional heat recovery system 4000 (e.g., a conventional thermoelectric generation system), one or more thermoelectric (TE) device components 4010 are attached on one side to a hot plate 4020 of a hot-side heat exchanger 4022 and leave the other side subjecting to one or more cold fluid flows 4030 (e.g., one or more cold air flows, one or more cold gas flows). As shown, the one or more thermoelectric device components 4010 are disposed entirely outside the main hot flow region 4040. The hot plate 4020 is thermally connected to an extended conductor 4024 with multiple fins 4026 sticking into the hot flow region 4040. For example, one or more hot fluid flows 4042 (e.g., one or more hot air flows, one or more hot gas flows) move out of an exhaust pipe or a chimney 4044, and the extended conductor 4024 and the multiple fins 4026 serve as an indirect thermal energy collector. But such indirect thermal energy collector often is quite inefficient in utilizing the one or more hot fluid flows 4042 of the waste heat.

To take advantage of the high-temperature thermoelectric devices and flexibly apply these devices for various industrial combustion processes without disturbing the operation of the primary process, it is highly desirable to make an improved thermoelectric system for enhanced power output, lowered parasitic power loss, and reduced cost.

3. BRIEF SUMMARY OF THE INVENTION

The present invention is directed to conversion between heat and electricity. More particularly, the invention provides systems and methods for recovery of waste heat. Merely by way of example, the invention has been applied to a modular thermoelectric unit that can be easily assembled and scaled up to an optimal sized system for providing solutions for various heat recovery applications including industrial combustion processes with enhanced power output, reduced parasitic power losses, and lowered manufacture cost. However, it would be recognized that the invention has a much broader range of applicability.

According to one embodiment, an apparatus for generating electricity includes one or more first components configured to extract heat from at least a first fluid flow at a first temperature to one or more devices configured to convert thermal energy to electric energy. The first fluid flow is in a first direction. Additionally, the apparatus includes one or more second components configured to transfer heat from the one or more devices to at least a second fluid flow at a second temperature. The second temperature is lower than the first temperature, and the second fluid flow is in a second direction. Each first part of the first fluid flow corresponds to a first shortest distance to the one or more devices, and the first shortest distance is less than half the square root of the total free flow area for a corresponding first cross-section of the first fluid flow. The first cross-section is perpendicular to the first direction. Each second part of the second fluid flow corresponds to a second shortest distance to the one or more devices, and the second shortest distance is less than half the square root of the total free flow area for a corresponding second cross-section of the second fluid flow. The second cross-section is perpendicular to the second direction.

According to another embodiment, a thermoelectric apparatus includes one or more first channels configured to receive one or more first parts of a first fluid flow at a first temperature, and one or more second channels configured to receive one or more parts of a second fluid flow at a second temperature. The second temperature is lower than the first temperature. Additionally, the apparatus includes one or more third channels configured to receive one or more second parts of the first fluid flow, and the one or more third channels are separated from the one or more first channels by at least the one or more second channels. Moreover, the apparatus includes one or more first thermoelectric materials located between the one or more first channels and the one or more second channels, and one or more second thermoelectric materials located between the one or more second channels and the one or more third channels.

According to yet another embodiment, a heat recovery system includes a thermoelectric apparatus, a first duct coupled to the thermoelectric apparatus, and a second duct not coupled to the thermoelectric apparatus. The first duct and the second duct both are connected to a third duct and configured to receive by the first duct a first fluid flow at a first temperature from the third duct if the second duct does not receive the first fluid flow and to receive by the second duct the first fluid flow from the third duct if the first duct does not receive the first fluid flow. The thermoelectric apparatus is configured to receive at least a second fluid flow at a second temperature. The second fluid flow moves into the thermoelectric apparatus from one or more first perimeter parts of the thermoelectric apparatus in a first direction. The first direction is towards the second duct, and the second temperature is lower than the first temperature. Also, the thermoelectric apparatus is configured to discharge the second fluid flow into a fourth duct, and the fourth duct is the second duct or is substantially parallel with the second duct.

According to yet another embodiment, a thermoelectric apparatus includes a first heat exchanger configured to transfer heat to or extract heat from a first fluid flow at a first temperature, and a second heat exchanger configured to extract heat from or transfer heat to a second fluid flow at a second temperature. The second temperature is different from the first temperature. Additionally, the apparatus includes a third heat exchanger configured to transfer heat to or extract heat from a third fluid flow at the first temperature, and the third heat exchanger is separated from the first heat exchanger by at least the second heat exchanger. Moreover, the apparatus includes one or more first thermoelectric materials sandwiched between the first heat exchanger and the second heat exchanger, one or more second thermoelectric materials sandwiched between the second heat exchanger and the third heat exchanger, and one or more components extending from the first heat exchanger to the third heat exchanger without making any thermal contact with the second heat exchanger. The one or more first thermoelectric materials, the second heat exchanger, and the one or more second thermoelectric materials are located between the first heat exchanger and the third heat exchanger, and the one or more components are configured to apply one or more compressive forces to at least the one or more first thermoelectric materials, the second heat exchanger, and the one or more second thermoelectric materials.

According to yet another embodiment, a method for generating electricity includes extracting heat from at least a first fluid flow at a first temperature to one or more devices configured to convert thermal energy to electric energy. The first fluid flow is in a first direction. Additionally, the method includes transferring heat to at least a second fluid flow at a second temperature. The second temperature is lower than the first temperature, and the second fluid flow is in a second direction. Each first part of the first fluid flow corresponds to a first shortest distance to the one or more devices, and the first shortest distance is less than half the square root of the total free flow area for a corresponding first cross-section of the first fluid flow. The first cross-section is perpendicular to the first direction. Each second part of the second fluid flow corresponds to a second shortest distance to the one or more devices, and the second shortest distance is less than half the square root of the total free flow area for a corresponding second cross-section of the second fluid flow. The second cross-section is perpendicular to the second direction.

According to yet another embodiment, a thermoelectric method for generating electricity includes receiving, by one or more first channels, one or more first parts of a first fluid flow at a first temperature, and receiving, by one or more second channels, one or more parts of a second fluid flow at a second temperature. The second temperature is lower than the first temperature. Additionally, the method includes receiving, by one or more third channels, one or more second parts of the first fluid flow. The one or more third channels are separated from the one or more first channels by at least the one or more second channels. Moreover, the method includes generating electricity by at least one or more first thermoelectric materials and one or more second thermoelectric materials. The one or more first thermoelectric materials are located between the one or more first channels and the one or more second channels, and the one or more second thermoelectric materials are located between the one or more second channels and the one or more third channels.

According to yet another embodiment, a method for heat recovery includes receiving, by a first duct, a first fluid flow at a first temperature from a third duct connected to both the first duct and a second duct if the second duct does not receive the first fluid flow. The first duct is coupled to a thermoelectric apparatus, and the second duct is not coupled to the thermoelectric apparatus. Additionally, the method includes receiving, by the second duct, the first fluid flow from the third duct if the first duct does not receive the first fluid flow. Moreover, the method includes receiving, by the thermoelectric apparatus, at least a second fluid flow at a second temperature, and the second fluid flow moves into the thermoelectric apparatus from one or more first perimeter parts of the thermoelectric apparatus in a first direction. The first direction is towards the second duct, and the second temperature is lower than the first temperature. Also, the method includes discharging, by the thermoelectric apparatus, the second fluid flow into a fourth duct. The fourth duct is the second duct or is substantially parallel with the second duct.

According to yet another embodiment, a method for thermoelectric conversion includes transferring heat to or extracting heat from a first fluid flow at a first temperature by a first heat exchanger, and extracting heat from or transferring heat to a second fluid flow at a second temperature by a second heat exchanger. The second temperature is different from the first temperature. Additionally, the method includes transferring heat to or extracting heat from a third fluid flow at the first temperature by a third heat exchanger, and the third heat exchanger is separated from the first heat exchanger by at least the second heat exchanger. Moreover, the method includes applying, by one or more components, one or more compressive forces to at least one or more first thermoelectric materials, the second heat exchanger, and one or more second thermoelectric materials. The one or more first thermoelectric materials are sandwiched between the first heat exchanger and the second heat exchanger, and the one or more second thermoelectric materials are sandwiched between the second heat exchanger and the third heat exchanger. The one or more first thermoelectric materials, the second heat exchanger, and the one or more second thermoelectric materials are located between the first heat exchanger and the third heat exchanger. The process for applying, by one or more components, one or more compressive forces includes extending the one or more components from the first heat exchanger to the third heat exchanger without making any thermal contact with the second heat exchanger.

Depending upon the embodiment, one or more benefits may be achieved. These benefits and various additional objects, features, and advantages of the present invention can be fully appreciated with reference to the detailed description and accompanying drawings that follow.

4. BRIEF DESCRIPTION OF THE DRAWINGS

FIGS. 5C-5D are simplified diagrams showing fluid flows in a cold sink component and a heat source component as parts of a modular thermoelectric unit as shown in FIGS. 2B-2C, FIGS. 3A-3B, and/or FIG. 4B according to some embodiments of the present invention.

FIGS. 6A-6D are simplified diagrams showing various views of a modular thermoelectric unit according to one embodiment of the present invention.

FIGS. 17A-17B are simplified diagrams showing the bypass duct and the supply ducts as parts of a heat recovery system including thermoelectric system according to yet another embodiment of the present invention.

5. DETAILED DESCRIPTION OF THE INVENTION

The present invention is directed to conversion between heat and electricity. More particularly, the invention provides systems and methods for recovery of waste heat. Merely by way of example, the invention has been applied to a modular thermoelectric unit that can be easily assembled and scaled up to an optimal sized system for providing solutions for various heat recovery applications including industrial combustion processes with enhanced power output, reduced parasitic power losses, and lowered manufacture cost. However, it would be recognized that the invention has a much broader range of applicability.

Figure 2A:
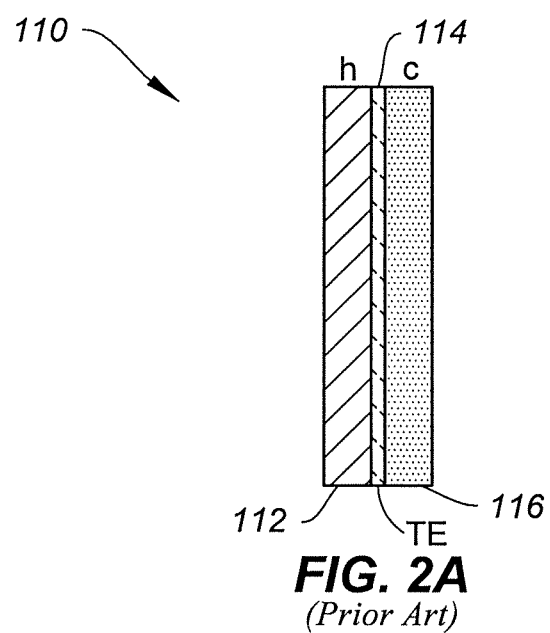
FIG. 2A is a simplified diagram showing a conventional modular thermoelectric unit.

FIG. 2A is a simplified diagram showing a conventional modular thermoelectric unit. As shown in FIG. 2A, a modular thermoelectric unit 110 includes a cold sink component 112 (e.g., a cold-side heat exchanger), a heat source component 116 (e.g., a hot-side heat exchanger), and a thermoelectric device component 114. For example, the thermoelectric device component 114 is sandwiched between the cold sink component 112 and the heat source component 116. In another example, the thermoelectric device component 114 forms a cold junction with the cold sink component 112, and forms a hot junction with the heat source component 116.

In one embodiment, the cold sink component 112 serves as a low temperature source for the thermoelectric device component 114, and the heat source component 116 serves as a high temperature source for the thermoelectric device component 114. In another embodiment, the thermoelectric device component 114 can convert thermal energy into electricity in response to the temperature gradient between the cold junction and the hot junction.

Figure 2B:
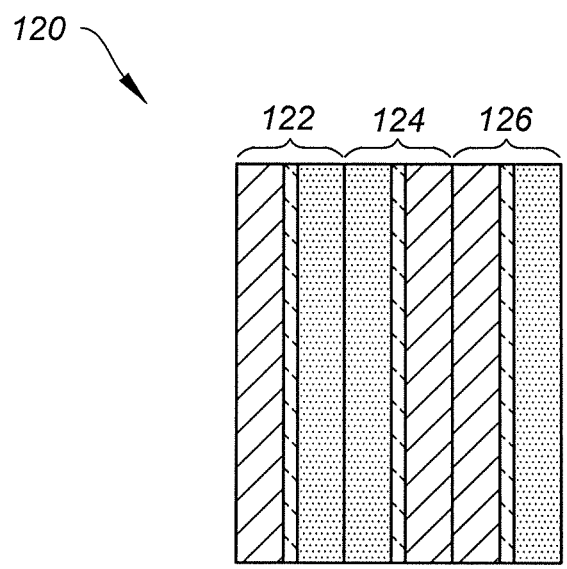
FIGS. 2B-2C are simplified diagrams showing a modular thermoelectric unit according to certain embodiments of the present invention.
Figure 2C:
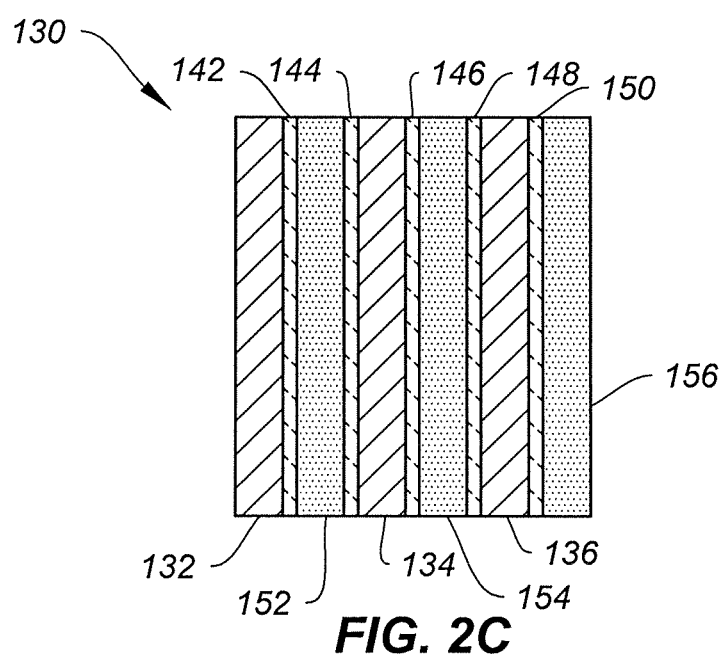

FIGS. 2B-2C are simplified diagrams showing a modular thermoelectric unit according to certain embodiments of the present invention. These diagrams are merely examples, which should not unduly limit the scope of the claims. One of ordinary skill in the art would recognize many variations, alternatives, and modifications.

As shown in FIG. 2B, a modular thermoelectric unit 120 includes thermoelectric unit components 122, 124, and 126. For example, each of the thermoelectric unit components 122, 124, and 126 includes a cold sink component (e.g., a cold-side heat exchanger), a heat source component (e.g., a hot-side heat exchanger), and a thermoelectric device component sandwiched between the cold sink component and the heat source component. In another example, the modular thermoelectric unit 120 is formed by stacking the thermoelectric unit components 122, 124, and 126 together.

According to one embodiment, the heat source component of the thermoelectric unit component 122 is in contact with the heat source component of the thermoelectric unit component 124, and the cold sink component of the thermoelectric unit component 124 is in contact with the cold sink component of the thermoelectric unit component 126. According to another embodiment, a plurality of modular thermoelectric units 120 are assembled together by attaching a cold sink component of a modular thermoelectric unit 120 to a cold sink component of another modular thermoelectric unit 120, and/or by attaching a heat source component of a modular thermoelectric unit 120 to a heat source component of another modular thermoelectric unit 120.

As shown in FIG. 2C, a modular thermoelectric unit 130 includes cold sink components 132, 134 and 136 (e.g., three cold-side heat exchangers), thermoelectric device components 142, 144, 146, 148 and 150, and heat source components 152, 154 and 156 (e.g., three hot-side heat exchangers). For example, thermoelectric device component 142 is sandwiched between the cold sink component 132 and the heat source component 152, the thermoelectric device component 144 is sandwiched between the heat source component 152 and the cold sink component 134, the thermoelectric device component 146 is sandwiched between the cold sink component 134 and the heat source component 154, the thermoelectric device component 148 is sandwiched between the heat source component 154 and the cold sink component 136, and the thermoelectric device component 150 is sandwiched between the cold sink component 136 and the heat source component 156. In another example, each of the heat source components 152 and 154 form two hot junctions with its two neighboring thermoelectric device components, and each of the cold sink components 134 and 136 form two cold junctions with its two neighboring thermoelectric device components. According to one embodiment, a plurality of modular thermoelectric units 130 are assembled together by attaching a cold sink component of a modular thermoelectric unit 130 to a cold sink component of another modular thermoelectric unit 130, and/or by attaching a heat source component of a modular thermoelectric unit 130 to a heat source component of another modular thermoelectric unit 130.

Figure 3A:
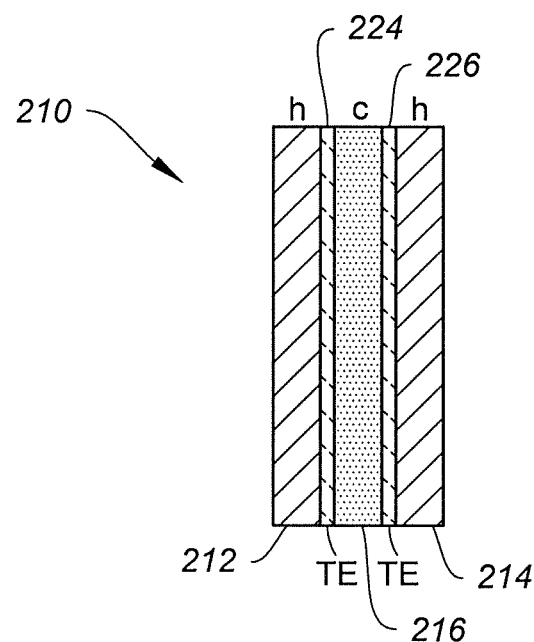
FIGS. 3A-3B are simplified diagrams showing a modular thermoelectric unit according to some embodiments of the present invention.
Figure 3B:
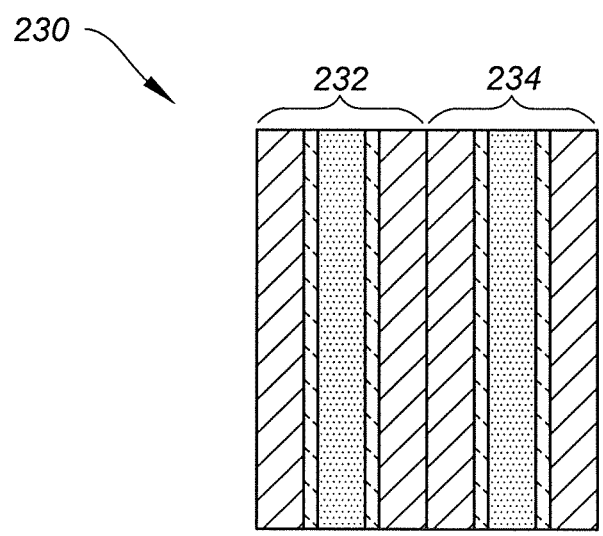

FIGS. 3A-3B are simplified diagrams showing a modular thermoelectric unit according to some embodiments of the present invention. These diagrams are merely examples, which should not unduly limit the scope of the claims. One of ordinary skill in the art would recognize many variations, alternatives, and modifications.

As shown in FIG. 3A, a modular thermoelectric unit 210 includes heat source components 212 and 214 (e.g., two hot-side heat exchangers), a cold sink component 216 (e.g., a cold-side heat exchanger), and thermoelectric device components 224 and 226. For example, the thermoelectric device component 224 is sandwiched between the heat source component 212 and the cold sink component 216, and the thermoelectric device component 226 is sandwiched between the cold sink component 216 and the heat source component 214. In another example, the cold sink component 216 is sandwiched between the thermoelectric device components 224 and 226.

According to one embodiment, the modular thermoelectric unit 210 includes two hot junctions formed between the heat source component 212 and the thermoelectric device component 224 and formed between the heat source component 214 and the thermoelectric device component 226. According to another embodiment, the modular thermoelectric unit 210 includes two cold junctions formed between the heat source component 216 and the thermoelectric device component 224 and formed between the heat source component 216 and the thermoelectric device component 226.

As shown in FIG. 3B, a modular thermoelectric unit 230 includes thermoelectric unit components 232 and 234. For example, each of the thermoelectric unit components 232 and 234 includes two heat source components (e.g., two hot-side heat exchangers), one cold sink component (e.g., one cold-side heat exchanger), and two thermoelectric device components, wherein one of the two thermoelectric device component is sandwiched between one of the two heat source components and the cold sink component, the other one of the two thermoelectric device components is sandwiched between the cold sink component and the other one of the two heat source components, and the cold sink component is sandwiched between the two thermoelectric device components. In another example, the modular thermoelectric unit 230 is formed by stacking the thermoelectric unit components 232 and 234 together.

According to one embodiment, the heat source component of the thermoelectric unit component 232 is in contact with the heat source component of the thermoelectric unit component 234. According to one embodiment, a plurality of modular thermoelectric units 230 are assembled together by attaching a heat source of a modular thermoelectric unit 230 to a heat source of another modular thermoelectric unit 230.

Figure 4A:
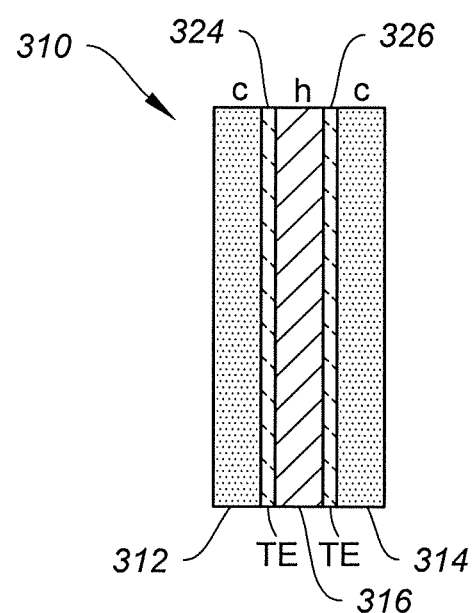
FIG. 4A is a simplified diagram showing a conventional modular thermoelectric unit.

FIG. 4A is a simplified diagram showing a conventional modular thermoelectric unit. As shown in FIG. 4A, a modular thermoelectric unit 310 includes cold sink components 312 and 314 (e.g., two cold-side heat exchangers), a heat source component 316 (e.g., a hot-side heat exchanger), and thermoelectric device components 324 and 326. For example, the thermoelectric device component 324 is sandwiched between the cold sink component 312 and the heat source component 316, and the thermoelectric device component 326 is sandwiched between the heat source component 316 and the cold sink component 314. In another example, the heat source component 316 is sandwiched between the thermoelectric device components 324 and 326.

According to one embodiment, the modular thermoelectric unit 310 includes two cold junctions formed between the cold sink component 312 and the thermoelectric device component 324 and formed between the cold sink component 314 and the thermoelectric device component 326. According to another embodiment, the modular thermoelectric unit 310 includes two hot junctions formed between the heat source component 316 and the thermoelectric device component 324 and formed between the heat source component 316 and the thermoelectric device component 326.

Figure 4B:
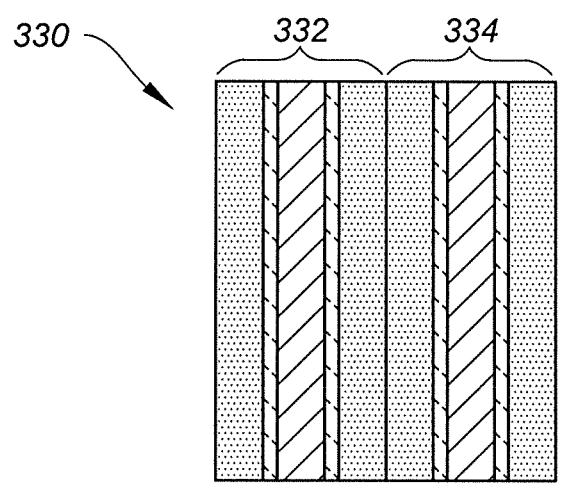
FIG. 4B is a simplified diagram showing a modular thermoelectric unit according to certain embodiments of the present invention.

FIG. 4B is a simplified diagram showing a modular thermoelectric unit according to certain embodiments of the present invention. This diagram is merely an example, which should not unduly limit the scope of the claims. One of ordinary skill in the art would recognize many variations, alternatives, and modifications.

As shown in FIG. 4B, a modular thermoelectric unit 330 includes thermoelectric unit components 332 and 334. For example, each of the thermoelectric unit components 332 and 334 includes two cold sink components (e.g., two cold-side heat exchangers), one heat source component (e.g., a hot-side heat exchanger), and two thermoelectric device components, wherein one of the two thermoelectric device components is sandwiched between one of the two cold sink components and the heat source component, the other one of the two thermoelectric device components is sandwiched between the heat source component and the other one of the two cold sink components, and the heat source component is sandwiched between the two thermoelectric device components. In another example, the modular thermoelectric unit 330 is formed by stacking the thermoelectric unit components 332 and 334 together.

According to one embodiment, the cold sink component of the thermoelectric unit component 332 is in contact with the cold sink component of the thermoelectric unit component 334. According to another embodiment, a plurality of modular thermoelectric units 330 are assembled together by attaching a cold sink of a modular thermoelectric unit 330 to a cold sink of another modular thermoelectric unit 330.

Figures 5A, 5B:
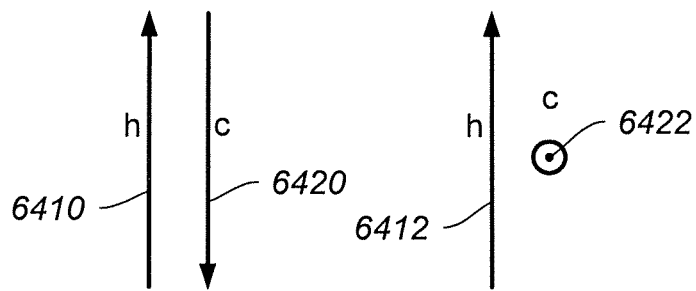
FIGS. 5A-5B are simplified diagrams showing fluid flows in a cold sink component and a heat source component as parts of a conventional modular thermoelectric unit as shown in FIG. 2A and/or FIG. 4A.

FIGS. 5A-5B are simplified diagrams showing fluid flows in a cold sink component and a heat source component as parts of a conventional modular thermoelectric unit as shown in FIG. 2A and/or FIG. 4A.

As shown in FIG. 5A, the arrow 6410 represents the fluid flow in a heat source component of the modular thermoelectric unit 110 as shown in FIG. 2A and/or the modular thermoelectric unit 310 as shown in FIG. 4A. Also as shown in FIG. 5A, the arrow 6420 represents the fluid flow in a cold sink component of the modular thermoelectric unit 110 as shown in FIG. 2A and/or the modular thermoelectric unit 310 as shown in FIG. 4A. For example, the fluid flow in the heat source component and the fluid flow in the cold sink component are in opposite directions. In another example, the fluid flow in the heat source component and the fluid flow in the cold sink component provide a temperature gradient between the hot junction and the cold junction that varies in one dimension.

As shown in FIG. 5B, the arrow 6412 represents the fluid flow in a heat source component of the modular thermoelectric unit 110 as shown in FIG. 2A and/or the modular thermoelectric unit 310 as shown in FIG. 4A. Also as shown in FIG. 5B, the dot 6422 represents the fluid flow in a cold sink component of the modular thermoelectric unit 110 as shown in FIG. 2A and/or the modular thermoelectric unit 310 as shown in FIG. 4A. For example, the fluid flow in the heat source component and the fluid flow in the cold sink component are in directions perpendicular to each other. In another example, the fluid flow in the heat source component and the fluid flow in the cold sink component provide a temperature gradient between the hot junction and the cold junction that varies in two dimensions, and a convenient spatial configuration for disposing one or more cooling fans and/or pumps, and/or one or more exhaust fans and/or pumps in order to control and drive the fluid flows.

FIGS. 5C-5D are simplified diagrams showing fluid flows in a cold sink component and a heat source component as parts of a modular thermoelectric unit as shown in FIGS. 2B-2C, FIGS. 3A-3B, and/or FIG. 4B according to some embodiments of the present invention. These diagrams are merely examples, which should not unduly limit the scope of the claims. One of ordinary skill in the art would recognize many variations, alternatives, and modifications.

As shown in FIG. 5C, the arrow 410 represents the fluid flow in a heat source component of the modular thermoelectric unit 120 as shown in FIG. 2B, the modular thermoelectric unit 130 as shown in FIG. 2C, the modular thermoelectric unit 210 as shown in FIG. 3A, the modular thermoelectric unit 230 as shown in FIG. 3B, and/or the modular thermoelectric unit 330 as shown in FIG. 4B. Also as shown in FIG. 5C, the arrow 420 represents the fluid flow in a cold sink component of the modular thermoelectric unit 120 as shown in FIG. 2B, the modular thermoelectric unit 130 as shown in FIG. 2C, the modular thermoelectric unit 210 as shown in FIG. 3A, the modular thermoelectric unit 230 as shown in FIG. 3B, and/or the modular thermoelectric unit 330 as shown in FIG. 4B. For example, the fluid flow in the heat source component and the fluid flow in the cold sink component are in opposite directions. In another example, the fluid flow in the heat source component and the fluid flow in the cold sink component provide a temperature gradient between the hot junction and the cold junction that varies in one dimension.

As shown in FIG. 5D, the arrow 412 represents the fluid flow in a heat source component of the modular thermoelectric unit 120 as shown in FIG. 2B, the modular thermoelectric unit 130 as shown in FIG. 2C, the modular thermoelectric unit 210 as shown in FIG. 3A, the modular thermoelectric unit 230 as shown in FIG. 3B, and/or the modular thermoelectric unit 330 as shown in FIG. 4B. Also as shown in FIG. 5D, the dot 422 represents the fluid flow in a cold sink component of the modular thermoelectric unit 120 as shown in FIG. 2B, the modular thermoelectric unit 130 as shown in FIG. 2C, the modular thermoelectric unit 210 as shown in FIG. 3A, the modular thermoelectric unit 230 as shown in FIG. 3B, and/or the modular thermoelectric unit 330 as shown in FIG. 4B. For example, the fluid flow in the heat source component and the fluid flow in the cold sink component are in directions perpendicular to each other. In another example, the fluid flow in the heat source component and the fluid flow in the cold sink component provide a temperature gradient between the hot junction and the cold junction that varies in two dimensions, and a convenient spatial configuration for disposing one or more cooling fans and/or pumps, and/or one or more exhaust fans and/or pumps in order to control and drive the fluid flows.

As discussed above and further emphasized here, FIGS. 2B-2C, FIGS. 3A-3B, and FIG. 4B are merely examples, which should not unduly limit the scope of the claims. One of ordinary skill in the art would recognize many variations, alternatives, and modifications. For example, the modular thermoelectric unit (e.g., the modular thermoelectric unit 120, 130, 210, 230, or 330) has a cuboid outline shape including at least one cold sink component, one heat source component, and a thermoelectric (TE) device component sandwiched between the heat source component and the cold sink component. In another example, although the cuboid outline shape is chosen for easy manufacture and assembly, other geometrical shapes can also be used depending on embodiments and system requirements for customized applications.

According to one embodiment, the heat source component includes a heat exchanger that utilizes thermal energy from a hot fluid flow of an existing industrial exhaust to form a hot side contacted with a hot terminal of the thermoelectric device component. According to another embodiment, the cold sink includes another heat exchanger that utilizes a natural and/or forced, ambient and/or supplied cold fluid flow to form a cold side contacted with a cold terminal of the thermoelectric device component. The hot junction and/or the cold junction is configured to maintain a temperature gradient for producing electrical power by thermoelectric device component, thereby achieving the goal for recovering heat which is otherwise wasted.

Figure 6A:
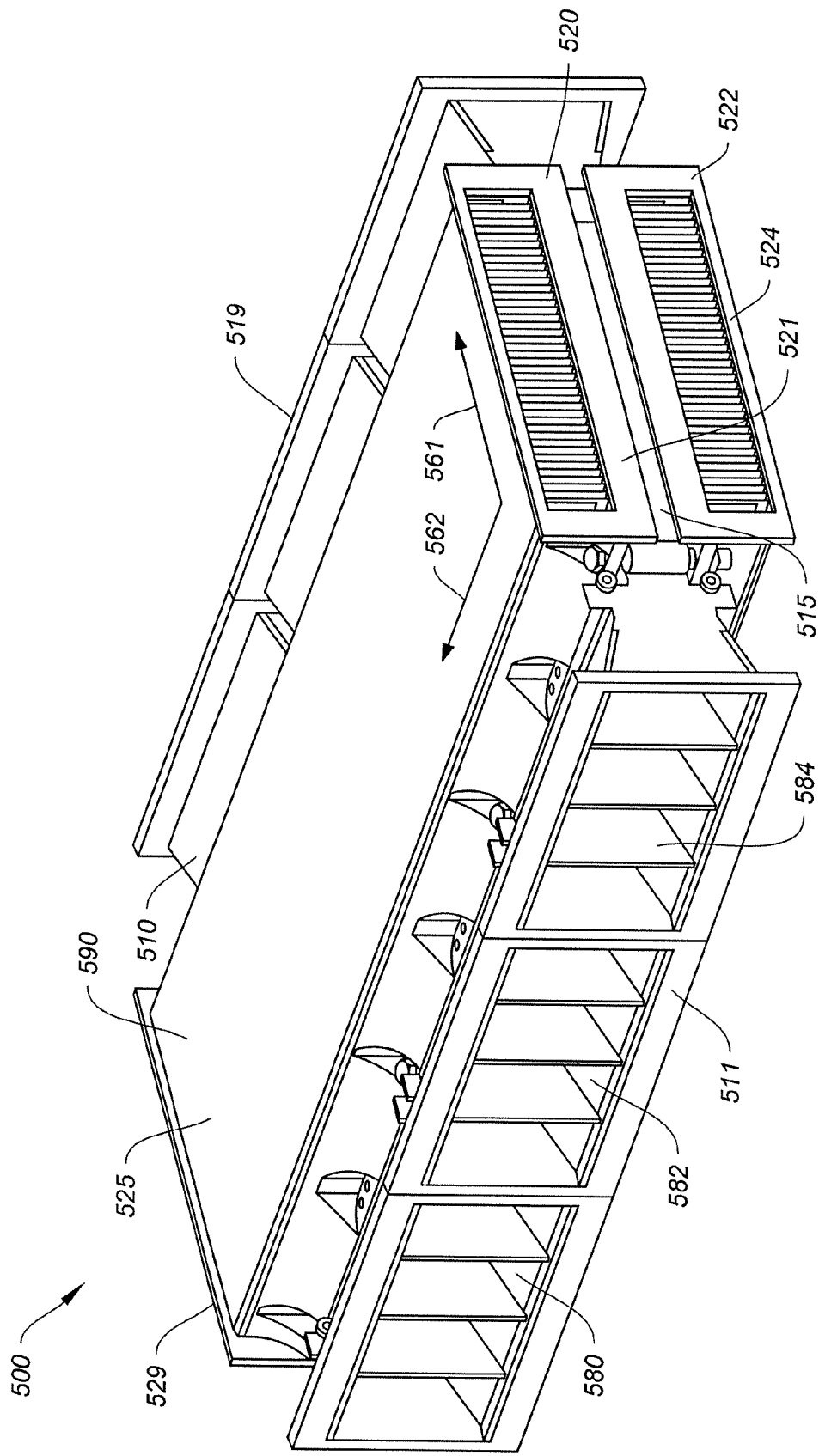
Figure 6C:
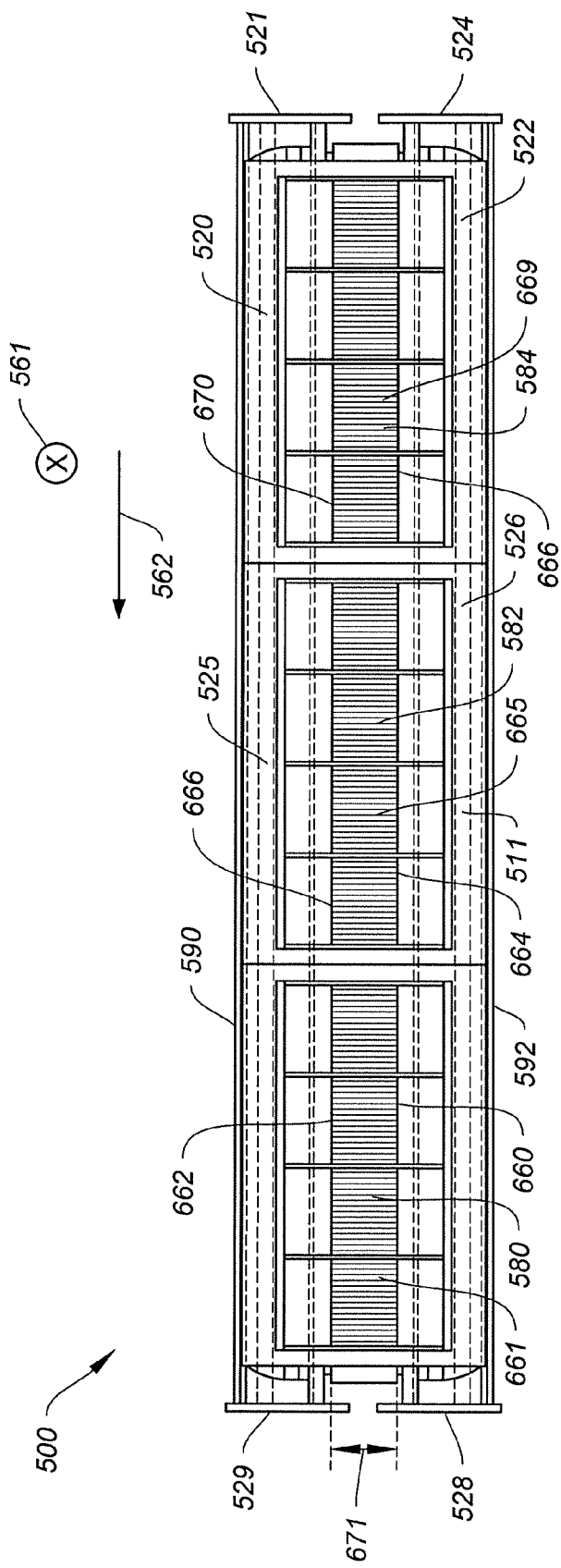
Figure 6D:
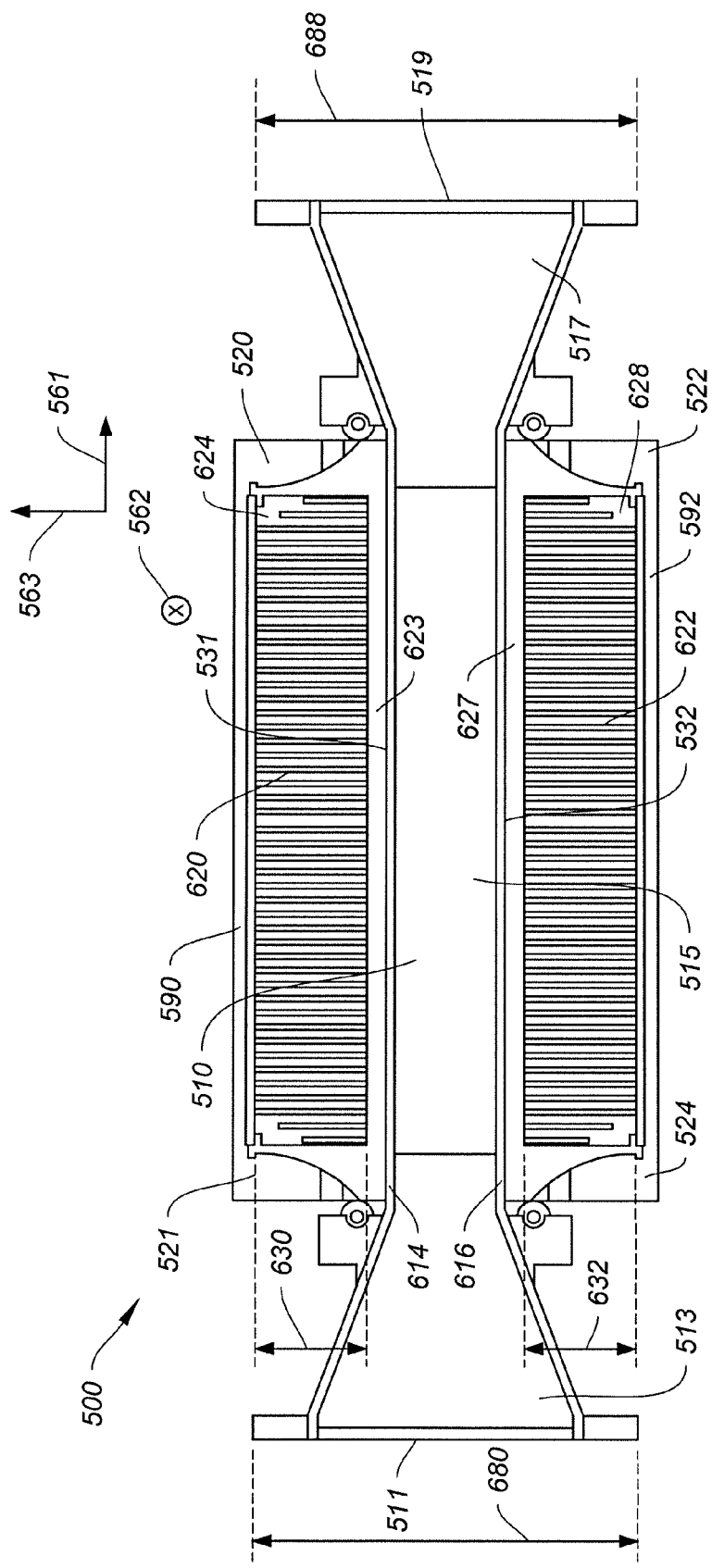

FIGS. 6A-6D are simplified diagrams showing various views of a modular thermoelectric unit according to one embodiment of the present invention. These diagrams are merely examples, which should not unduly limit the scope of the claims. One of ordinary skill in the art would recognize many variations, alternatives, and modifications. For example, FIG. 6A is a simplified perspective view of the modular thermoelectric unit 500, FIG. 6B is a simplified top view of the modular thermoelectric unit 500, FIG. 6C is a simplified side view of the modular thermoelectric unit 500, and FIG. 6D is another simplified side view of the modular thermoelectric unit 500.

The modular thermoelectric unit 500 includes a hot-side heat exchanger 510, two cold-side heat exchangers 520 and 522, and two thermoelectric device components 531 and 532. For example, the thermoelectric device component 531 includes one or more thermoelectric materials. In another example, the thermoelectric device component 532 includes one or more thermoelectric materials. In yet another example, each of the thermoelectric device components 531 and 532 is a thermoelectric device.

According to some embodiments, the thermoelectric device component 531 is sandwiched between the cold-side heat exchanger 520 and the hot-side heat exchanger 510, and forms a cold junction with the cold-side heat exchanger 520 and a hot junction with the hot-side heat exchanger 510. According to certain embodiments, the thermoelectric device component 532 is sandwiched between the cold-side heat exchanger 522 and the hot-side heat exchanger 510, and forms a cold junction with the cold-side heat exchanger 522 and a hot junction with the hot-side heat exchanger 510. According to some embodiments, the hot-side heat exchanger 510 forms two hot junctions including one hot junction with the thermoelectric device component 531 and the other hot junction with the thermoelectric device component 532.

In one embodiment, the hot-side heat exchange 510 serves as a heat source component, and the two cold-side heat exchangers 520 and 522 each serve as a cold sink component. In another embodiment, the thermoelectric device component 531 includes one or more thermoelectric device units, and the thermoelectric device component 532 includes one or more thermoelectric device units. For example, the thermoelectric device component 531 is configured to convert thermal energy into electricity in response to the temperature gradient between the corresponding cold junction and the corresponding hot junction. In another example, the thermoelectric device component 532 is configured to convert thermal energy into electricity in response to the temperature gradient between the corresponding cold junction and the corresponding hot junction.

According to one embodiment, the hot-side heat exchanger 510 includes one or more channels for conveying one or more hot fluid flows in a first direction 561, and each of the two cold-side heat exchangers 520 and 522 includes one or more channels for conveying one or more cold fluid flows in a second direction 562 according to one embodiment. For example, the first direction 561 and the second direction 562 are perpendicular to each other.

According to another embodiment, the thermoelectric device component 531 includes a cold-side terminal and a hot-side terminal. For example, the cold-side terminal is in thermal contact with the cold-side heat exchanger 520 to form the cold junction, and the hot-side terminal is in thermal contact with the hot-side heat exchanger 510 to form the hot junction. According to yet another embodiment, the thermoelectric device component 532 includes a cold-side terminal and a hot-side terminal. For example, the cold-side terminal is in thermal contact with the cold-side heat exchanger 522 to form the cold junction, and the hot-side terminal is in thermal contact with the hot-side heat exchanger 510 to form the hot junction. For example, each of the thermoelectric device components 531 and 532 is configured to convert heat (e.g., waste heat in the form of one or more hot fluid flows) into electricity (e.g., useful electric energy).

In one embodiment, the hot-side heat exchanger 510 includes a middle component 515, an inlet component 511, an outlet component 519, and transition components 513 and 517 according to one embodiment. For example, the hot-side heat exchanger 510 has a cuboid shape at least within a middle region 115. In another example, the inlet component 511 and the outlet component 519 each has a rectangular shape in side view.

In yet another example, the middle component 515 is connected with the inlet component 511 through the transition component 513, and is connected with the outlet component 519 through the transition component 517. In another example, each of these two transition components 513 and 517 has a rectangular cross-section, and the length and width of the cross-section increases as the cross-section moves from the end of the middle component 515 to the inlet component 511 or from the end of the middle component 515 to the outlet component 519. In yet another example, the two flat outer faces at the opposite sides of the middle region 515 are used as two hot-side contact faces respectively for the two thermoelectric device components 531 and 532. In yet another example, one or more hot flows are received by the inlet component 511, flows through the transition component 513, the middle component 515, and the transition component 517 along the first direction 561, and are released by the outlet component 519.

In another embodiment, the larger cross-sectional area towards the inlet component 511 and the outlet component 519 can facilitate the one or more fluid flows with a reduced hydraulic resistance through the one or more channels. For example, the entire channel of the hot-side heat exchanger 510 is made of one or more materials (e.g., stainless steel, ceramic material) that are rigid mechanically and tolerable for high temperature (e.g., for high temperature up to 800° C., for high temperature up to 650° C.). In another example, the one or more channels are used to convey one or more hot fluid flows, such as wasted hot gases generated by industrial combustion processes.

As shown in FIGS. 6A-6D, the hot-side heat exchanger 510 includes three channels 580, 582 and 584, and each of the three channels 580, 582 and 584 is used to convey a hot fluid flow in the first direction 561 according to one embodiment. For example, the three channels 580, 582 and 584 are disposed one by one with a small gap between each other although they can be consolidated into one channel. In another example, dividing one channel into three channels with a small gap between each other can improve mechanical tolerance of the structure with respect to thermal expansion variation under high temperature operation. Also as shown in FIGS. 6A-6D, each of the cold-side heat exchanger 520 and 522 includes only one channel, which is used to convey a cold fluid flow in the second direction 562 according to another embodiment. For example, not dividing one channel into a plurality of channels with a small gap between each other makes the cold side more stable, leading to a reduced loss of cold fluid flow and an improved efficiency for the energy conversion by the thermoelectric device components 531 and 532.

In one embodiment, each of the three channels 580, 582 and 584 extends along the first direction 561, and these three channels 580, 582 and 584 are disposed next to each other along the second direction 562. For example, corresponding to the three channels 580, 582 and 584, each of the middle component 515, the inlet component 511, the outlet component 519, and the transition components 513 and 517 are also divided into three parts. In another example, the three parts of the middle component 515 has three outer faces on each side, and these three outer faces are leveled with each other. In yet another example, the three leveled outer faces are configured to form thermal contacts with a continuous contact plate as part of the thermoelectric device component 531 or 532. In yet another example, each of the two cold-side heat exchangers 520 and 522 includes a contact plate overlying the three outer faces of the middle component 515 on one side of the middle component 515.

In one embodiment, the cold-side heat exchanger 520 includes a middle component 525, an inlet component 521, and an outlet component 529, and the cold-side heat exchanger 522 includes a middle component 526, an inlet component 524, and an outlet component 528. For example, each of the cold-side heat exchangers 520 and 522 has a cuboid shape. In another example, the cold flow is received by the inlet component 521, flows through the middle component 525 along the second direction 562, and is released by the outlet component 529. In yet another example, the cold flow is received by the inlet component 524, flows through the middle component 526 along the second direction 562, and is released by the outlet component 528. In yet another example, for the cold-side heat exchanger 520, a flow length 594 in the second direction 562 is kept short to reduce pumping parasitic power loss and to keep the temperature at the outlet component 529 low. In yet another example, for the cold-side heat exchanger 522, a flow length in the second direction 562 is kept short to reduce pumping parasitic power loss and to keep the temperature at the outlet component 528 low.

In another embodiment, each of the cold-side heat exchangers 520 and 522 is subjected to a relative low temperature (e.g., about 10° C. or lower, about 80° C. or lower), and is made of one or more materials with high thermal conductivity material and low manufacturing cost. In yet another embodiment, the cold-side heat exchanger 520 includes a contact plate 590, and the cold-side heat exchanger 522 includes a contact plate 592. For example, both the contact plates 590 and 592 are positioned to face outside, thus reducing heat loss to the atmosphere from the hot-side heat exchanger 510 not directed through the thermoelectric device components 531 and 532 and also protecting other system components from high temperatures.

According to one embodiment, the hot-side heat exchanger 510 includes at least the middle component 515, the inlet component 511, the transition components 513 and 517, and the outlet component 519 according to one embodiment. For example, the middle component 515 has a top-side plate 614 and a bottom-side plate 616, and is connected with the inlet component 511 through the transition component 513. In another example, the transition component 513 uses a sloped edge at both the top side and the bottom side and connects the inlet component 511 to one end of the top-side plate 614 and the bottom-side plate 616 of the middle component 515 respectively. In yet another example, the inlet component 511 has a cross-sectional dimension 680 that is larger than the distance along a third direction 563 between the top-side plate 614 and the bottom-side plate 616 of the middle component 511, in order to provide space for disposing the cold-side heat exchangers 520 and 522 on the top side and the bottom side respectively.

According to another embodiment, the transition component 517 is substantially similar to the transition component 513 and is used to connect the middle component 515 to the outlet component 519 through the transition component 517. For example, the transition component 513 uses a sloped edge at both the top side and the bottom side and connects the outlet component 519 to another end of the top-side plate 614 and the bottom-side plate 616 of the middle component 515 respectively. In another example, the outlet component 519 has a cross-sectional dimension 688 that is larger than the distance along the third direction 563 between the top-side plate 614 and the bottom-side plate 616 of the middle component 511, in order to provide space for disposing the cold-side heat exchangers 520 and 522 on the top side and the bottom side respectively.

As shown in FIG. 6D, the cold-side heat exchanger 520 includes a channel 624 between contact plates 623 and 590, and the cold-side heat exchanger 522 includes a channel 628 between contact plates 627 and 592. In one embodiment, the channel 624 includes a plurality of fingers 620 that extend from the contact plate 623 to the contact plate 590. For example, the length 630 of each finger 620 is equal to or less than 8 cm. In another example, the length 630 of each finger 620 is equal to or less than 6 cm. In yet another example, the length 630 of each finger 620 is equal to or less than 4 cm. In another embodiment, the channel 628 includes a plurality of fingers 622 that extend from the contact plate 627 to the contact plate 592. For example, the length 632 of each finger 622 is equal to or less than 8 cm. In another example, the length 632 of each finger 622 is equal to or less than 6 cm. In yet another example, the length 632 of each finger 622 is equal to or less than 4 cm.

In one embodiment, for the channel 624, each part of the cold fluid flow (that moves through the channel 624) corresponds to a shortest distance to the thermoelectric device component 531, and the shortest distance is less than half the square root of the total free flow area for a corresponding cross-section of the fluid flow. For example, the corresponding cross-section of the fluid flow is perpendicular to the second direction 562, and the total free flow area for the corresponding cross-section is equal to the cross-sectional area of the channel 624 minus the corresponding cross-section areas of the fingers.

In another embodiment, for the channel 628, each part of the cold fluid flow (that moves through the channel 628) corresponds to a shortest distance to the thermoelectric device component 532, and the shortest distance is less than half the square root of the total free flow area for a corresponding cross-section of the fluid flow. For example, the corresponding cross-section of the fluid flow is perpendicular to the second direction 562, and the total free flow area for the corresponding cross-section is equal to the cross-sectional area of the channel 628 minus the corresponding cross-section areas of the fingers.

According to certain embodiments, the channel 624 includes a plurality of fin structures (e.g., fingers) that are aligned in the second direction 562 (e.g., into the paper as shown in FIG. 6D) for conveying the cold fluid flow, and the channel 628 also includes a plurality of fin structures (e.g., fingers) that are aligned in the second direction 562 (e.g., into the paper as shown in FIG. 6D) for conveying the cold fluid flow. For example, the plurality of fin structures enhance thermal conductivity for transferring heat from the thermoelectric device component 531 through the contact plate 623 to the cold fluid flow in the cold channel 624. By maintaining a certain rate of the cold fluid flow, a substantially stable cold-side temperature can be maintained at the cold junction of the thermoelectric device component 531. In another example, the plurality of fin structures enhance thermal conductivity for transferring heat from thermoelectric device component 532 through the contact plate 627 to the cold fluid flow in the cold channel 628. By maintaining a certain rate of the cold fluid flow, a substantially stable cold-side temperature can be maintained at the cold junction of the thermoelectric device component 532.

According to some embodiments, the height of each cold channel (e.g., the channel 624 or 628) as disposed in the modular thermoelectric unit 500 is configured to fit the space provided by the reduced dimension of the middle component 515 in comparison with the inlet component 511 and the outlet region component 519 of the hot-side heat exchanger 510. For example, the distance between two outside contact plates 590 and 592 is substantially equal to the cross-sectional dimension 680 of the inlet component 511 and the cross-sectional dimension 688 of the outlet component 519, providing convenience for packing a plurality of modular thermoelectric units 500 along the third direction 563, which is perpendicular to both the first direction 561 and the second direction 562.

As shown in FIG. 6C, the hot-side heat exchanger 510 includes three channels 580, 582 and 584, and each of the three channels 580, 582 and 584 is used to convey a hot fluid flow in the first direction 561 according to one embodiment. For example, the channel 580 is located between contact plates 660 and 662, the channel 582 is located between contact plates 664 and 666, and the channel 584 is located between contact plates 668 and 670. In another example, the channel 580 includes a plurality of fingers 661 that extend from the contact plate 660 to the contact plate 662, the channel 582 includes a plurality of fingers 665 that extend from the contact plate 664 to the contact plate 666, and the channel 584 includes a plurality of fingers 669 that extend from the contact plate 668 to the contact plate 670. In yet another example, the length 671 of each finger (e.g., the finger 661, 665, or 670) is equal to or less than 8 cm. In yet another example, the length 671 of each finger (e.g., the finger 661, 665, or 670) is equal to or less than 6 cm. In yet another example, the length 671 of each finger (e.g., the finger 661, 665, or 670) is equal to or less than 4 cm.

In one embodiment, for the channel 580, each part of the hot fluid flow (that moves through the channel 580) corresponds to a shortest distance to the thermoelectric device component 531 and another shortest distance to the thermoelectric device component 532, and both these two shortest distances are less than half the square root of the total free flow area for a corresponding cross-section of the fluid flow. For example, the corresponding cross-section of the fluid flow is perpendicular to the first direction 561, and the total free flow area for the corresponding cross-section is equal to the cross-sectional area of the channel 580 minus the corresponding cross-section areas of the fingers.

In another embodiment, for the channel 582, each part of the hot fluid flow (that moves through the channel 582) corresponds to a shortest distance to the thermoelectric device component 531 and another shortest distance to the thermoelectric device component 532, and both these two shortest distances are less than half the square root of the total free flow area for a corresponding cross-section of the fluid flow. For example, the corresponding cross-section of the fluid flow is perpendicular to the first direction 561, and the total free flow area for the corresponding cross-section is equal to the cross-sectional area of the channel 582 minus the corresponding cross-section areas of the fingers.

In yet another embodiment, for the channel 584, each part of the hot fluid flow (that moves through the channel 584) corresponds to a shortest distance to the thermoelectric device component 531 and another shortest distance to the thermoelectric device component 532, and both these two shortest distances are less than half the square root of the total free flow area for a corresponding cross-section of the fluid flow. For example, the corresponding cross-section of the fluid flow is perpendicular to the first direction 561, and the total free flow area for the corresponding cross-section is equal to the cross-sectional area of the channel 584 minus the corresponding cross-section areas of the fingers.

According to another embodiment, the channels 580, 582 and 584 each include a plurality of fin structures (e.g., fingers) that are aligned in the first direction 561 (e.g., into the paper as shown in FIG. 6C) at least in the middle component 515 for conveying the hot fluid flows. For example, such fin structures enhance thermal conductivity between the hot fluid flows and the thermoelectric device components 531 and 532.

As discussed above and further emphasized here, FIGS. 6A-6D are merely examples, which should not unduly limit the scope of the claims. One of ordinary skill in the art would recognize many variations, alternatives, and modifications. In one embodiment, the modular thermoelectric unit 500 is a modular heat recovery unit. In another embodiment, one or more modular thermoelectric units 500 are provided for assembling a heat recovery system to be installed in a waste heat exhaust region associated with industrial combustion processes.

According to one embodiment, the coupling configuration between the hot-side heat exchanger 510 and the two cold-side heat exchangers 520 and 522 keeps at least the middle component 515 of the hot-side heat exchanger 510 between the two cold-side heat exchangers 520 and 522. For example, such configuration can help maintain at least the middle component 515 with one or more hot fluid flows in a substantially stable, high temperature state.

According to another embodiment, the hot-side heat exchanger 510 includes the transition components 513 and 517, each with increasing cross-sectional area to connect the middle component 515 with the inlet component 511 or the outlet component 519. For example, such configuration provides the inlet component 511 and the outlet component 519 with large cross-sectional areas that can facilitate the smooth flow and also enhance the flow rate in the middle component 515 for better efficiency in thermal conduction. In another example, such configuration can match the dimension of the hot-side heat exchanger 51 in the third direction 563 with the distance between the two contact plates 590 and 592 as shown in FIG. 6D.

As shown in FIGS. 6A-6D, the thermoelectric device component 531 is sandwiched between the cold-side heat exchanger 520 and the hot-side heat exchanger 510, and forms a cold junction with the cold-side heat exchanger 520 and a hot junction with the hot-side heat exchanger 510, and the thermoelectric device component 532 is sandwiched between the cold-side heat exchanger 522 and the hot-side heat exchanger 510, and forms a cold junction with the cold-side heat exchanger 522 and a hot junction with the hot-side heat exchanger 510 according to some embodiments. For example, the shortest path from any unit of a hot fluid flow or a cold fluid flow to its corresponding thermoelectric junction (e.g., a corresponding hot junction or a corresponding cold junction) is less than 3 inches. According to some embodiments, the modular thermoelectric unit 500 includes the hot-side heat exchanger 510, the cold-side heat exchangers 520 and 522, and the thermoelectric device components 531 and 532. For example, the hot-side heat exchanger 510 is used to extract heat from one or more corresponding hot fluid flows. In another example, each of the cold-side heat exchangers 520 and 522 is used to discharge heat to one or more corresponding cold fluid flows.

According to some embodiments, one or more of the following considerations (a) through (d) are taken into account:

(a) To increase net electric power generation and reduce system size for a thermoelectric generator (e.g., a thermoelectric system), it is desirable to use one or more hot-side heat exchangers and one or more cold-side heat exchangers that create low thermal resistance (e.g., high heat transfer) from one or more corresponding hot or cold fluid flows to one or more corresponding thermoelectric device components, while providing a low pressure drop to the one or more corresponding hot or cold fluid flows that pass through the corresponding heat exchangers, respectively, according to certain embodiments. For example, a lower thermal resistance allows one or more corresponding hot-side heat exchangers to extract more heat for a given area and thus allows a thermoelectric generator to generate more power per unit volume. In another example, a pressure drop needs to be compensated for by one or more pumps and/or fans, which consume parasitic energy and thus reduce net power generation.

(b) The heat transfer is proportional to the surface area in contact with the corresponding flow fluid and is proportional to the fluid velocity, and the pressure drop is proportional to the surface area in contact with the corresponding flow fluid and is proportional to the cube of the fluid velocity; therefore a high heat transfer, low pressure drop heat exchanger can be achieved with a low fluid velocity and a high surface area according to certain embodiments. For example, a low fluid velocity can be obtained by increasing the free-flow cross-sectional area of the heat exchanger. In another example, a high surface area can be achieved using fins (e.g., fingers), pins, web, channels or other extended surface area features on the heat exchange surfaces.

(c) Heat needs to conduct down the length of any fin or extended surface to the thermoelectric device component, and such length of heat conduction introduces thermal resistance, and the thermal resistance of a fin is proportional to the length of the conductive path, and inversely proportional to the width of the conductive path and the thermal conductivity of heat exchanger material according to certain embodiments. For example, high thermal conductivity materials are expensive (e.g., copper, gold, silver, silicon carbide, aluminum nitride) or are not suitable for high temperature applications due to softening or oxidation (e.g., aluminum, graphite). In another example, a wider fin reduces the free-flow area thereby increasing the pressure drop and reducing the net power generation. In yet another example, a short conductive length can be achieved by using one or more wide but shallow heat exchanger channels; however such channel geometry can create a thermoelectric system with physical dimensions that may be difficult to work with. In yet another example, such difficulty can be overcome by dividing or manifolding the fluid flow and layering multiple stacks of one or more hot-side heat exchangers, one or more thermoelectric device components, and one or more cold-side heat exchangers in parallel to the fluid flow.

(d) A larger number of stacked hot and/or cold channels without fins, but with even lower channel height can provide an equivalent free flow cross sectional area and an equivalent surface area and thus may also achieve a low fluid velocity, a high surface area and a short conductive path according to certain embodiments. As an example, such arrangement is less effective for a thermoelectric generator that requires thermal impedance matching of the thermoelectric device components with the heat exchangers in order to maximize power generation. In another example, a heat exchanger arrangement without extended surface area have a low heat transfer per unit area of thermoelectric material, so one or more thicker thermoelectric device components and/or a lower packing fraction of thermoelectric material are needed. In yet another example, a thicker thermoelectric device component may result in higher thermoelectric material costs. In yet another example, a lower packing fraction of thermoelectric material may result in loss of power due to leakage of heat through the spaces around the thermoelectric device components.

As discussed above and further emphasized here, FIGS. 6A-6D are merely examples, which should not unduly limit the scope of the claims. One of ordinary skill in the art would recognize many variations, alternatives, and modifications. For example, the two thermoelectric device components 531 and 532 are replaced by two devices that are not thermoelectric devices but can still convert thermal energy to electric energy. In another example, the two thermoelectric device components 531 and 532 are replaced by certain types of thermophotovoltaic devices, each of which includes one or more certain types of thermophotovoltaic materials. In yet another example, the two thermoelectric device components 531 and 532 are replaced by certain types of thermionic devices, each of which includes one or more certain types of thermionic materials.

In another example, the first direction 561 is not fixed, but instead the first direction 561 changes as the one or more hot fluid flows move through the one or more channels of the hot-side heat exchanger 510. In yet another example, the second direction 562 is not fixed, but instead the second direction 562 changes as the one or more cold fluid flows move through the one or more channels of the cold-side heat exchanger 520 and/or the one or more channels of the cold-side heat exchanger 522.

Figure 7:
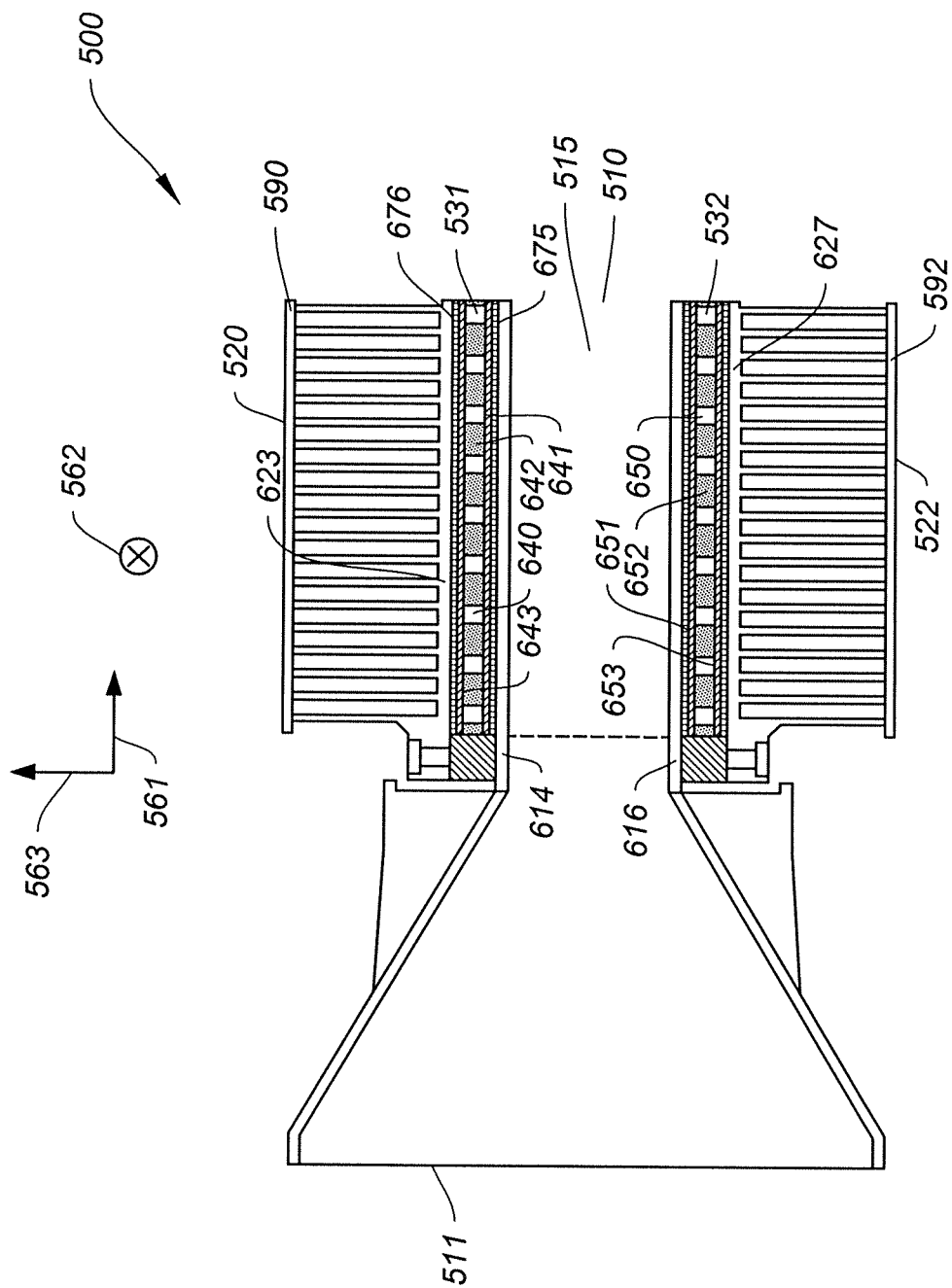
FIG. 7 is a simplified diagram showing certain components of the modular thermoelectric unit as shown in FIGS. 6A-6D according to one embodiment of the present invention.

FIG. 7 is a simplified diagram showing certain components of the modular thermoelectric unit 500 as shown in FIGS. 6A-6D according to one embodiment of the present invention. This diagram is merely an example, which should not unduly limit the scope of the claims. One of ordinary skill in the art would recognize many variations, alternatives, and modifications.

As described above, the thermoelectric device component 531 is sandwiched between the cold-side heat exchanger 520 and the hot-side heat exchanger 510, and forms the cold junction with the cold-side heat exchanger 520 and the hot junction with the hot-side heat exchanger 510, and the thermoelectric device component 532 is sandwiched between the cold-side heat exchanger 522 and the hot-side heat exchanger 510, and forms the cold junction with the cold-side heat exchanger 522 and the hot junction with the hot-side heat exchanger 510, according to certain embodiments. For example, on one side of the middle component 515, the contact plate 623 of the cold-side heat exchanger 520 is engaged to form the cold junction with the thermoelectric device component 531, while leaving the contact plate 590 facing outside of the modular thermoelectric unit 500. In another example, on another side of the middle component 515, the contact plate 627 of the cold-side heat exchanger 522 is engaged to form a cold junction with the thermoelectric device component 532, while leaving the contact plate 592 facing outside of the modular thermoelectric unit 500.

In one embodiment, the thermoelectric device component 531 includes a plurality of thermoelectric device units 640 embedded in a low thermal-conductivity matrix 642 and sandwiched between two terminals 641 and 643. For example, the terminal 641 serves as a contact plate for forming the hot junction with the contact plate 614 of the hot-side heat exchanger 510, and the terminal 643 serves as a contact plate for forming the cold junction with the contact plate 623 of the cold-side heat exchanger 520. In another example, the terminals 641 and 643 also serve as electrical shunts for outputting electrical power generated by the thermoelectric device component 531 in response to a temperature gradient between the hot junction and the cold junction.

In another embodiment, the thermoelectric device component 532 includes a plurality of thermoelectric device units 650 embedded in a low thermal-conductivity matrix 652 and sandwiched between two terminals 651 and 653. For example, the terminal 651 serves as a contact plate for forming the hot junction with the contact plate 616 of the hot-side heat exchanger 510, and the terminal 653 serves as a contact plate for forming the cold junction with the contact plate 627 of the cold-side heat exchanger 522. In another example, the terminals 651 and 653 also serve as electrical shunts for outputting electrical power generated by the thermoelectric device component 532 in response to a temperature gradient between the hot junction and the cold junction.

As shown in FIG. 7, an interfacial material 675 is inserted between the terminal 641 and the contact plate 614, and another interfacial material 676 is inserted between the terminal 643 and the contact plate 623 according to certain embodiments. For example, the interfacial material 675 is used to ensure excellent thermal conductivity between the terminal 641 and the contact plate 614. In another example, the interfacial material 676 is used to ensure excellent thermal conductivity between the terminal 643 and the contact plate 623. In one embodiment, the interfacial material 675 is suitable with the high temperature environment (e.g., up to 800° C. or higher, up to 650° C. or higher) near the hot-side heat exchanger 510. For example, the interfacial material 675 uses a metal foil, in particular a copper foil, because the metal foil tends to be softened at high temperature, thus becoming an excellent thermal contact medium as the contact plate 614 is pressed against the terminal 641. In another embodiment, the interfacial material 676 is thin in order to enhance through-plane thermal conductivity. For example, the interfacial material 676 uses a graphite foil, because low levels of pressure can cause the graphite foil to flatten out as the contact plate 623 is pressed against the terminal 643. According to some embodiments, an interfacial material (e.g., similar to the interfacial material 675) is inserted between the terminal 651 and the contact plate 616, and another interfacial material (e.g., similar to the interfacial material 676) is inserted between the terminal 653 and the contact plate 627.

Figure 8A:
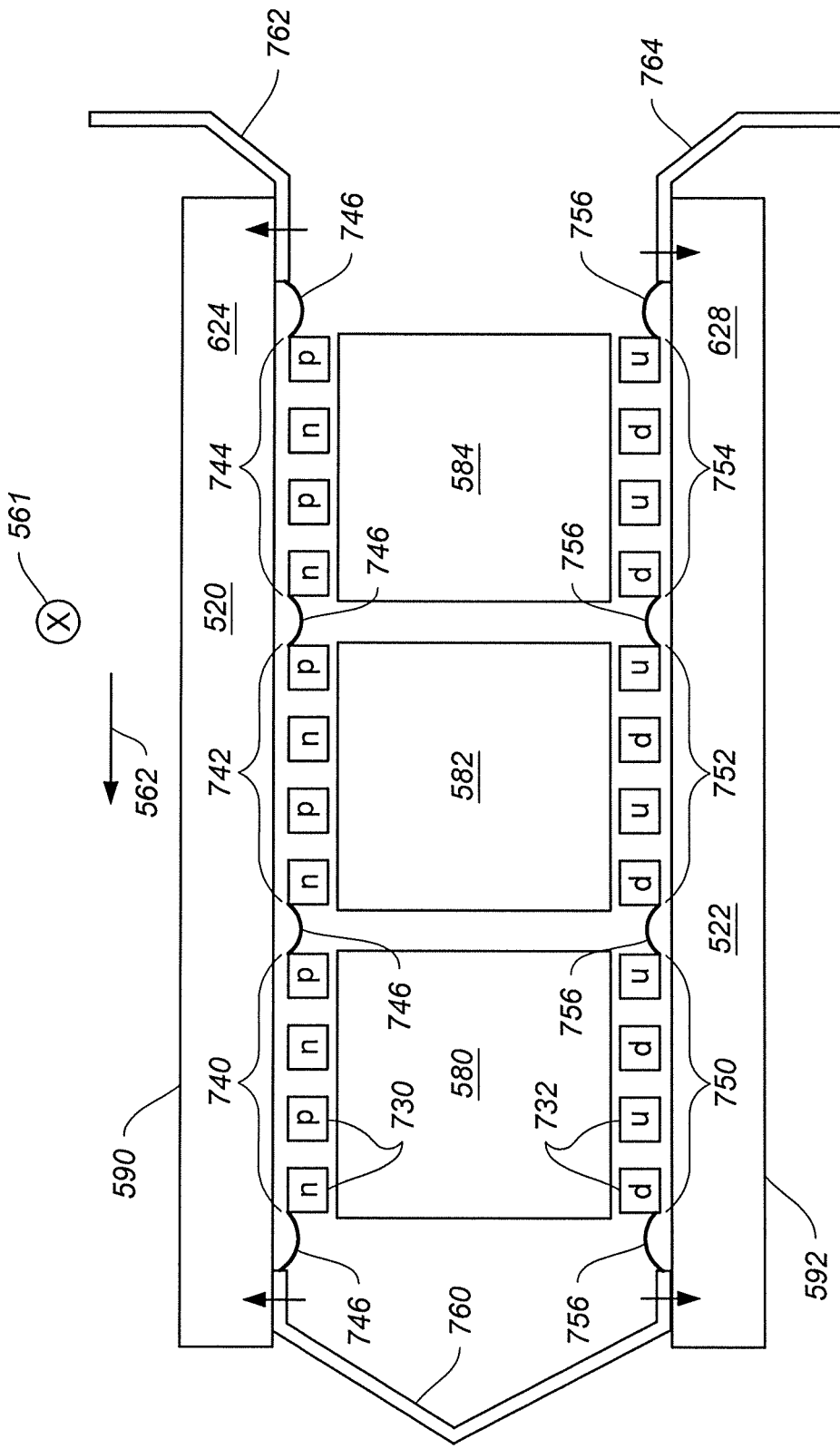
FIG. 8A is a simplified diagram showing some components of the modular thermoelectric unit as shown in FIGS. 6A-6D according to another embodiment of the present invention.

FIG. 8A is a simplified diagram showing some components of the modular thermoelectric unit 500 as shown in FIGS. 6A-6D according to another embodiment of the present invention. This diagram is merely an example, which should not unduly limit the scope of the claims. One of ordinary skill in the art would recognize many variations, alternatives, and modifications.

As shown in FIG. 8A, the hot-side heat exchanger 510 includes the three channels 580, 582 and 584, located between the channel 624 of the cold-side heat exchanger 520 and the channel 628 of the cold-side heat exchanger 522. For example, between the cold channel 624 and the three hot channels 580, 582 and 584, there is the thermoelectric device component 531 (e.g., with high thermoelectric figure of merit). In another example, between the cold channel 628 and the three hot channels 580, 582 and 584, there is the thermoelectric device component 532 (e.g., with high thermoelectric figure of merit).

In one embodiment, the thermoelectric device component 531 includes a plurality of thermoelectric device units 730 (e.g., the plurality of thermoelectric device units 640), and the thermoelectric device component 532 includes a plurality of thermoelectric device units 732 (e.g., a plurality of thermoelectric device units 650). For example, the plurality of thermoelectric device units 730 are aligned along the first direction 562, and the plurality of thermoelectric device units 732 are also aligned along the first direction 562. In another example, each thermoelectric device unit of the plurality of thermoelectric device units 730 and/or the plurality of thermoelectric device units 732 is made from an array of nanowires through semiconductor fabrication processes.

In yet another example, each thermoelectric device unit of the plurality of thermoelectric device units 730 is functionalized into either a p-type semiconductor unit (e.g., a p-type thermoelectric leg) with low thermal conductivity and high electrical conductivity, or an n-type semiconductor unit (e.g., an n-type thermoelectric leg) with low thermal conductivity and high electrical conductivity. In yet another example, each thermoelectric device unit of the plurality of thermoelectric device units 732 is functionalized into either a p-type semiconductor unit with low thermal conductivity and high electrical conductivity, or an n-type semiconductor unit with low thermal conductivity and high electrical conductivity. In yet another example, the p-type semiconductor and the n-type semiconductor each are a thermoelectric material.

According to one embodiment, the plurality of thermoelectric device units 730 include p-type semiconductor units and n-type semiconductor units. For example, two p-type semiconductor units are separated by at least one n-type semiconductor unit, and two n-type semiconductor units are separated by at least one p-type semiconductor unit. In another example, the plurality of thermoelectric device units 730 are electrically coupled to each other (e.g., each n-type semiconductor unit being electrically connected to one or two p-type semiconductor units, each p-type semiconductor unit being electrically connected to one or two n-type semiconductor units). According to another embodiment, the plurality of thermoelectric device units 732 include p-type semiconductor units and n-type semiconductor units. For example, two p-type semiconductor units are separated by at least one n-type semiconductor unit, and two n-type semiconductor units are separated by at least one p-type semiconductor unit. In another example, the plurality of thermoelectric device units 732 are electrically coupled to each other (e.g., each n-type semiconductor unit being electrically connected to one or two p-type semiconductor units, each p-type semiconductor unit being electrically connected to one or two n-type semiconductor units).

As shown in FIG. 8A, the plurality of thermoelectric device units 730 are divided into three groups 740, 742, and 744 of thermoelectric device units corresponding to the three channels 580, 582 and 584 respectively, and the plurality of thermoelectric device units 732 are divided into three groups 750, 752, and 754 of thermoelectric device units corresponding to the three channels 580, 582 and 584 respectively. For example, the three channels 580, 582 and 584 are disposed one by one with a small gap between each other in order to improve mechanical tolerance of the structure with respect to thermal expansion variation under high temperature operation. In another example, across each such small gap, a flexible connector 746 (e.g., a cable) is used to electrically link the groups 740 and 742 or the groups 742 and 744, and a flexible connector 756 (e.g., a cable) is used to electrically link the groups 750 and 752 or the groups 752 and 754.

In one embodiment, an end unit of the group 740 is electrically connected to an insulated cable 760 through a flexible connector 746, and an end unit of the group 750 is also electrically connected to the insulated cable 760 through a flexible connector 756. For example, the insulated cable 760 can tolerate a high temperature (e.g., up to 800° C. or higher, up to 650° C. or higher). In another example, the insulated cable 760 is partially attached to the cold-side heat exchangers 520 and 522. In another embodiment, an end unit of the group 744 is electrically connected to an insulated cable 762 through a flexible connector 746, and an end unit of the group 754 is also electrically connected to the insulated cable 764 through a flexible connector 756. For example, the insulated cable 762 is partially attached to the cold-side heat exchanger 520, and the insulated cable 764 is partially attached to the cold-side heat exchanger 522. In another example, the insulated cables 762 and 764 are used as main electrodes for connecting to corresponding external electrical leads. In yet another example, the insulated cables 762 and 764 are used to couple electrically with a neighboring modular thermoelectric unit 500 if multiple modular thermoelectric units 500 are assembled together to form a subsystem or a system. In yet another example, the insulated cables 762 and 764 are used to transfer the electric energy (e.g., electricity) that is converted from the thermal energy by the thermoelectric device components 531 and 532 through thermoelectric conversion.

Figure 8B:
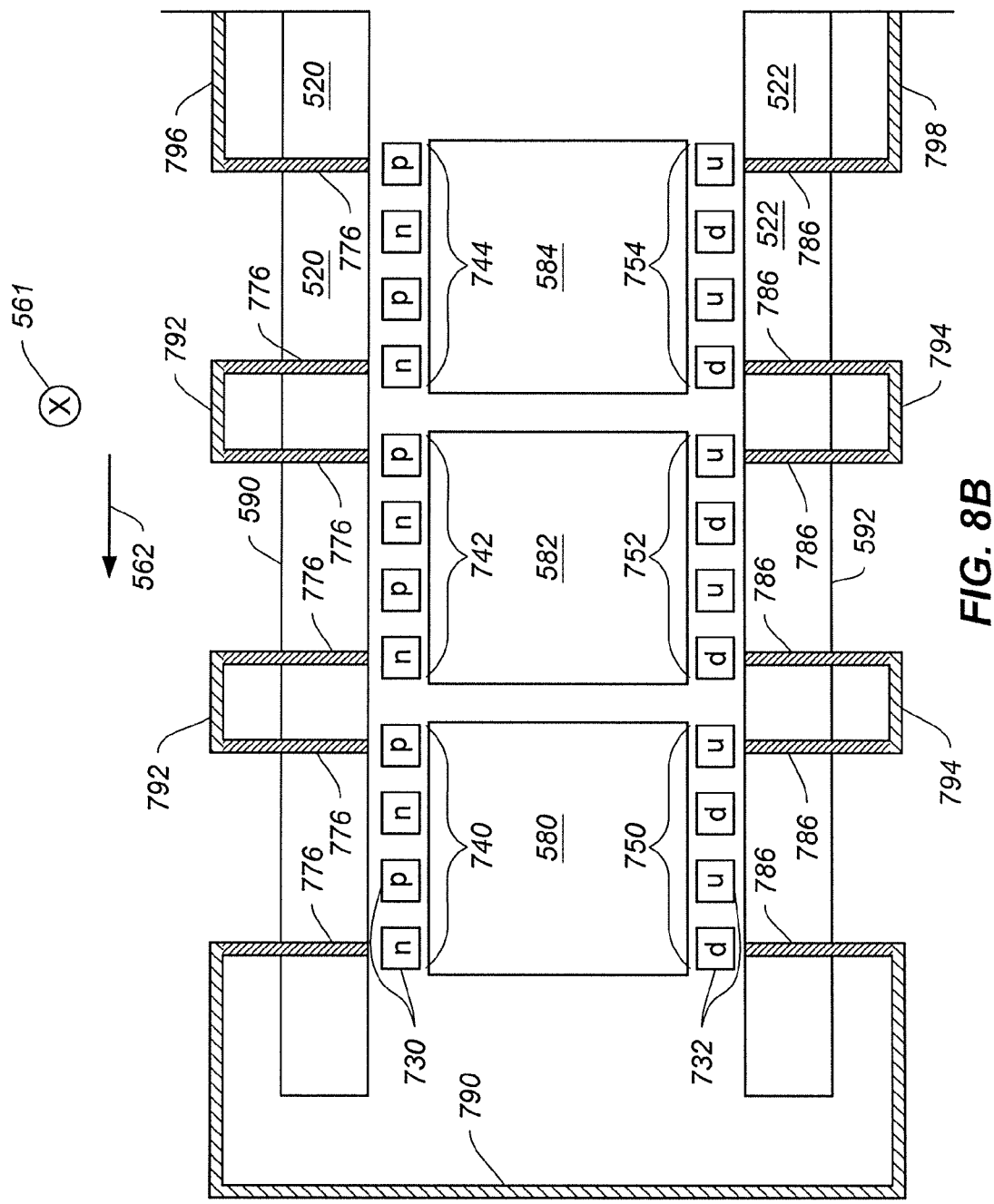
FIG. 8B is a simplified diagram showing some components of the modular thermoelectric unit as shown in FIGS. 6A-6D according to yet another embodiment of the present invention.

FIG. 8B is a simplified diagram showing some components of the modular thermoelectric unit 500 as shown in FIGS. 6A-6D according to yet another embodiment of the present invention. This diagram is merely an example, which should not unduly limit the scope of the claims. One of ordinary skill in the art would recognize many variations, alternatives, and modifications.

As shown in FIG. 8B, the hot-side heat exchanger 510 includes the three channels 580, 582 and 584, located between the channel 624 of the cold-side heat exchanger 520 and the channel 628 of the cold-side heat exchanger 522. For example, between the cold channel 624 and the three hot channels 580, 582 and 584, there is the thermoelectric device component 531 (e.g., with high thermoelectric figure of merit). In another example, between the cold channel 628 and the three hot channels 580, 582 and 584, there is the thermoelectric device component 532 (e.g., with high thermoelectric figure of merit).

In one embodiment, the thermoelectric device component 531 includes a plurality of thermoelectric device units 730 (e.g., the plurality of thermoelectric device units 640), and the thermoelectric device component 532 includes a plurality of thermoelectric device units 732 (e.g., a plurality of thermoelectric device units 650). For example, the plurality of thermoelectric device units 730 are aligned along the first direction 562, and the plurality of thermoelectric device units 732 are also aligned along the first direction 562. In another example, each thermoelectric device unit of the plurality of thermoelectric device units 730 and/or the plurality of thermoelectric device units 732 is made from an array of nanowires through semiconductor fabrication processes.

In yet another example, each thermoelectric device unit of the plurality of thermoelectric device units 730 is functionalized into either a p-type semiconductor unit with low thermal conductivity and high electrical conductivity, or an n-type semiconductor unit with low thermal conductivity and high electrical conductivity. In yet another example, each thermoelectric device unit of the plurality of thermoelectric device units 732 is functionalized into either a p-type semiconductor unit with low thermal conductivity and high electrical conductivity, or an n-type semiconductor unit with low thermal conductivity and high electrical conductivity.

According to one embodiment, the plurality of thermoelectric device units 730 include p-type semiconductor units and n-type semiconductor units. For example, two p-type semiconductor units are separated by at least one n-type semiconductor unit, and two n-type semiconductor units are separated by at least one p-type semiconductor unit. In another example, the plurality of thermoelectric device units 730 are electrically coupled to each other (e.g., each n-type semiconductor unit being electrically connected to one or two p-type semiconductor units, each p-type semiconductor unit being electrically connected to one or two n-type semiconductor units). According to another embodiment, the plurality of thermoelectric device units 732 include p-type semiconductor units and n-type semiconductor units. For example, two p-type semiconductor units are separated by at least one n-type semiconductor unit, and two n-type semiconductor units are separated by at least one p-type semiconductor unit. In another example, the plurality of thermoelectric device units 732 are electrically coupled to each other (e.g., each n-type semiconductor unit being electrically connected to one or two p-type semiconductor units, each p-type semiconductor unit being electrically connected to one or two n-type semiconductor units).

As shown in FIG. 8B, the plurality of thermoelectric device units 730 are divided into three groups 740, 742, and 744 of thermoelectric device units corresponding to the three channels 580, 582 and 584 respectively, and the plurality of thermoelectric device units 732 are divided into three groups 750, 752, and 754 of thermoelectric device units corresponding to the three channels 580, 582 and 584 respectively. For example, the three channels 580, 582 and 584 are disposed one by one with a small gap between each other in order to improve mechanical tolerance of the structure with respect to thermal expansion variation under high temperature operation.

In another example, each of the two groups 740 and 742 are electrically connected to an insulated cable 776 that extends beyond the contact plate 590 of the cold-side heat exchanger 520, and these insulated cables 776 are connected to each other by an insulated cable 792. In yet another example, each of the two groups 742 and 744 are electrically connected to an insulated cable 776 that extends beyond the contact plate 590 of the cold-side heat exchanger 520, and these insulated cables 776 are connected to each other by an insulated cable 792.

In yet another example, each of the two groups 750 and 752 are electrically connected to an insulated cable 786 that extends beyond the contact plate 592 of the cold-side heat exchanger 522, and these insulated cables 786 are connected to each other by an insulated cable 794. In yet another example, each of the two groups 752 and 754 are electrically connected to an insulated cable 786 that extends beyond the contact plate 592 of the cold-side heat exchanger 522, and these insulated cables 786 are connected to each other by an insulated cable 794.

In yet another example, the group 740 is electrically connected to an insulated cable 776 that extends beyond the contact plate 590 of the cold-side heat exchanger 520, and the group 750 is electrically connected to an insulated cable 786 that extends beyond the contact plate 592 of the cold-side heat exchanger 522, wherein these insulated cables 776 and 786 are connected to each other by an insulated cable 790. In yet another example, the group 744 is electrically connected to an insulated cable 776 that extends beyond the contact plate 590 of the cold-side heat exchanger 520, and the group 754 is electrically connected to an insulated cable 786 that extends beyond the contact plate 592 of the cold-side heat exchanger 522, wherein the insulated cable 776 is connected to an insulated cable 796 and the insulated cable 786 is connected to an insulated cable 798. In one embodiment, the insulated cables 796 and 798 are used as main electrodes for connecting to corresponding external electrical leads. In another embodiment, the insulated cables 796 and 798 are used to couple electrically with a neighboring modular thermoelectric unit 500 if multiple modular thermoelectric units 500 are assembled together to form a subsystem or a system.

Figure 9:
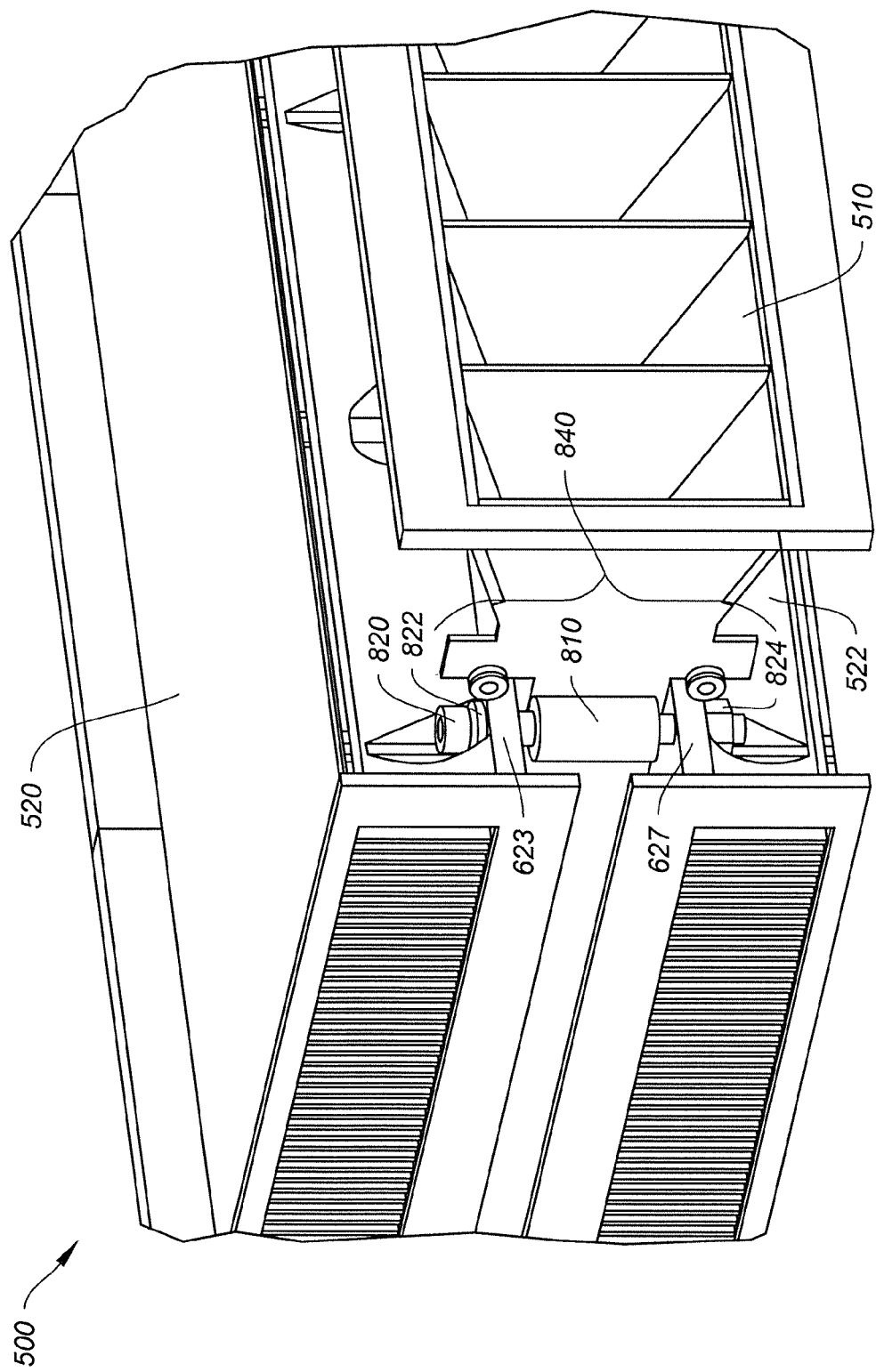
FIG. 9 is a simplified diagram showing certain components of the modular thermoelectric unit as shown in FIGS. 6A-6D according to yet another embodiment of the present invention.

FIG. 9 is a simplified diagram showing certain components of the modular thermoelectric unit 500 as shown in FIGS. 6A-6D according to yet another embodiment of the present invention. This diagram is merely an example, which should not unduly limit the scope of the claims. One of ordinary skill in the art would recognize many variations, alternatives, and modifications.

As described above, the thermoelectric device component 531 is sandwiched between the cold-side heat exchanger 520 and the hot-side heat exchanger 510, and the thermoelectric device component 532 is sandwiched between the cold-side heat exchanger 522 and the hot-side heat exchanger 510 according to some embodiments.

In an embodiment, the cold-side heat exchanger 520 is mounted by at least one bolt assembly 840 in an extended end region of the contact plate 623 so that the contact plate 623 is pressed against the thermoelectric device component 531, which in turn is pressed against the hot-side heat exchanger 510, and the hot-side heat exchanger 510 is further pressed against the thermoelectric device component 531 and the contact plate 627 of the cold-side heat exchanger 522. For example, the bolt assembly 840 includes a top portion above the contact plate 623, a bottom portion below the contact plate 627, and a middle portion between the contact plates 623 and 627. In another example, the top portion of the bolt assembly 840 includes a bolt head 820 and a spring washer 822. In yet another example, the bottom portion of the bolt assembly 840 includes a nut 824 that is coupled to the bolt that extends from the contact plate 623 of the cold-side heat exchanger 520 to the contact plate 627 of the cold-side heat exchanger 522 to the contact plate 623. In yet another example, the middle portion of the bolt assembly 840 includes a spacer 810 that is both thermally and electrically insulating so that the bolt does not make any thermal and electrical contact with the hot-side heat exchanger 510 and does not make any thermal and electrical contact with any of the thermoelectric device component 531 or 532.

According to one embodiment, the bolt assembly 840 is tightened when all of the hot-side heat exchanger 510 and the cold-side heat exchangers 520 and 522 are cold. For example, afterwards, when the hot-side heat exchanger 510 becomes hot during normal operation, the middle portion of the bolt assembly 840 would expand in length, and such thermal expansion is accommodated by the spring washer 822, which remains cold in part due to the insulating spacer 810. According to another embodiment, as shown in FIG. 6B, the modular thermoelectric unit 500 includes multiple bolt assemblies 502. For example, each of the multiple bolt assemblies 502 is the same as the bolt assembly 840.

As shown in FIG. 9 and/or FIGS. 6A-6D, the modular thermoelectric unit 500 includes the thermoelectric device components 531 sandwiched between the hot-side heat exchanger 510 and the cold-side heat exchanger 520, and the thermoelectric device components 532 sandwiched between the hot-side heat exchanger 510 and the cold-side heat exchanger 522 according to certain embodiments. In one embodiment, the thermoelectric device components 531 and the cold-side heat exchangers 520 are on one side of the hot-side heat exchanger 510, and the thermoelectric device components 532 and the cold-side heat exchangers 522 are on another side of the hot-side heat exchanger 510. In another embodiment, the bolt assembly 840 (e.g., a bolt) extends from the cold-side heat exchangers 520 to the cold-side heat exchangers 522, without making contact with the hot-side heat exchanger 510 and without making contact with any of the thermoelectric device components 531 and 532.

According to some embodiments, one or more of the following considerations (A) and (B) are taken into account:

(A) The bolt assembly 840 applies compressive force to the hot-side heat exchanger 510 and the thermoelectric device components 531 and 532 according to certain embodiments. For example, the bolt assembly 840 reduces thermal resistance of the contacts by applying a pressure to one or more compliant materials at the interfaces between the thermoelectric device components 531 and 532 and the heat exchangers 510, 520, and 522, without producing a thermal short between the hot-side heat exchanger 510 and the cold-side heat exchanger 520 and without producing a thermal short between the hot-side heat exchanger 510 and the cold-side heat exchangers 522. In another example, any of such thermal short would reduce both the temperature gradient and the heat flux across the thermoelectric device components 531 and across the thermoelectric device components 532, thus also reducing the amount power produced by the modular thermoelectric unit 500.

(B) Extending the bolt assembly 840 from the cold-side heat exchangers 520 to the cold-side heat exchangers 522 can reduce the design temperature requirement of the bolt assembly 840 including the spring washer 822 according to certain embodiments. For example, extending the bolt assembly 840 from the cold-side heat exchanger 520 to the cold-side heat exchanger 522 can reduce the heat loss of the hot-side heat exchanger 510 to the atmosphere by placing the hot-side heat exchanger 510 between the cold-side heat exchangers 520 and 522.

According to some embodiments, also referring to FIGS. 3A-3B, one or more bolt assemblies that are similar to the bolt assembly 840 are used to extend, for example, from the heat source component 212 (e.g., a hot-side heat exchanger) to the heat source component 214 (e.g., a hot-side heat exchanger).

As discussed above and further emphasized here, FIG. 9 is merely an example, which should not unduly limit the scope of the claims. One of ordinary skill in the art would recognize many variations, alternatives, and modifications. For example, the bolt assembly 840 that includes a bolt is replaced by another component that can also apply a compressive force to the cold-side heat exchanger 520, the thermoelectric device component 531, the hot-side heat exchanger 510, the thermoelectric device component 532, and the cold-side heat exchanger 522.

Figure 10:
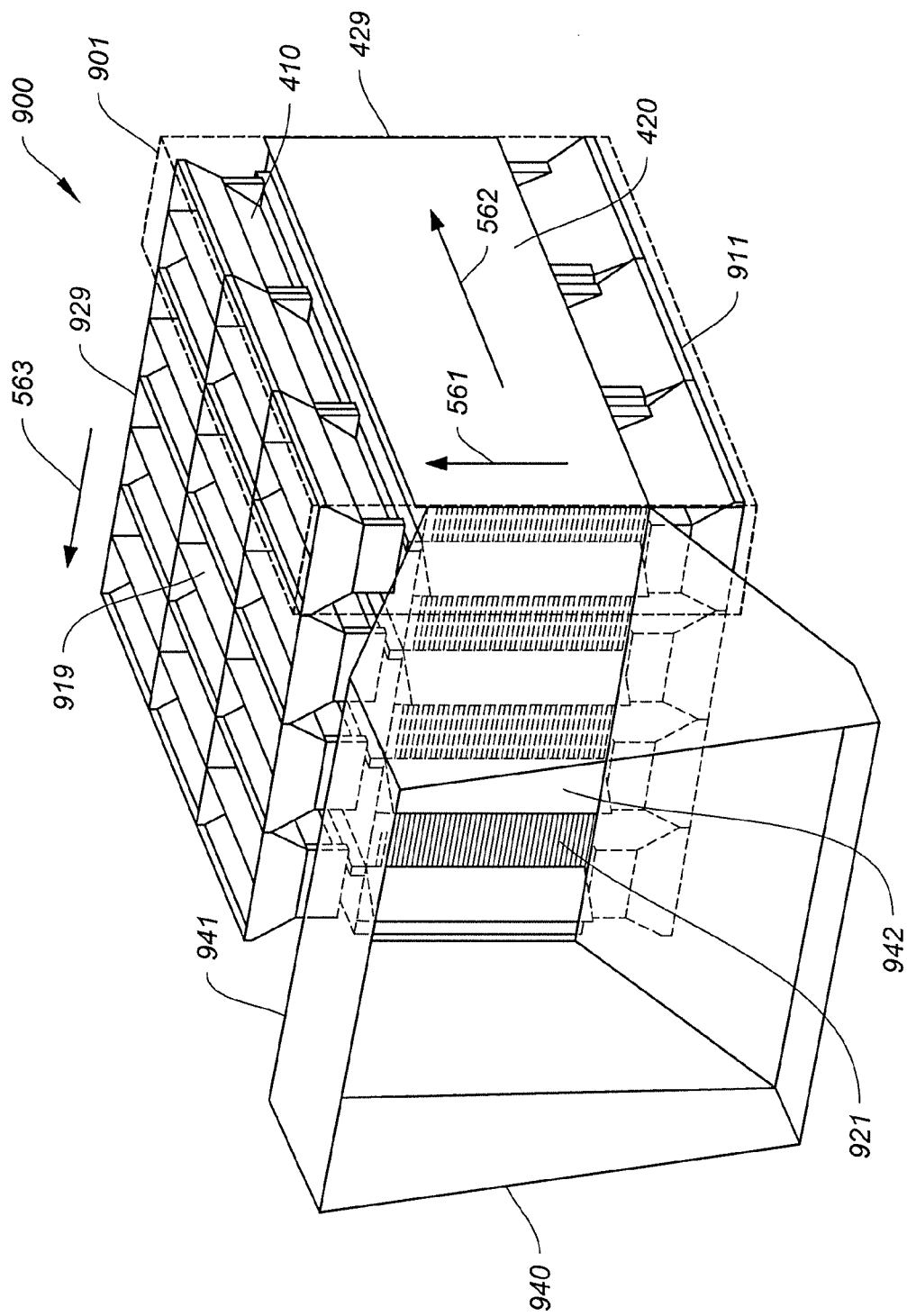
FIG. 10 is a simplified diagram showing a modular thermoelectric subsystem according to one embodiment of the present invention.

FIG. 10 is a simplified diagram showing a modular thermoelectric subsystem according to one embodiment of the present invention. This diagram is merely an example, which should not unduly limit the scope of the claims. One of ordinary skill in the art would recognize many variations, alternatives, and modifications.

The modular thermoelectric subsystem 900 includes multiple modular thermoelectric units 901 stacking together (e.g., four modular thermoelectric units 901 stacking together) according to one embodiment. For example, each modular thermoelectric unit 901 is a modular thermoelectric units 500 as shown in FIGS. 6A-6D. In another example, the stacking of multiple modular thermoelectric units 901 is performed along the third direction 563 as shown in FIG. 6D.

In one embodiment, the dimension of the inlet component 511 and the outlet component 519 of the hot-side heat exchanger 510 along the third direction 563 matches (e.g., being equal to or being smaller than) the distance between the contact plates 590 and 592 along the third direction, so the stacking of multiple modular thermoelectric units 901 (e.g., the stacking of multiple modular thermoelectric units 500) along the third direction 563 allows formation a combined inlet component 911 and a combined outlet component 919 for all the hot channels of the assembled multiple modular units.

In another embodiment, the stacking of multiple modular thermoelectric units 901 (e.g., the stacking of multiple modular thermoelectric units 500) along the third direction 563 allows the contact plate 590 of one modular thermoelectric unit to be in good thermal contact with the contact plate 592 of a neighboring modular thermoelectric unit, forming a combined inlet component 921 and a combined outlet component 929 for all the cold channels of the assembled multiple modular units.

As shown in FIG. 10, the modular thermoelectric subsystem 900 includes a duct structure 940 associated with the combined inlet component 921 for all the cold channels. For example, the duct structure 940 includes multiple shaped sides 941 to extend the combined inlet component 921 to an enlarged opening. In another example, the duct structure 940 also includes multiple shaped insulation blockers 942 to prevent the cold fluid flows to directly contact the exposed side surfaces of the hot channels.

In one embodiment, a fan or pump structure is installed at the opening of the duct structure 940 for driving the cold fluid flows through all of the cold channels along the second direction 362. In another embodiment, an exhaust fan or pump structure is installed at the opening of the combined outlet component 919 for maintaining a desired flow rate for all of the hot fluid flows along the first direction 361. In yet another embodiment, multiple modular thermoelectric subsystems 400 are stacked up to form a thermoelectric system. For example, such stacking of multiple modular thermoelectric subsystems 400 is performed along the third direction 563. In another example, such stacking of multiple modular thermoelectric subsystems 400 is performed along the first direction 561 and/or the second direction 562.

Figure 11A:
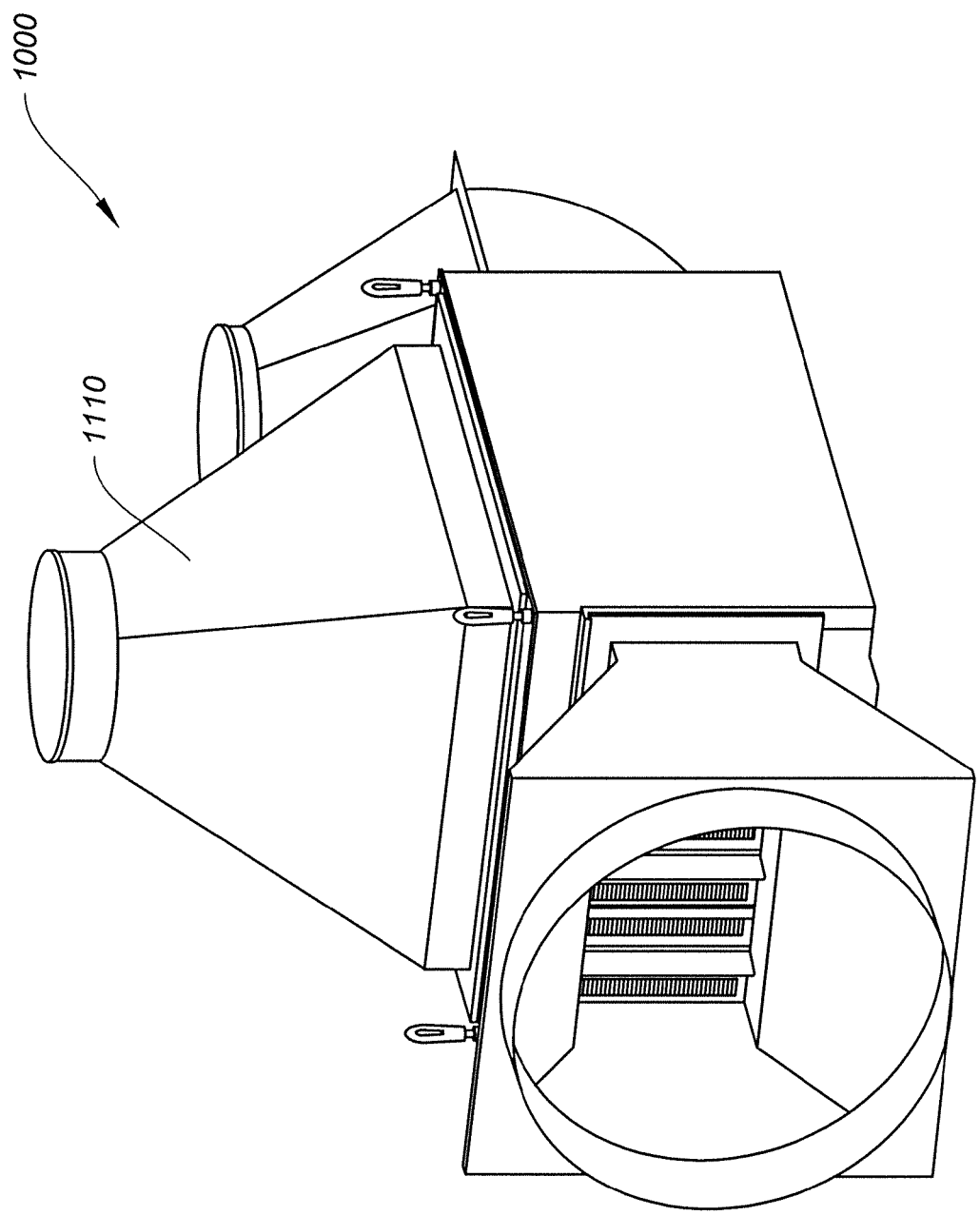
FIGS. 11A-11B are simplified diagrams showing a modular thermoelectric subsystem according to another embodiment of the present invention.
Figure 11B:
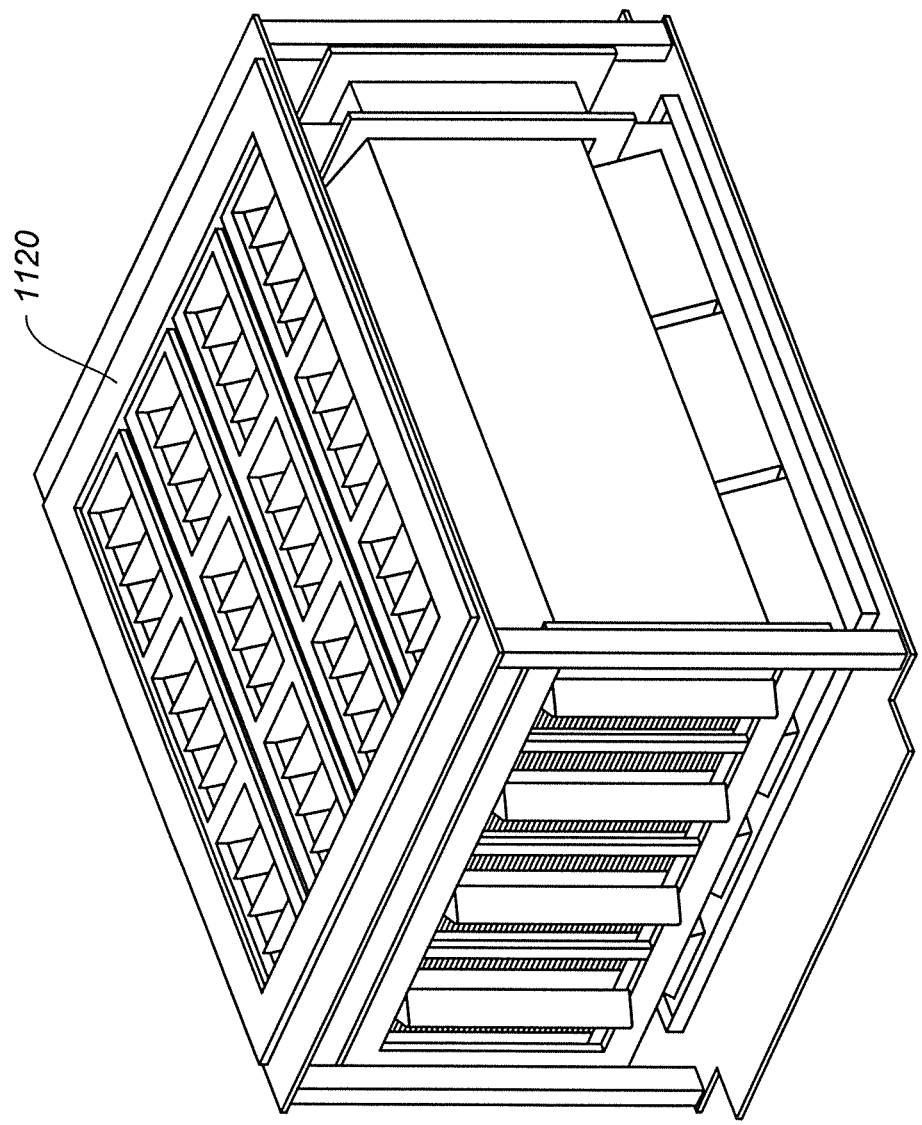

FIGS. 11A-11B are simplified diagrams showing a modular thermoelectric subsystem according to another embodiment of the present invention. These diagrams are merely examples, which should not unduly limit the scope of the claims. One of ordinary skill in the art would recognize many variations, alternatives, and modifications.

In one embodiment, the modular thermoelectric subsystem 1000 includes external components 1110 and internal components 1120 inside the external components 1110. In another embodiment, the modular thermoelectric subsystem 1000 is the same as or substantially similar with the modular thermoelectric subsystem 900.

As discussed above and further emphasized here, FIG. 10 and FIGS. 11A-11B are merely examples, which should not unduly limit the scope of the claims. One of ordinary skill in the art would recognize many variations, alternatives, and modifications. For example, the modular thermoelectric subsystem 900 includes only one modular thermoelectric units 901.

Figure 12:
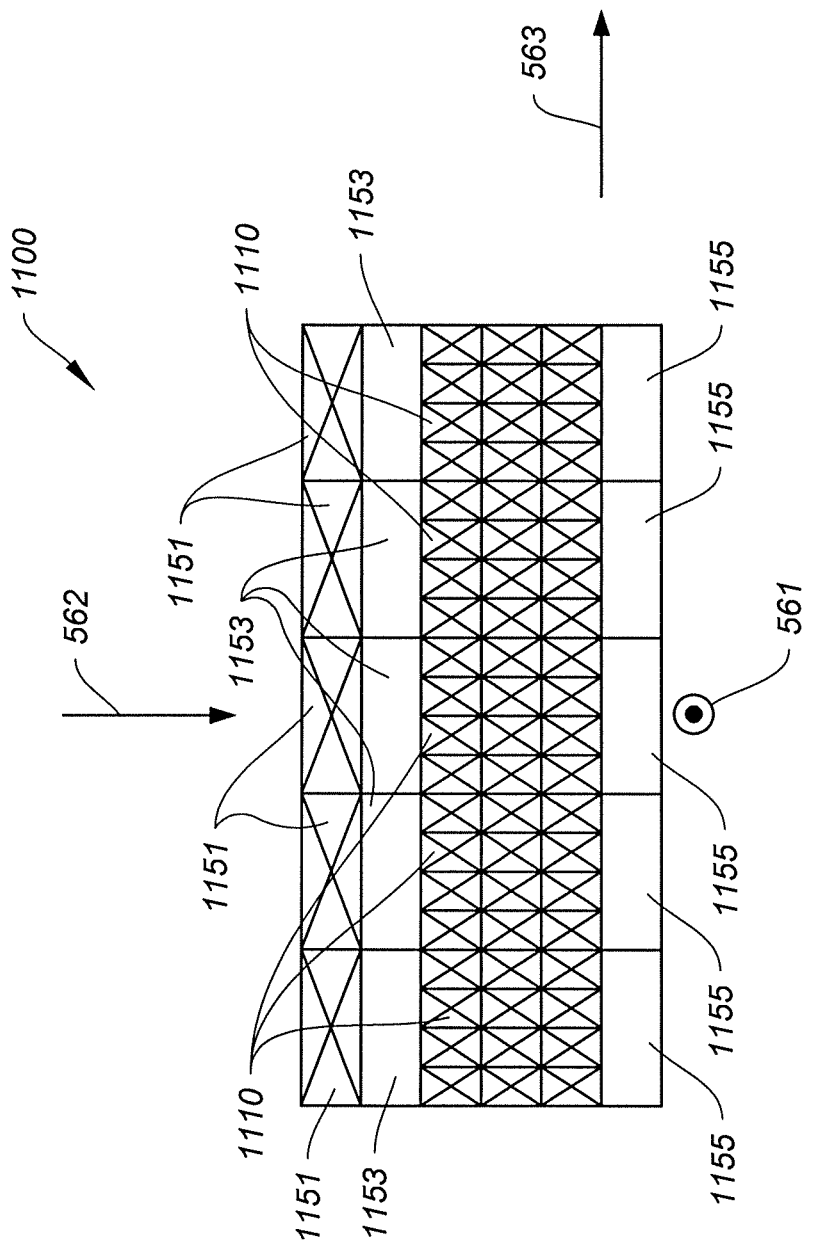
FIG. 12 is a simplified diagram showing a thermoelectric system according to one embodiment of the present invention.

FIG. 12 is a simplified diagram showing a thermoelectric system according to one embodiment of the present invention. This diagram is merely an example, which should not unduly limit the scope of the claims. One of ordinary skill in the art would recognize many variations, alternatives, and modifications.

As shown in FIG. 12, the thermoelectric system 1100 includes multiple modular thermoelectric subsystems 1110 (e.g., five modular thermoelectric subsystems 1110). For example, each of the multiple modular thermoelectric subsystems 1110 is a modular thermoelectric subsystem 900. In another example, the multiple modular thermoelectric subsystems 1110 are multiple modular thermoelectric subsystems 900 stacking along the third direction 563. In yet another example, a combined outlet component 929 of a modular thermoelectric subsystem 900 is electrically connected to a combined inlet component 921 of another modular thermoelectric subsystem 900, and the multiple modular thermoelectric subsystems 900 are electrically connected in series.

In one embodiment, multiple modular thermoelectric subsystems 1110 (e.g., five modular thermoelectric subsystems 900) include multiple cold-fluid fans and/or pumps 1151 (e.g., five fan or pump structures) that are installed at the opening of multiple duct structures 1153 (e.g., five duct structure 940) for driving the cold fluid flows through the cold channels along the second direction 562. For example, the cold fluid flows then move out of the multiple modular thermoelectric subsystems 1110 via multiple duct structures 1155 (e.g., five duct structures). In another example, the multiple cold-fluid fans and/or pumps 1151 and/or the multiple duct structures 1153 are the one or more perimeter parts of the thermoelectric system 1100, and through the one or more perimeter parts, the cold fluid flows enter into the cold channels along the second direction 562. In yet another example, the hot fluid flows (e.g., hot air) move upward (e.g., from a chimney) through all of the hot channels along the first direction 561.

In another embodiment, the multiple modular thermoelectric subsystems 1110 (e.g., five modular thermoelectric subsystems 900) include multiple hot-exhaust fans and/or pumps (e.g., five hot-exhaust fans and/or pumps) that are installed at the opening of multiple combined outlet components (e.g., five combined outlet components 919) for maintaining a desired flow rate for all of the hot fluid flows along the first direction 561 (e.g., from a chimney). For example, the hot fluid flows then move out of the multiple modular thermoelectric subsystems 1110 via multiple combined outlet components (e.g., five combined outlet components 919).

In yet another embodiment, the thermoelectric system 1100 includes two main electrical leads that connect all the thermoelectric device components (e.g., all the thermoelectric device components 531 and 532) of the thermoelectric system 1100 in order to output the electrical energy that is converted from the thermal energy (e.g., the thermal energy from the waste heat in the hot air flowing out a chimney). For example, the multiple modular thermoelectric subsystems 900 are electrically connected in series. In another example, one of the two main electrical leads is a combined inlet component 921 of an end modular thermoelectric subsystem 900, and the one of the two main electrical leads is a combined outlet component 929 of the other end modular thermoelectric subsystem 900.

Figure 13B:
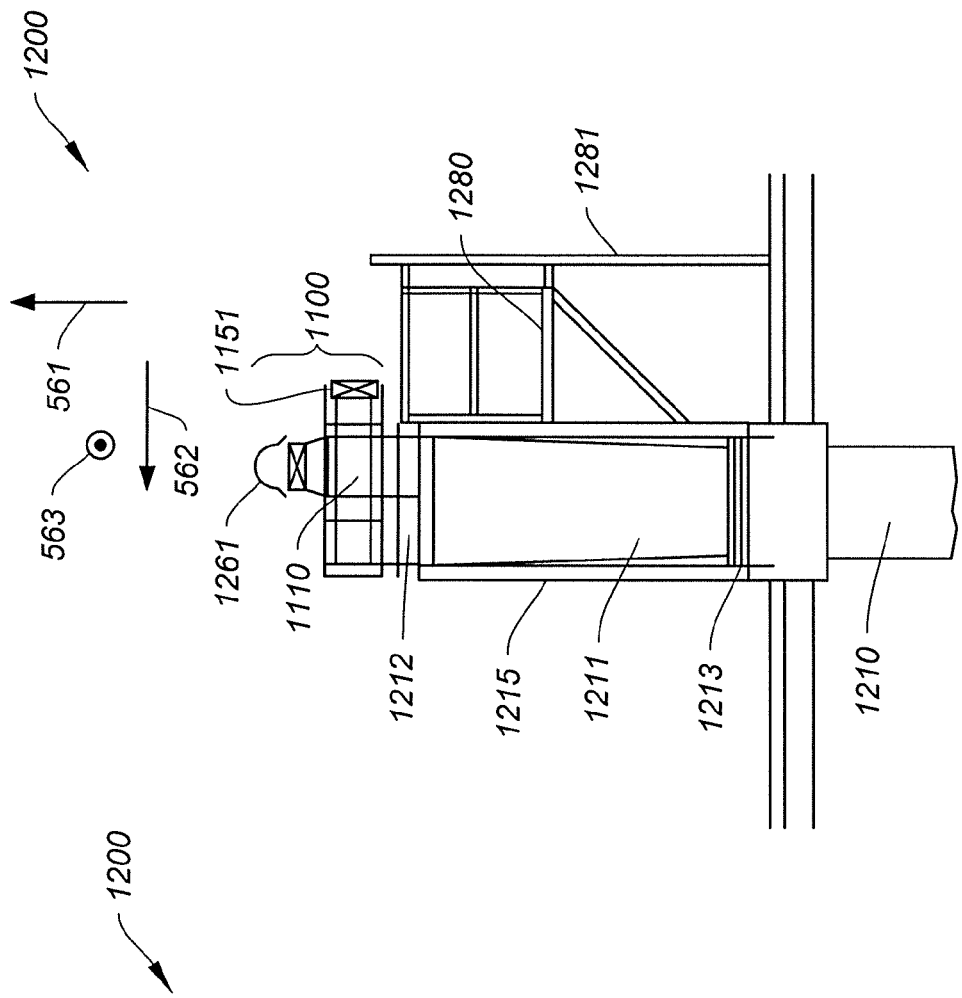
FIGS. 13A-13B are simplified diagrams showing a heat recovery system including the thermoelectric system according to one embodiment of the present invention.
Figure 13A:
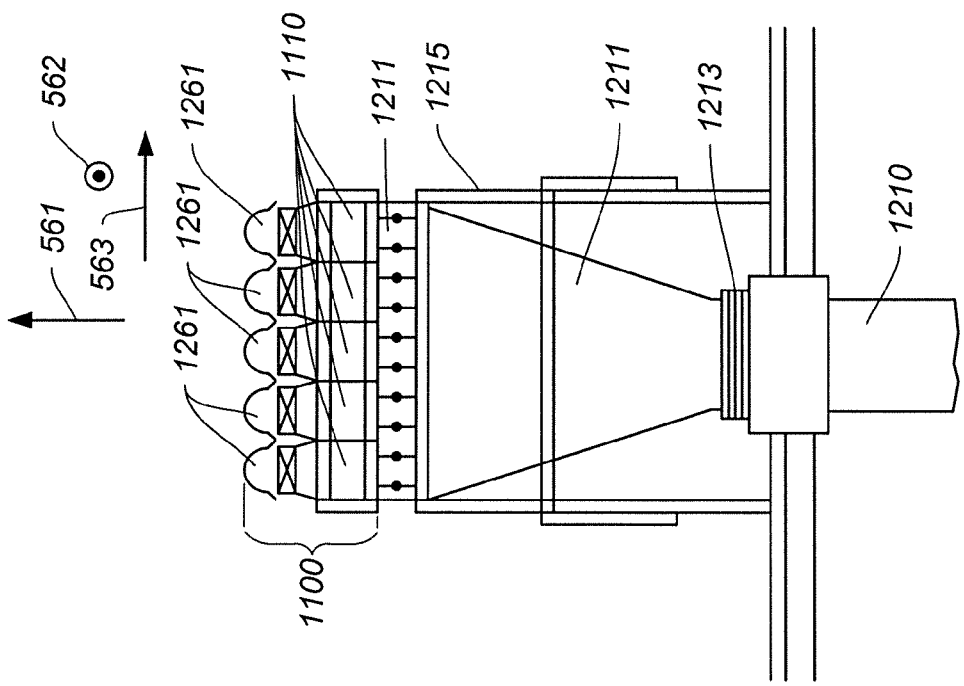

FIGS. 13A-13B are simplified diagrams showing a heat recovery system including the thermoelectric system 1100 according to one embodiment of the present invention. These diagrams are merely examples, which should not unduly limit the scope of the claims. One of ordinary skill in the art would recognize many variations, alternatives, and modifications.

According to some embodiments, the thermoelectric system 1100 is used in a heat recovery system 1200, and the thermoelectric system 1100 includes multiple modular thermoelectric subsystems 1110. In one embodiment, the multiple modular thermoelectric subsystems 1110 (e.g., five modular thermoelectric subsystems 900) include multiple hot-exhaust fans and/or pumps 1261 (e.g., five hot-exhaust fans and/or pumps 1261) that are installed at the opening of multiple combined outlet components (e.g., five combined outlet components 919) for maintaining a desired flow rate for all of the hot fluid flows along the first direction 561 (e.g., from a chimney). For example, the hot fluid flows then move out of the multiple modular thermoelectric subsystems 1110 via multiple combined outlet components (e.g., five combined outlet components 919). In another example, the multiple hot-exhaust fans and/or pumps 1261 each are a belt-driven vane axial fan or pump. In yet another example, the multiple hot-exhaust fans and/or pumps 1261 each are individually controlled (e.g., through variable-frequency drive (VFD)) to handle uneven flows across the multiple combined outlet components (e.g., the five combined outlet components 919).

As shown in FIGS. 13A-13B, one or more control dampers 1212 are disposed below multiple combined inlet components (e.g., five combined inlet components 911). For example, the one or more control dampers 1212 are used to maintain a controlled flow rate for the hot fluid (e.g., hot air) through the hot channels. In another example, the one or more control dampers 1212 are connected to a chimney transition duct 1211.

In one embodiment, the chimney transition duct 1211 is part of an extension duct structure 1215, which is also used to support the thermoelectric system 1100. For example, the extension duct structure 1215 also includes a bypass duct for providing a pathway for exhausting over flows of the hot fluid. In another example, the chimney transition duct 1211 is connected to an existing chimney 1210 via a mating flange 1213. In another embodiment, an access platform 1280 is attached to the extension duct structure 1215 in order to perform maintenance and/or repairs. For example, a ladder 1281 from roof is used to lead a person up to the access platform 1280.

Figure 14:
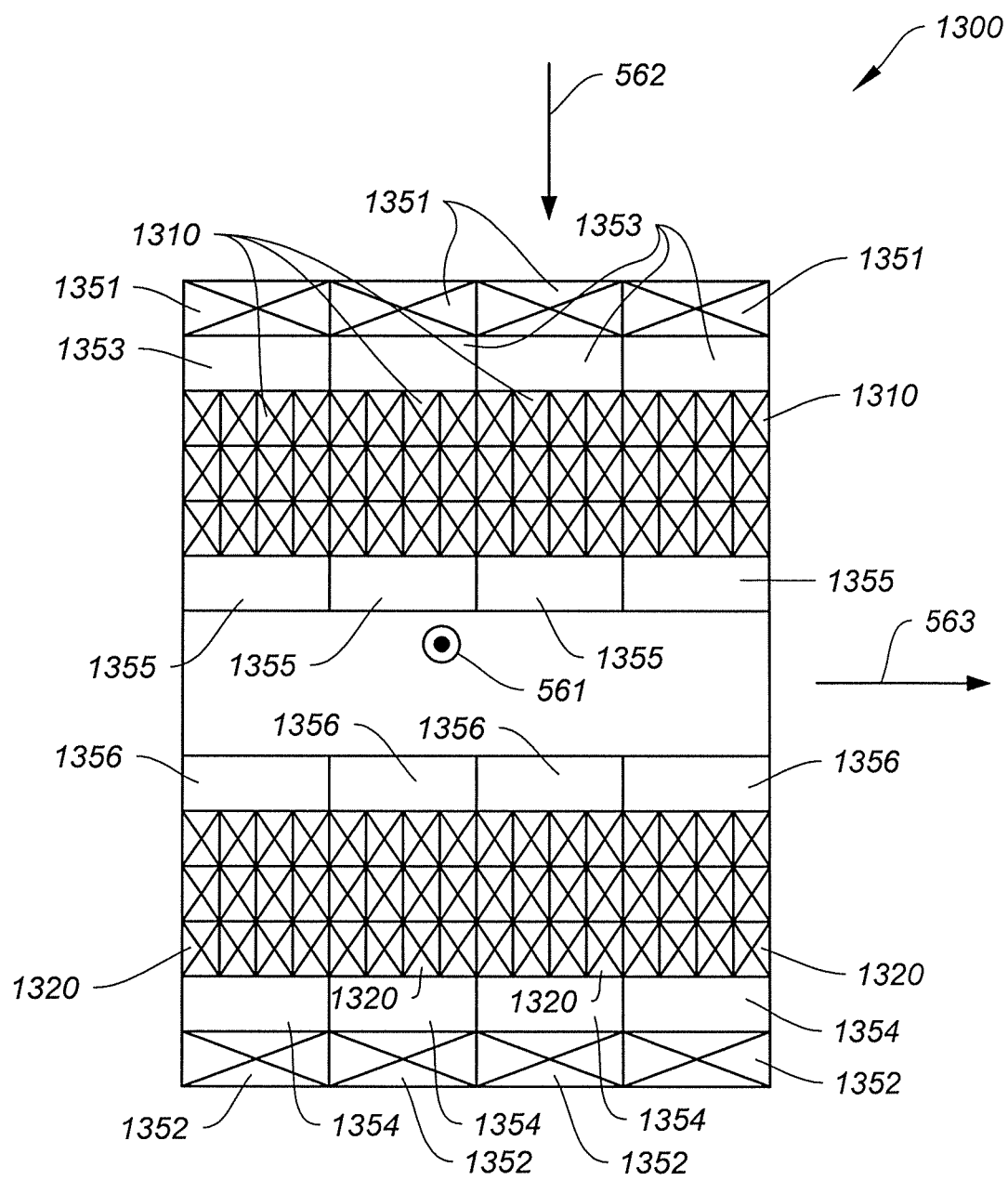
FIG. 14 is a simplified diagram showing a thermoelectric system according to another embodiment of the present invention.

FIG. 14 is a simplified diagram showing a thermoelectric system according to another embodiment of the present invention. This diagram is merely an example, which should not unduly limit the scope of the claims. One of ordinary skill in the art would recognize many variations, alternatives, and modifications.

As shown in FIG. 14, the thermoelectric system 1300 includes multiple modular thermoelectric subsystems 1310 (e.g., four modular thermoelectric subsystems 1110) and multiple modular thermoelectric subsystems 1320 (e.g., four modular thermoelectric subsystems 1110). For example, each of the multiple modular thermoelectric subsystems 1310 is a modular thermoelectric subsystem 900, and each of the multiple modular thermoelectric subsystems 1320 is a modular thermoelectric subsystem 900. In another example, the multiple modular thermoelectric subsystems 1310 are multiple modular thermoelectric subsystems 900 stacking along the third direction 563, and the multiple modular thermoelectric subsystems 1320 are multiple modular thermoelectric subsystems 900 stacking along the third direction 563. In yet another example, a combined outlet component 929 of a modular thermoelectric subsystem 1310 is electrically connected to a combined inlet component 921 of another modular thermoelectric subsystem 1310, and the multiple modular thermoelectric subsystems 1310 are electrically connected in series. In yet another example, a combined outlet component 929 of a modular thermoelectric subsystem 1320 is electrically connected to a combined inlet component 921 of another modular thermoelectric subsystem 1320, and the multiple modular thermoelectric subsystems 1320 are electrically connected in series.

In one embodiment, multiple modular thermoelectric subsystems 1310 (e.g., four modular thermoelectric subsystems 900) include multiple cold-fluid fans and/or pumps 1351 (e.g., four fan or pump structures) that are installed at the opening of multiple duct structures 1353 (e.g., four duct structure 940) for driving the cold fluid flows through the cold channels along the second direction 562. For example, the cold fluid flows then move out of the multiple modular thermoelectric subsystems 1310 via multiple duct structures 1355 (e.g., four duct structures). In another example, the multiple cold-fluid fans and/or pumps 1351 and/or the multiple duct structures 1353 are the one or more perimeter parts of the thermoelectric system 1300, and through the one or more perimeter parts, the cold fluid flows enter into the cold channels along the second direction 562.

In another embodiment, multiple modular thermoelectric subsystems 1320 (e.g., four modular thermoelectric subsystems 900) include multiple cold-fluid fans and/or pumps 1352 (e.g., four fan or pump structures) that are installed at the opening of multiple duct structures 1354 (e.g., four duct structure 940) for driving the cold fluid flows through the cold channels in a direction opposite to the second direction 562. For example, the cold fluid flows then move out of the multiple modular thermoelectric subsystems 1320 via multiple duct structures 1356 (e.g., four duct structures). In another example, the multiple cold-fluid fans and/or pumps 1352 and/or the multiple duct structures 1354 are the one or more perimeter parts of the thermoelectric system 1300, and through the one or more perimeter parts, the cold fluid flows enter into the cold channels in a direction opposite to the second direction 562.

In yet another embodiment, the hot fluid flows (e.g., hot air) move upward (e.g., from a chimney) through all of the hot channels of the multiple modular thermoelectric subsystems 1310 and 1320 along the first direction 561. In yet another embodiment, the multiple modular thermoelectric subsystems 1310 (e.g., four modular thermoelectric subsystems 900) include multiple hot-exhaust fans and/or pumps (e.g., four hot-exhaust fans and/or pumps) that are installed at the opening of multiple combined outlet components (e.g., four combined outlet components 919) for maintaining a desired flow rate for the hot fluid flows along the first direction 561 (e.g., from a chimney). For example, the hot fluid flows then move out of the multiple modular thermoelectric subsystems 1310 via multiple combined outlet components (e.g., four combined outlet components 919). In yet another embodiment, the multiple modular thermoelectric subsystems 1320 (e.g., four modular thermoelectric subsystems 900) include multiple hot-exhaust fans and/or pumps (e.g., four hot-exhaust fans and/or pumps) that are installed at the opening of multiple combined outlet components (e.g., four combined outlet components 919) for maintaining a desired flow rate for the hot fluid flows along the first direction 561 (e.g., from the chimney). For example, the hot fluid flows then move out of the multiple modular thermoelectric subsystems 1320 via multiple combined outlet components (e.g., four combined outlet components 919).

In yet another embodiment, the thermoelectric system 1300 includes two main electrical leads that connect all the thermoelectric device components (e.g., all the thermoelectric device components 531 and 532) of the thermoelectric system 1300 in order to output the electrical energy that is converted from the thermal energy (e.g., the thermal energy from the waste heat in the hot gas flowing out a chimney). For example, the multiple modular thermoelectric subsystems 900 are electrically connected in series. In another example, one of the two main electrical leads is a combined inlet component 921 of an end modular thermoelectric subsystem 1310, and the one of the two main electrical leads is a combined outlet component 929 of an end modular thermoelectric subsystem 1320. In yet another example, a combined outlet component 929 of the other end modular thermoelectric subsystem 1310 is electrically connected to a combined inlet component 921 of the other end modular thermoelectric subsystem 1320.

As discussed above and further emphasized here, FIGS. 12 and 14 are merely examples, which should not unduly limit the scope of the claims. One of ordinary skill in the art would recognize many variations, alternatives, and modifications. For example, the thermoelectric system 1100 includes only one modular thermoelectric subsystems 1110. In another example, the thermoelectric system 1100 includes only one modular thermoelectric unit 901. In yet another example, the thermoelectric system 1300 includes only one modular thermoelectric subsystem 1310 and only one modular thermoelectric subsystem 1320. In yet another example, the thermoelectric system 1300 includes only two modular thermoelectric units 901.

As shown in FIGS. 2B-2C, FIG. 3B, FIG. 4B, FIG. 10, FIG. 11A-11B, FIG. 12, and/or FIG. 14, a thermoelectric system includes a number of repeated modular thermoelectric units and/or a number of repeated modular thermoelectric subsystems according to certain embodiments. For example, a modular thermoelectric unit includes a plurality of hot-side heat exchangers, a plurality of cold-side heat exchangers, and a plurality of thermoelectric device components, all of which can be arranged in various permutations to create an optimized system for a variety of exhaust temperatures and flow rates. In another example, a modular thermoelectric subsystem includes a plurality of hot-side heat exchangers, a plurality of cold-side heat exchangers, and a plurality of thermoelectric device components, all of which can be arranged in various permutations to create an optimized system for a variety of exhaust temperatures and flow rates.

Figure 15B:
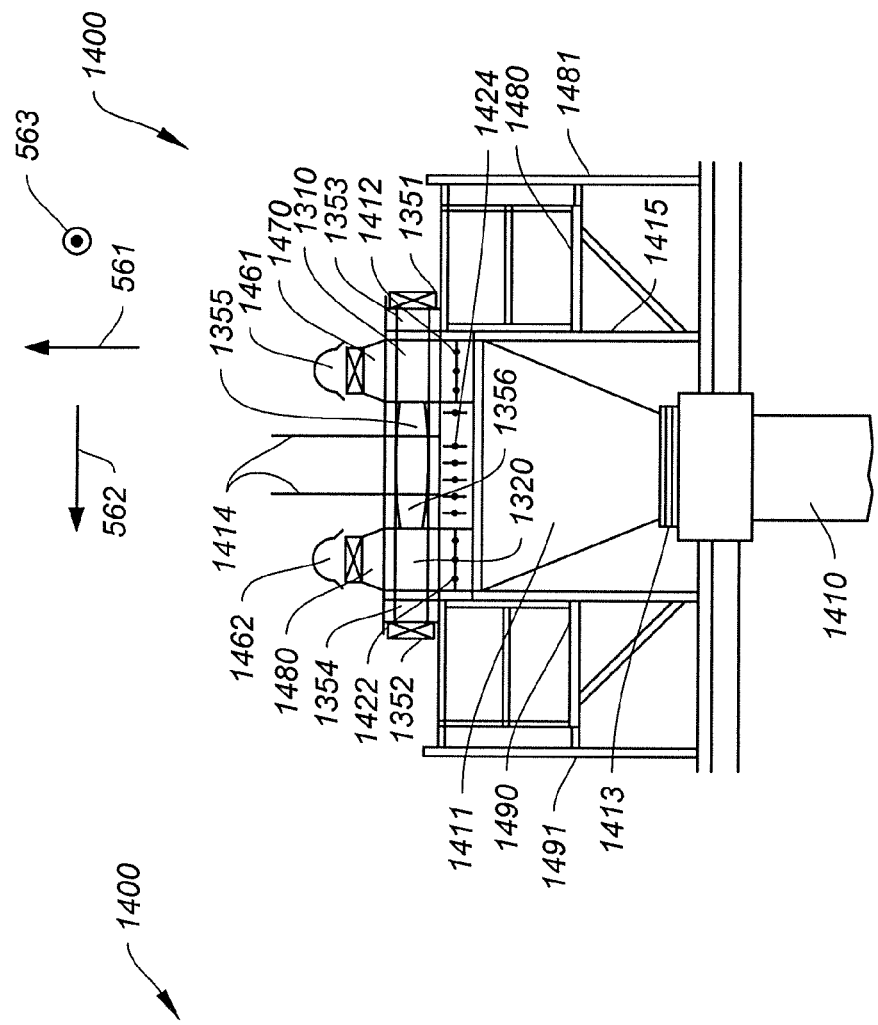
FIGS. 15A-15B are simplified diagrams showing a heat recovery system including the thermoelectric system 1300 according to another embodiment of the present invention.
Figure 15A:
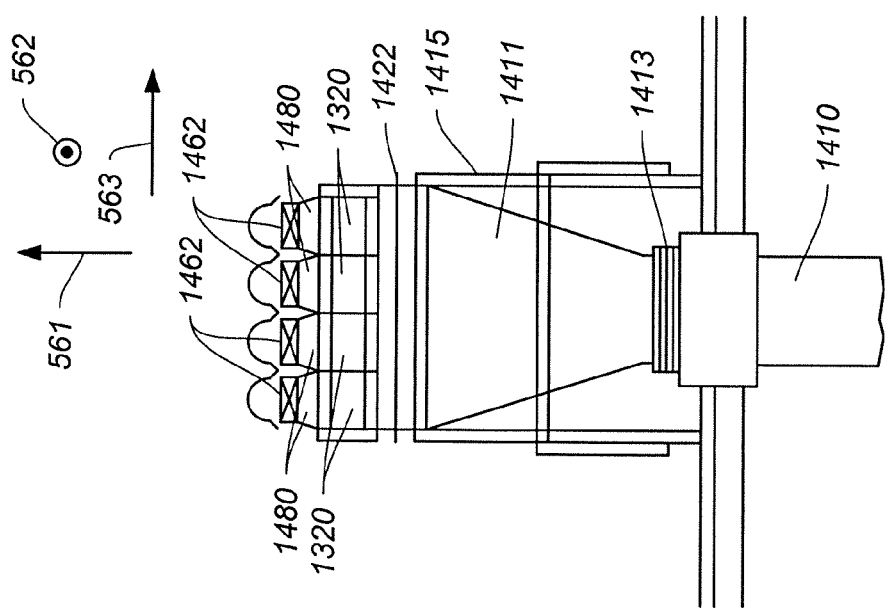

FIGS. 15A-15B are simplified diagrams showing a heat recovery system including the thermoelectric system 1300 according to another embodiment of the present invention. These diagrams are merely examples, which should not unduly limit the scope of the claims. One of ordinary skill in the art would recognize many variations, alternatives, and modifications.

According to some embodiments, the thermoelectric system 1300 is used in a heat recovery system 1400, and the thermoelectric system 1300 includes multiple modular thermoelectric subsystems 1320. In one embodiment, the multiple modular thermoelectric subsystems 1320 (e.g., four modular thermoelectric subsystems 900) include multiple hot-exhaust fans and/or pumps 1462 (e.g., four hot-exhaust fans and/or pumps 1462) that are installed at the opening of multiple combined outlet components 1480 (e.g., four combined outlet components 919) for maintaining a desired flow rate for the hot fluid flows along the first direction 561 (e.g., from a chimney). For example, the hot fluid flows then move out of the multiple modular thermoelectric subsystems 1320 via multiple combined outlet components 1480 (e.g., four combined outlet components 919). In another example, the multiple hot-exhaust fans and/or pumps 1462 each are a belt-driven vane axial fan or pump. In yet another example, the multiple hot-exhaust fans and/or pumps 1462 each are individually controlled (e.g., through variable-frequency drive (VFD)) to handle uneven flows across the multiple combined outlet components (e.g., the four combined outlet components 919).

According to certain embodiments, the multiple modular thermoelectric subsystems 1310 (e.g., four modular thermoelectric subsystems 900) include multiple hot-exhaust fans and/or pumps 1461 (e.g., four hot-exhaust fans and/or pumps 1461) that are installed at the opening of multiple combined outlet components 1470 (e.g., four combined outlet components 919) for maintaining a desired flow rate for the hot fluid flows along the first direction 561 (e.g., from a chimney). For example, the hot fluid flows then move out of the multiple modular thermoelectric subsystems 1310 via multiple combined outlet components 1470 (e.g., four combined outlet components 919). In another example, the multiple hot-exhaust fans and/or pumps 1461 each are a belt-driven vane axial fan or pump. In yet another example, the multiple hot-exhaust fans and/or pumps 1461 each are individually controlled (e.g., through variable-frequency drive (VFD)) to handle uneven flows across the multiple combined outlet components (e.g., the four combined outlet components 919).

As shown in FIGS. 15A-15B, one or more control dampers 1422 are disposed below multiple combined inlet components (e.g., four combined inlet components 911) of the multiple modular thermoelectric subsystems 1320, and one or more control dampers 1412 are disposed below multiple combined inlet components (e.g., four combined inlet components 911) of the multiple modular thermoelectric subsystems 1310. For example, the one or more control dampers 1412 and 1422 are used to maintain a controlled flow rate for the hot fluid through the hot channels. In another example, the one or more control dampers 1412 and 1422 are connected to a chimney transition duct 1411.

In one embodiment, the chimney transition duct 1411 is part of an extension duct structure 1415, which is also used to support the thermoelectric system 1300. For example, the extension duct structure 1415 also includes a bypass duct 1414 for providing a pathway for exhausting over flows of the hot fluid. In another example, the chimney transition duct 1411 is connected to an existing chimney 1410 via a mating flange 1413. In another embodiment, access platforms 1480 and 1490 are attached to the extension duct structure 1415 in order to perform maintenance and/or repairs. For example, ladders 1481 and 1491 from roof are used to lead a person up to the access platforms 1480 and 1490 respectively.

As shown in FIGS. 15A-15B, the bypass duct 1414 is located in a central region sided by the multiple duct structures 1355 (e.g., four duct structures) and the multiple duct structures 1356 (e.g., four duct structures). For example, the bypass duct 1414 is connected to one or more control dampers 1424, which in turn are connected to the chimney transition duct 1411. In another example, the one or more control dampers 1412 and 1422 are closed, so that the hot fluid does not flow into any hot channel of the multiple modular thermoelectric subsystems 1310 and 1320, and the one or more control dampers 1424 are open so that the hot fluid flows into the bypass duct 1414.

As discussed above and further emphasized here, FIG. 10, FIGS. 11A-11B, FIG. 12, FIGS. 13A-13B, FIG. 14, and FIGS. 15A-15B are merely examples, which should not unduly limit the scope of the claims. One of ordinary skill in the art would recognize many variations, alternatives, and modifications. For example, the number of modular thermoelectric units for a modular thermoelectric subsystem can be customized based on specific applications. In another example, the number of modular thermoelectric subsystems for a thermoelectric system can be customized based on specific applications. In yet another example, for high temperature fluid flows, a larger number of modular thermoelectric units in a thermoelectric system can be arranged to leave sufficient space for cooling in order to reduce the temperature that the hot channels have to handle.

Figure 16A:
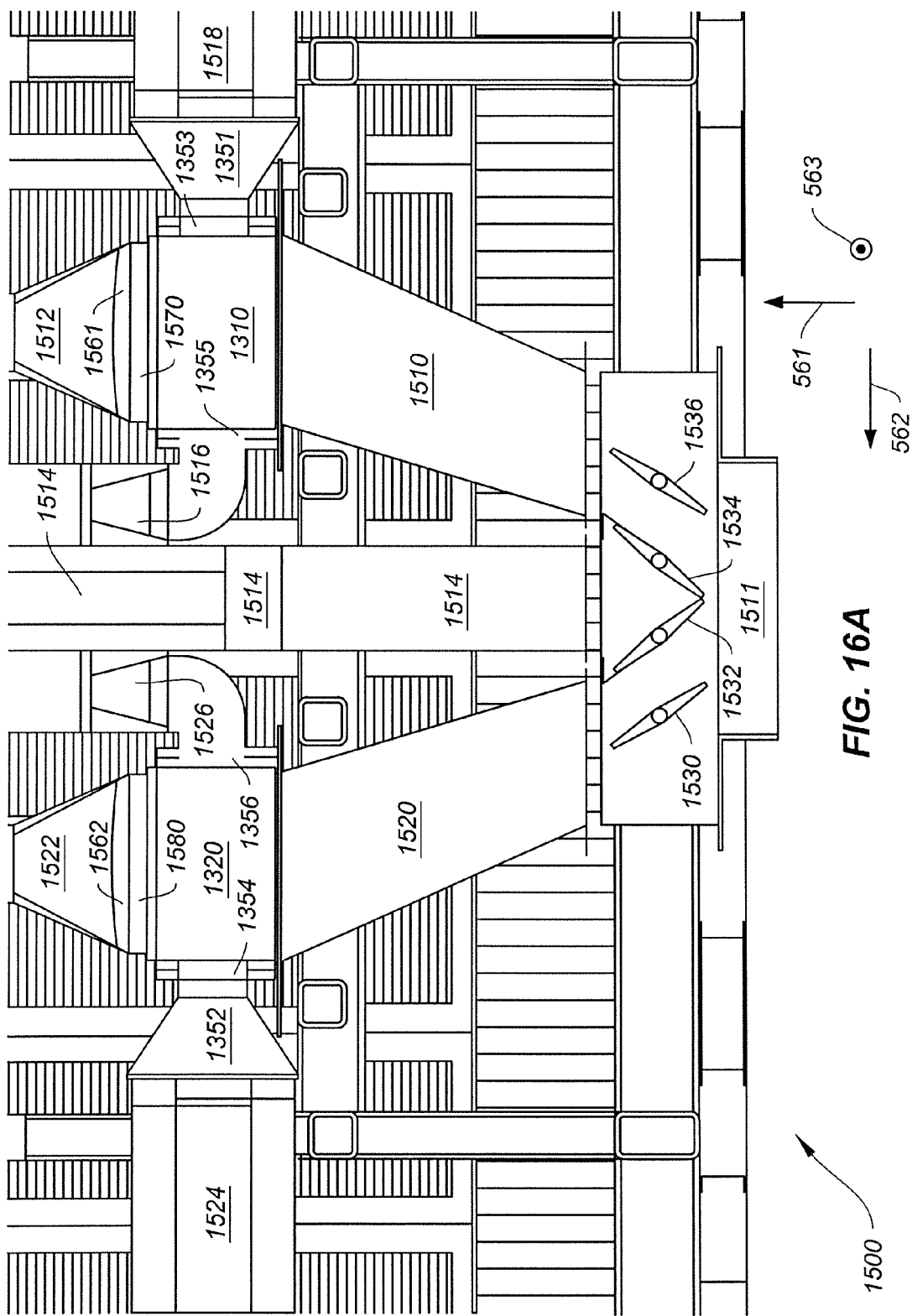
FIGS. 16A-16B are simplified diagrams showing a heat recovery system including the thermoelectric system 1300 according to yet another embodiment of the present invention.
Figure 16B:
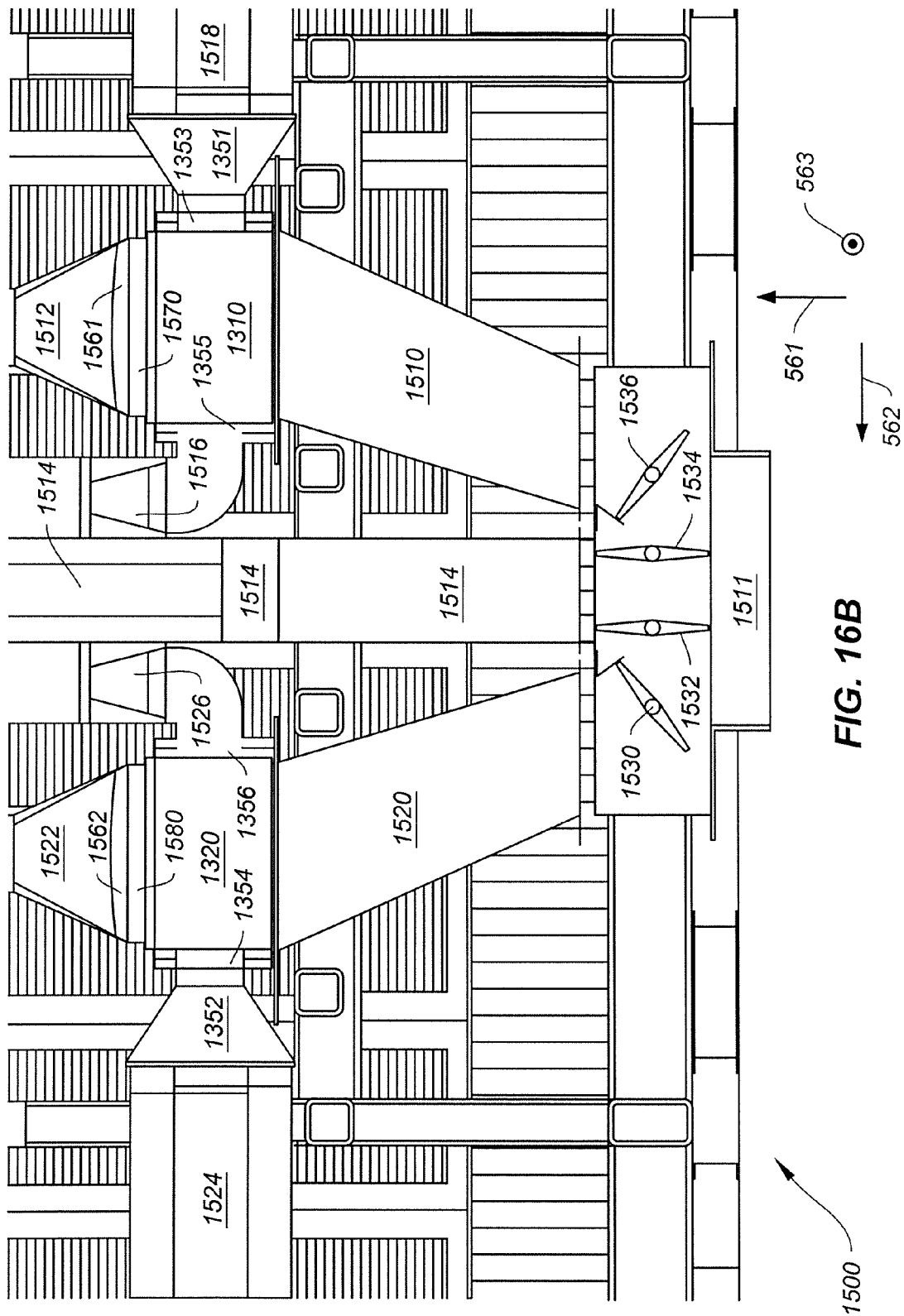

FIGS. 16A-16B are simplified diagrams showing a heat recovery system including the thermoelectric system 1300 according to yet another embodiment of the present invention. These diagrams are merely examples, which should not unduly limit the scope of the claims. One of ordinary skill in the art would recognize many variations, alternatives, and modifications.

According to some embodiments, the thermoelectric system 1300 is used in a heat recovery system 1500, and the thermoelectric system 1300 includes multiple modular thermoelectric subsystems 1320. In one embodiment, the multiple modular thermoelectric subsystems 1320 (e.g., multiple modular thermoelectric subsystems 900) include multiple hot-exhaust fans and/or pumps 1562 that are installed at the opening of multiple combined outlet components 1580 (e.g., multiple combined outlet components 919) for maintaining a desired flow rate for the hot fluid flows along the first direction 561 (e.g., from a chimney). For example, the hot fluid flows then move out of the multiple modular thermoelectric subsystems 1320 via multiple combined outlet components 1580 (e.g., multiple combined outlet components 919). In another example, the multiple hot-exhaust fans and/or pumps 1562 each are a belt-driven vane axial fan or pump. In yet another example, the multiple hot-exhaust fans and/or pumps 1562 each are individually controlled (e.g., through variable-frequency drive (VFD)) to handle uneven flows across the multiple combined outlet components (e.g., the multiple combined outlet components 919).

According to certain embodiments, the multiple modular thermoelectric subsystems 1310 (e.g., multiple modular thermoelectric subsystems 900) include multiple hot-exhaust fans and/or pumps 1561 that are installed at the opening of multiple combined outlet components 1570 (e.g., multiple combined outlet components 919) for maintaining a desired flow rate for the hot fluid flows along the first direction 561 (e.g., from a chimney). For example, the hot fluid flows then move out of the multiple modular thermoelectric subsystems 1310 via multiple combined outlet components 1570 (e.g., multiple combined outlet components 919). In another example, the multiple hot-exhaust fans and/or pumps 1561 each are a belt-driven vane axial fan or pump. In yet another example, the multiple hot-exhaust fans and/or pumps 1561 each are individually controlled (e.g., through variable-frequency drive (VFD)) to handle uneven flows across the multiple combined outlet components (e.g., the multiple combined outlet components 919).

As shown in FIGS. 16A-16B, one or more valves (e.g., valves 1530 and 1532) are disposed below a supply duct 1520 and multiple combined inlet components (e.g., multiple combined inlet components 911) of the multiple modular thermoelectric subsystems 1320, and one or more valves (e.g., valves 1534 and 1536) are disposed below a supply duct 1510 and multiple combined inlet components (e.g., multiple combined inlet components 911) of the multiple modular thermoelectric subsystems 1310. For example, the one or more valves (e.g., the valves 1530, 1532, 1534, and 1536) are used to control a flow rate for the hot fluid through the hot channels. In another example, the one or more valves (e.g., the valves 1530, 1532, 1534, and 1536) are connected to a chimney transition duct 1511.

In one embodiment, the chimney transition duct 1511 is part of an extension duct structure, which is also used to support the thermoelectric system 1300. For example, the extension duct structure also includes a bypass duct 1514 for providing a pathway for exhausting over flows of the hot fluid. In another example, the chimney transition duct 1511 is connected to an existing chimney via a mating flange. In another embodiment, one or more access platforms are attached to the extension duct structure in order to perform maintenance and/or repairs. For example, one or more ladders from roof are used to lead a person up to the one or more access platforms respectively.

According to one embodiment, the bypass duct 1514 is located in a central region sided by the multiple duct structures 1355 and 1356 and two exhaust ducts 1516 and 1526. For example, the exhaust duct 1516 is parallel or substantially parallel with the bypass duct 1514. In another example, the exhaust duct 1526 is parallel or substantially parallel with the bypass duct 1514. In another example, the bypass duct 1514 is connected to one or more valves (e.g., the valves 1532 and 1534), which in turn are connected to the chimney transition duct 1511.

In one embodiment, as shown in FIG. 16A, the valves 1530, 1532, 1534, and 1536 are arranged so that the hot fluid flows into the hot channels of the multiple modular thermoelectric subsystems 1310 through the supply duct 1510 and flows into the hot channels of the multiple modular thermoelectric subsystems 1320 through the supply duct 1520, but the hot fluid does not flow into the bypass duct 1514. In another embodiment, as shown in FIG. 16B, the valves 1530, 1532, 1534, and 1536 are arranged so that the hot fluid does not flow into any of the supply ducts 1510 and 1520 and does not flow into any hot channel of the multiple modular thermoelectric subsystems 1310 and 1320, but the hot fluid flows into the bypass duct 1514.

According to another embodiment, the multiple modular thermoelectric subsystems 1310 (e.g., multiple modular thermoelectric subsystems 900) include the multiple cold-fluid fans and/or pumps 1351 that are installed at the opening of the multiple duct structures 1353 for driving the cold fluid flows from a supply duct 1518 through the cold channels along the second direction 562. For example, the cold fluid flows then move out of the multiple modular thermoelectric subsystems 1310 via the multiple duct structures 1355 into an exhaust duct 1516. In another embodiment, the multiple modular thermoelectric subsystems 1320 (e.g., multiple modular thermoelectric subsystems 900) include the multiple cold-fluid fans and/or pumps 1352 that are installed at the opening of the multiple duct structures 1354 for driving the cold fluid flows from a supply duct 1524 through the cold channels in a direction opposite to the second direction 562. For example, the cold fluid flows then move out of the multiple modular thermoelectric subsystems 1320 via the multiple duct structures 1356 into an exhaust duct 1526. In yet another embodiment, the hot fluid flows (e.g., hot air) move upward (e.g., from a chimney) through all of the hot channels of the multiple modular thermoelectric subsystems 1310 and 1320 along the first direction 561.

As discussed above and further emphasized here, FIGS. 16A-16B are merely examples, which should not unduly limit the scope of the claims. One of ordinary skill in the art would recognize many variations, alternatives, and modifications. For example, the cold fluid flows move out of the multiple modular thermoelectric subsystems 1320 via the multiple duct structures 1356 into the bypass duct 1514 instead of the exhaust duct 1526. In another example, the cold fluid flows move out of the multiple modular thermoelectric subsystems 1310 via the multiple duct structures 1355 into the bypass duct 1514 instead of the exhaust duct 1516. In yet another example, the valves 1530, 1532, 1534, and 1536 are removed so that the supply ducts 1510 and 1520 each are connected to the chimney transition duct 1511 without through any valve and the bypass duct 1514 is also connected to the chimney transition duct 1511 without through any valve, and the bypass duct 1514 shares a movable sidewall with the supply duct 1520 and shares another movable sidewall with the supply duct 1510, as shown in FIGS. 17A-17B.

FIGS. 17A-17B are simplified diagrams showing the bypass duct 1514 and the supply ducts 1510 and 1520 as parts of a heat recovery system including the thermoelectric system 1300 according to yet another embodiment of the present invention. These diagrams are merely examples, which should not unduly limit the scope of the claims. One of ordinary skill in the art would recognize many variations, alternatives, and modifications.

According to some embodiments, the bypass duct 1514 and the supply ducts 1510 and 1520 are parts of a heat recovery system 1600. According to certain embodiments, the heat recovery system 1600 also uses the thermoelectric system 1300 similar to the arrangement as shown in FIGS. 16A-16B. In one embodiment, the supply ducts 1510 and 1520 each are connected to the chimney transition duct 1511 without through any valve, and the bypass duct 1514 is also connected to the chimney transition duct 1511 without through any valve. For example, the supply duct 1520 includes two sidewalls 1630 and 1632, and the supply duct 1510 includes two sidewalls 1634 and 1636. In another example, the bypass duct 1514 shares the sidewall 1632 with the supply duct 1520, and shares the sidewall 1634 with the supply duct 1510. In yet another example, the sidewalls 1632 and 1634 are movable.

As shown in FIG. 17A, the sidewalls 1630, 1632, 1634, and 1636 are arranged so that the hot fluid flows from the chimney transition duct 1511 through the supply duct 1510 (e.g., into the hot channels of the multiple modular thermoelectric subsystems 1310), and flows from the chimney transition duct 1511 through the supply duct 1520 (e.g., into the hot channels of the multiple modular thermoelectric subsystems 1320), but the hot fluid does not flow into the bypass duct 1514 from the chimney transition duct 1511, according to one embodiment. As shown in FIG. 17B, the sidewalls 1630, 1632, 1634, and 1636 are arranged so that the hot fluid does not flow into any of the supply ducts 1510 and 1520 from the chimney transition duct 1511, but the hot fluid flows into the bypass duct 1514 from the chimney transition duct 1511.

According to another embodiment, the multiple modular thermoelectric subsystems 1310 (e.g., multiple modular thermoelectric subsystems 900) include the multiple cold-fluid fans and/or pumps 1351 that are installed at the opening of the multiple duct structures 1353 for driving the cold fluid flows from the supply duct 1518 through the cold channels along the second direction 562. For example, the cold fluid flows then move out of the multiple modular thermoelectric subsystems 1310 via the multiple duct structures 1355 into an exhaust duct 1516. In another embodiment, the multiple modular thermoelectric subsystems 1320 (e.g., multiple modular thermoelectric subsystems 900) include the multiple cold-fluid fans and/or pumps 1352 that are installed at the opening of the multiple duct structures 1354 for driving the cold fluid flows from a supply duct 1524 through the cold channels in a direction opposite to the second direction 562. For example, the cold fluid flows then move out of the multiple modular thermoelectric subsystems 1320 via the multiple duct structures 1356 into an exhaust duct 1526. In yet another embodiment, the hot fluid flows (e.g., hot air) move upward (e.g., from a chimney) through all of the hot channels of the multiple modular thermoelectric subsystems 1310 and 1320 along the first direction 561.

As shown in FIGS. 16A-16B and/or FIGS. 17A-17B, a bypass chimney (e.g., the bypass duct 1514) is used to divert a hot exhaust flow around the thermoelectric system 1300 if the heat recovery system is offline according to some embodiments. In one embodiment, one or more valves (e.g., the valves 1530, 1532, 1534 and 1536) are also used. In another embodiment, one or more moveable diverter vanes (e.g., the sidewalls 1630, 1632, 1634, and 1636) can direct the hot exhaust flow to the thermoelectric system 1300 or to the bypass chimney (e.g., the bypass duct 1514). For example, the one or more moveable diverter vanes are located below (e.g., immediately or remotely upstream of the thermoelectric system 1300). In another example, the one or more moveable diverter vanes include one or more vanes per flow path.

In yet another embodiment, to reduce the footprint of the heat recovery system, the multiple modular thermoelectric subsystems 1310 and 1320 are positioned on the perimeter of the bypass chimney with the cold fluid flows that enter from the exterior of the heat recovery system from multiple cold-fluid fans and/or pumps (e.g., the multiple cold-fluid fans and/or pumps 1351 or 1352) and/or one or more supply ducts (e.g., the supply ducts 1514 and 1524) and are discharged into center of the heat recovery system. For example, the discharge of the cold fluid flows enter the bypass chimney (e.g., the bypass duct 1514). In another example, the discharge of the cold fluid flows enter one or more exhaust ducts (e.g., the exhaust ducts 1516 and 1526) that run parallel to the bypass chimney (e.g., the bypass duct 1514).

Figure 1:
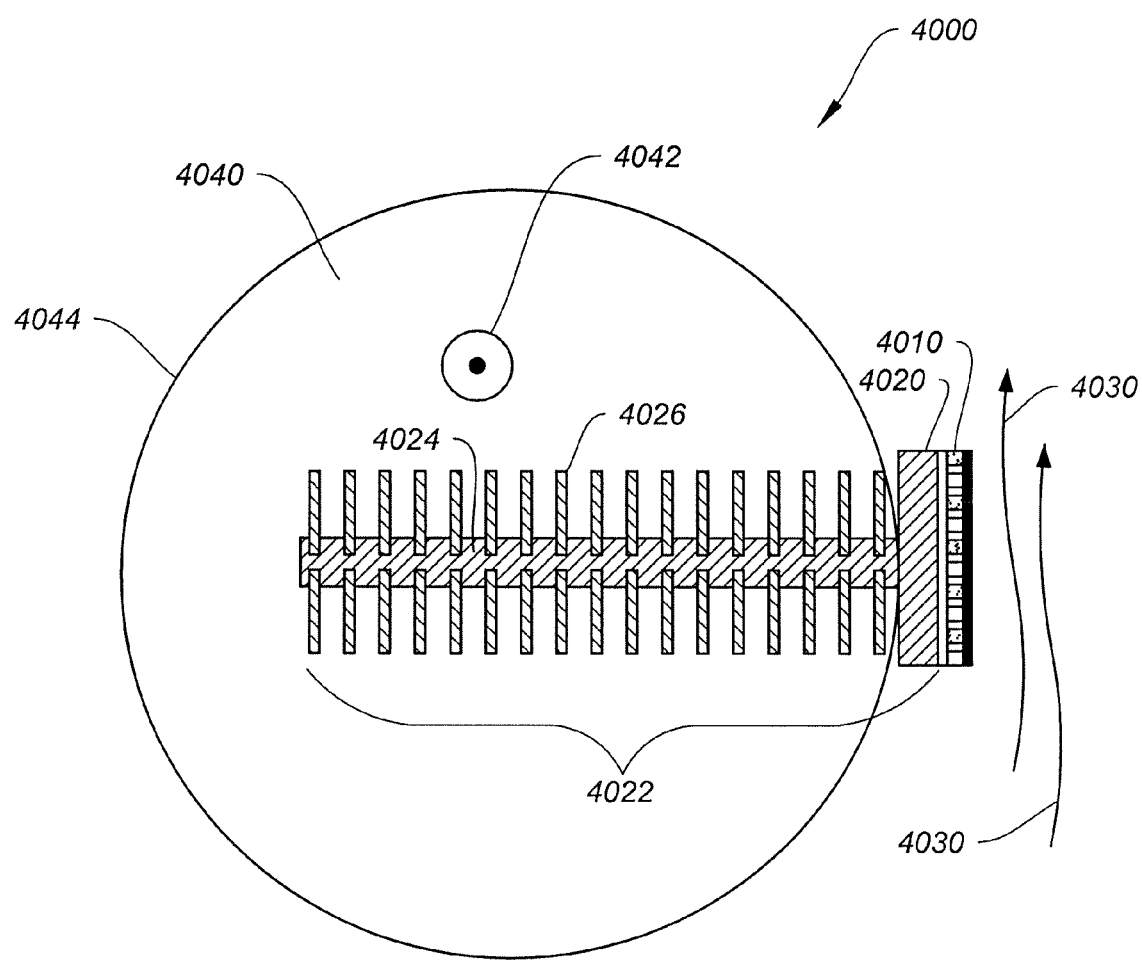
FIG. 1 is a simplified diagram showing a conventional heat recovery system using one or more thermoelectric device components for generating power from a waste heat source.

Referring to FIG. 1, in the conventional thermoelectric generation system (e.g., the conventional heat recovery system 4000), the one or more thermoelectric device components 4010 are separated from hot fluid molecules of the one or more hot fluid flows 4042 by a significant distance with large thermal resistance. Therefore, little of the available thermal energy in the one or more hot fluid flows 4042 is transferred to the one or more thermoelectric device components 4010, and the temperature gradient across the one or more thermoelectric device components 4010 is degraded according to some embodiments.

Figure 18:
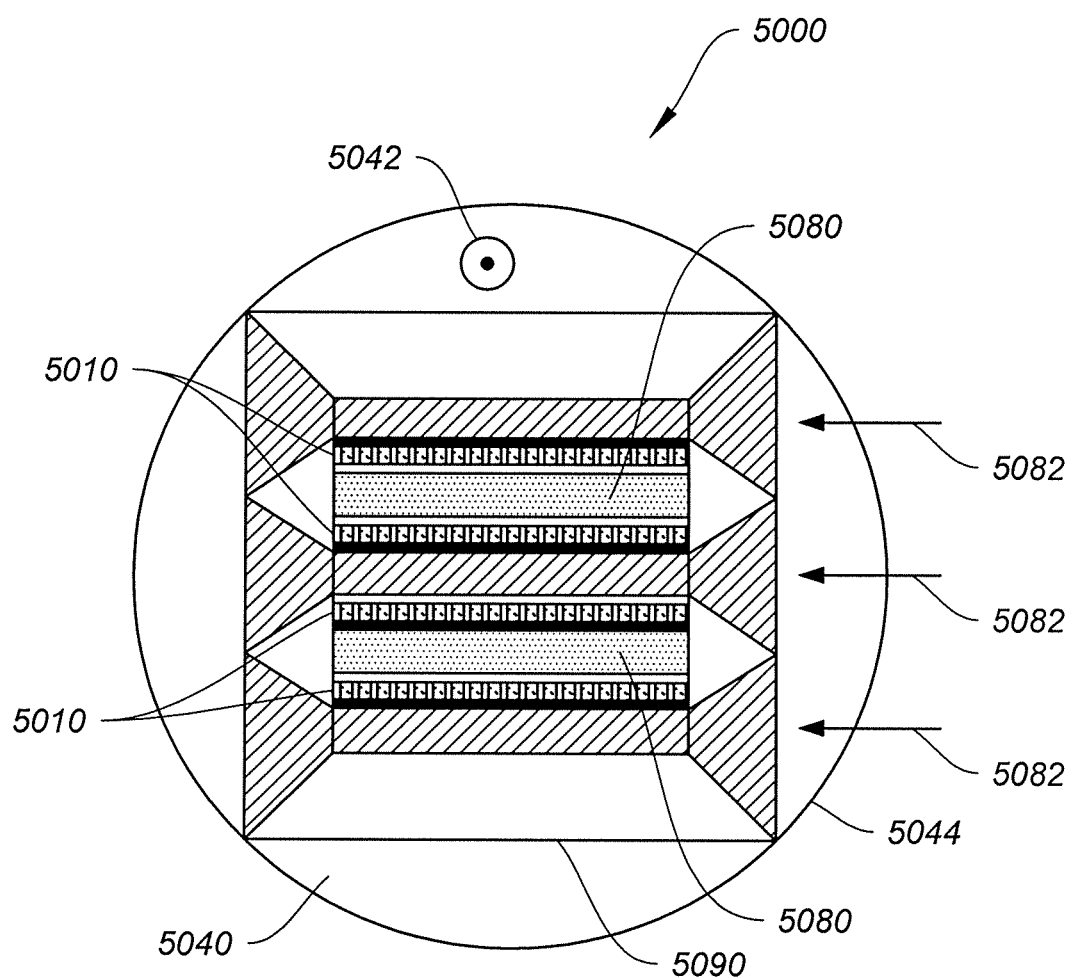
FIG. 18 is a simplified diagram showing a heat recovery system as shown in FIGS. 13A-13B, FIGS. 15A-15B, FIGS. 16A-16B, and/or FIGS. 17A-17B according to some embodiments of the present invention.

FIG. 18 is a simplified diagram showing a heat recovery system as shown in FIGS. 13A-13B, FIGS. 15A-15B, FIGS. 16A-16B, and/or FIGS. 17A-17B according to some embodiments of the present invention. This diagram is merely an example, which should not unduly limit the scope of the claims. One of ordinary skill in the art would recognize many variations, alternatives, and modifications.

As shown, in a heat recovery system 5000, one or more thermoelectric device components 5010 are within a hot flow region 5040. In one embodiment, one or more hot junctions and one or more cold junctions are generated by allowing a hot flow pathway to be sandwiched between cold flow pathways 5082 through the one or more thermoelectric device components 5010. For example, one or more hot fluid flows 5042 moves upward out of an exhaust pipe or a chimney 5044, and the thermoelectric system 5090 is placed across substantially the entire cross-sectional area of the exhaust pipe or the chimney 5044. In another example, the hot flow pathway is modified to one or more restricted channels 5080 in the vertical direction (e.g., out of the exhaust pipe or the chimney 5044). In yet another example, a hot fluid flow is separated into multiple hot fluid flows received by multiple restricted channels 5080 respectively.

According to one embodiment, the hot channels are sandwiched by one or more cold channels along a horizontal direction (e.g., from right to left), allowing one or more cold fluid flows (e.g., the cold fluid guided by directional funnels) to pass through. For example, between the corresponding hot and cold channels, the one or more thermoelectric device components are installed to stay right in the middle of the cross-sectional area of the exhaust pipe or the chimney 5044. According to another embodiment, such layout of the heat recovery system allows the one or more thermoelectric device components 5010 to be in substantially direct interaction with molecules of the one or more hot fluid flows 5042 because the hot channels directly serve as heat exchangers to deliver thermal energy carried by the one or more hot fluid flows 5042. For example, the one or more cold fluid flows 5082 through the cold channels still steadily provides cooling to the cold front of the thermoelectric device components 5010, which can be maintained with much greater temperature gradient with much improved stability. In another example, the thermoelectric device components 5010 in such heat recovery system can be designed with high thermoelectric power density for adapting the high-gradient thermal junctions with large thermal stress and is able to generate more electric power from waste heat with much improved efficiency.

According to yet another embodiment, one or more modular thermoelectric units are designed to include a hot-side heat exchanger separately disposed and sandwiched between two cold-side heat exchangers. The hot-side heat exchanger includes more than one hot channels disposed in parallel for conveying hot fluid flows in a first direction and aligned separately in a second direction with a gap between each other. Each of the two cold-side heat exchangers includes a continuous contact plate to commonly couple the two or more hot channels in the second direction for conveying a cold fluid flows. The hot-cold channel configuration leads to two thermal junctions for inserting two thermoelectric devices (e.g., two thermoelectric device components). The matching dimensions of inlet and outlet regions of the hot channels and side-to-side distance between two cold channels provide a modular unit capable of scaling up in a third direction that is perpendicular to both the first direction and the second direction.

According to yet another embodiment, a modular unit convenient for assembling to a system for various applications including power generation from waste heat is provided. The modular unit includes a simplified cuboid outline convenient for stacking each other along at least two directions. Additionally, the modular unit includes at least a hot channel for conveying heated flows and a cold channel for conveying cooling flows, maintaining a junction with substantially stable temperature gradient. The modular unit further includes at least a thermoelectric device (e.g., a thermoelectric device component) sandwiched between the hot channel and the cold channel and configured to generate electrical power by utilizing the temperature gradient across the junction. Furthermore, the modular unit is configured to align the hot channel in a first direction and the cold channel in a second direction, the second direction is either a direction opposite or the same to the first direction or a direction perpendicular to the first direction. Moreover, the modular unit is configured to be stacked along the first direction and the second direction and additionally a third direction, the third direction being perpendicular to both the first direction and the second direction.

According to yet another embodiment, a modular thermoelectric unit configured for forming a system for various thermoelectric heat recovery applications is provided. The modular unit includes a first heat exchanger including two or more first channels, each being configured for conveying heated fluid flows in a first direction and each being disposed in parallel near each other along a second direction. The second direction is perpendicular to the first direction. The module unit further includes two second heat exchangers respectively comprising a second channel and a third channel disposed in parallel for conveying cooling fluid flows in the second direction. Each and every first channel is configured to at least have a middle region completely disposed between a first contact face of the second channel and a third contact face of the third channel. The second channel is configured to have a second contact face facing a third direction that is perpendicular to both the first direction and the second direction. The third channel is substantially the same as the second channel and configured to have a fourth contact face facing a fourth direction that is opposite to the third direction. The modular unit additionally contains a first thermoelectric device (e.g., a thermoelectric device component) sandwiched between the first contact face and the first side of the first channel and a second thermoelectric device (e.g., a thermoelectric device component) sandwiched between the third contact face and the second side of the first channel. The second thermoelectric device is configured to be electrically coupled to the first thermoelectric device. The modular unit further includes at least one first electrical lead coupled to the first thermoelectric device and at least one second electrical lead coupled to the second thermoelectric device.

According to yet another embodiment, the modular unit includes a first thermal interface material disposed between the first or second side of the first channel and a hot side of the first or second thermoelectric device, respectively. Furthermore, the modular unit includes a second thermal interface material disposed between the first or third contact face of the second or third channel and a cold side of the first or second thermoelectric device, respectively. In a specific embodiment, the second or third channel is held fixed with the first or second side of each first channel by bolts, compressed from the cold side to the hot side, allowing good thermal contacts to be formed between hot or cold side of the thermoelectric device respectively with corresponding contact faces of the first or second heat exchangers. The thermoelectric devices are configured to convert a thermal gradient into electrical energy as one of solutions for recovering waste heat. Moreover, the modular unit includes an insulation material disposed at any contact regions between the first channel and the second or third channel respectively.

According to yet another embodiment, the first channel includes a first transition region (e.g., a transition component) connecting an inlet region (e.g., an inlet component) with the middle region (e.g., a middle component) and a second transition region (e.g., a transition component) connecting an outlet region (e.g., an outlet component) with the middle region (e.g., a middle component). The first transition region and the second transition region are ducts substantially similar in shape with a reduced cross section from the inlet or outlet region towards the middle region respectively. In a specific embodiment, the inlet or outlet region has a rectangular shaped cross section with a length being aligned in the second direction and a width in the third direction defining a module width of the modular unit. The module width is configured to substantially equal to a distance from the second contact face of the second channel and the fourth contact face of the third channel. In yet another specific embodiment, the modular unit has a module length that is a multiplication of the length of the inlet or outlet region of the first channel plus any gaps between two neighboring first channels. The module length is substantially equal to a length of the second channel or the third channel along the second direction.

According to yet another embodiment, a subsystem for heat recovery is provided. The subsystem is stacked from a plurality of modular units. Each modular unit includes a first heat exchanger disposed between two substantially identical second heat exchangers. The first heat exchanger includes at least a first channel in a first direction configured for passing fluid flows at a first temperature and the two second heat exchangers respectively include a second channel and a third channel, both in a second direction configured for passing fluid flows at a second temperature. The second direction is perpendicular to the first direction and the second temperature is lower than the first temperature. The first channel includes at least a middle region having a first side plate and a second side plate disposed in parallel to the second direction and configured to respectively couple a first thermoelectric device and a second thermoelectric device (e.g., substantially the same as the first thermoelectric device). The first or second thermoelectric device includes a hot-side terminal forming thermal contact with the first or second side plate of the first channel and a cold-side terminal forming thermal contact with a first or third contact face of the second or third channel respectively. The second or third channel includes a second or fourth contact face that faces outside in or opposite to a third direction that is perpendicular to both the first direction and the second direction. The modular unit is configured to dispose the second channel to contact the third channel of a neighboring modular unit to form a first common inlet region (e.g., a combined inlet component) and a first common outlet region (e.g., a combined outlet component) as the plurality of the modular units is stacked along the third direction. The modular unit is further configured to dispose all the first channels to form a second common inlet region and a second common outlet region as the plurality of the modular units is stacked along the third direction.

According to yet another embodiment, the subsystem includes an exhaust fan or pump coupled to the second common outlet region for maintaining a flow rate of the fluid flows at the first temperature. Each first channel includes a plurality of fin structures disposed at least in the middle region aligned in the first direction for enhancing thermal contact area for facilitating heat transfer from the fluid flows at the first temperature to the hot-side terminal of the first thermoelectric device. Each of the second channel and the third channel also includes a plurality of fin structures aligned in the second direction for enhancing thermal contact area for facilitating heat transfer from the cold-side terminal to the fluid flows at the second temperature. Depending on system preference, the subsystem includes a first frame structure to hold the plurality of modular units stacked together and allow individual modular unit to be removed or replaced. Furthermore, the subsystem optionally includes a second frame structure configured to hold the first frame structure and to allow the first frame structure being slide out of the second frame structure partially so that maintenance or replacement work can be performed to any or all modular units therein.

According to yet another embodiment, a method is provided for making the modular thermoelectric unit configured to be assembled to a subsystem for converting waste heat to useful energy. The method includes providing a first heat exchanger containing two or more first channels for conveying hot fluid flows in a first direction. The two or more first channels are configured to be aligned along a second direction to make contact plates on opposite sides of each first channel to be leveled respectively. The second direction is perpendicular to the first direction. The method further includes providing two thermoelectric devices (e.g., two thermoelectric device components) each having a hot-side terminal and a cold-side terminal. Additionally, the method includes respectively attaching the two hot-side terminals to contact with the two leveled contact plates on opposite sides of each first channel. The method further includes providing two second heat exchangers each including a second channel along the second direction for conveying cold fluid flows. Furthermore, the method includes disposing the two second heat exchangers by coupling each second channel respectively to the cold-side terminal of each of the two thermoelectric devices to have the two or more first channels sandwiched by two thermal junctions.

According to yet another embodiment, the method includes configuring the two or more first channels and the two second channels to form a modular unit having a height defined by the first channel and a length given by the second channel and a width given by a distance between two outer plates of the two second channels on opposite sides of the first channels. The modular unit is capable of being stacked along a third direction by binding a second channel of one modular unit with another second channel of a neighboring modular unit to form a subsystem. The third direction is perpendicular to both the first direction along the first channel and the second direction along the second channel. Additionally, the modular unit can be scaled up in length by coupling with another modular unit along the second direction to connect the second channels of one unit to the second channels of another unit.

Depending on various embodiments, one or more benefits can be achieved with the modular design of heat recovery system. Certain embodiments of the present invention provide a thermoelectric modular design that allows a wide range of heat resources to be exploited with a single design, thus allowing for high volume, low cost manufacturing of modules scalable for a variety of systems in applications of heat recovery, thermoelectric power generation, and/or thermoelectric cooling. Some embodiments of the present invention provide, for the scalable modular heat recovery unit, enhanced thermal contact area via a continuous cold sink to couple with heat sinks from two or more stacked hot fluid channels in perpendicular direction, thus reducing the cost, avoiding complex electrical and hydraulic connections, and improving the mechanical structural integrity of the thermoelectric module (e.g., a modular thermoelectric unit). Certain embodiments of the present invention can keep the cold sinks at two outside positions so that the bolts for coupling them can be kept cool, while reducing thermal loss and eliminating some materials by keeping the hot fluid channel in the middle position. Some embodiments of the present invention make it simple for assembling the thermoelectric modular unit itself and stacking multiple modular units together to form a mega module assembly or a thermoelectric subsystem with desired dimensions and further being capable of scaling up to form a customized heat recovery system. For example, the thermoelectric subsystem needs one exhaust fan or pump and one cooling fan or pump for multiple modular units, and each modular unit in the subsystem is easily accessed for maintenance and replacement. Certain embodiments of the present invention utilize nanostructure-based thermoelectric devices with enhanced thermoelectric efficiency and substantially reduced manufacturing cost for various heat recovery applications including industrial combustion processes.

According to another embodiment, an apparatus for generating electricity includes one or more first components configured to extract heat from at least a first fluid flow at a first temperature to one or more devices configured to convert thermal energy to electric energy. The first fluid flow is in a first direction. Additionally, the apparatus includes one or more second components configured to transfer heat from the one or more devices to at least a second fluid flow at a second temperature. The second temperature is lower than the first temperature, and the second fluid flow is in a second direction. Each first part of the first fluid flow corresponds to a first shortest distance to the one or more devices, and the first shortest distance is less than half the square root of the total free flow area for a corresponding first cross-section of the first fluid flow. The first cross-section is perpendicular to the first direction. Each second part of the second fluid flow corresponds to a second shortest distance to the one or more devices, and the second shortest distance is less than half the square root of the total free flow area for a corresponding second cross-section of the second fluid flow. The second cross-section is perpendicular to the second direction. For example, the apparatus is implemented according to at least FIGS. 6A-6D.

In another example, the first direction varies with movement of the first fluid flow. In yet another example, the first direction is fixed regardless of movement of the first fluid flow. In yet another example, the second direction varies with movement of the second fluid flow. In yet another example, the second direction is fixed regardless of movement of the second fluid flow. In yet another example, the one or more first components include a first heat exchanger, and the one or more second components include a second heat exchanger. In yet another example, the one or more devices are one or more thermoelectric devices. In yet another example, each of the one or more thermoelectric devices includes at least one thermoelectric material.

According to yet another embodiment, a thermoelectric apparatus includes one or more first channels configured to receive one or more first parts of a first fluid flow at a first temperature, and one or more second channels configured to receive one or more parts of a second fluid flow at a second temperature. The second temperature is lower than the first temperature. Additionally, the apparatus includes one or more third channels configured to receive one or more second parts of the first fluid flow, and the one or more third channels are separated from the one or more first channels by at least the one or more second channels. Moreover, the apparatus includes one or more first thermoelectric materials located between the one or more first channels and the one or more second channels, and one or more second thermoelectric materials located between the one or more second channels and the one or more third channels. For example, the apparatus is implemented according to at least FIGS. 2B-2C, FIGS. 3A-3B, FIG. 4B, FIG. 10, FIGS. 11A-11B, FIG. 12, FIG. 14, and/or FIG. 18.

In another example, the one or more first channels are one or more parts of a first heat exchanger, the one or more second channels are one or more parts of a second heat exchanger, and the one or more third channels are one or more parts of a third heat exchanger. The first heat exchanger and the third heat exchanger are separated by at least the second heat exchanger. In yet another example, the one or more first thermoelectric materials are located between the first heat exchanger and the second heat exchanger, and the one or more second thermoelectric materials are located between the second heat exchanger and the third heat exchanger. In yet another example, the one or more first channels are one or more parts of a first heat exchanger. The one or more second channels include multiple channels. At least one of the multiple channels is at least a part of a second heat exchanger, and at least another one of the multiple channels is at least a part of a third heat exchanger. The one or more third channels are one or more parts of a fourth heat exchanger. In yet another example, the first heat exchanger and the fourth heat exchanger are separated by at least the second heat exchanger and the third heat exchanger. In yet another example, the second heat exchanger and the third heat exchanger are in contact with each other. In yet another example, the first heat exchanger and the second heat exchanger are parts of a first modular thermoelectric unit, and the third heat exchanger and the fourth heat exchanger are parts of a second modular thermoelectric unit. In yet another example, the one or more first thermoelectric materials are located between the first heat exchanger and the second heat exchanger, and the one or more second thermoelectric materials are located between the third heat exchanger and the fourth heat exchanger. In yet another example, the one or more first thermoelectric materials are not in direct contact with the one or more first channels or the one or more second channels, and the one or more second thermoelectric materials are not in direct contact with the one or more second channels or the one or more third channels. In yet another example, the one or more second channels are further configured to receive all parts of the second fluid flow.

According to yet another embodiment, a heat recovery system includes a thermoelectric apparatus, a first duct coupled to the thermoelectric apparatus, and a second duct not coupled to the thermoelectric apparatus. The first duct and the second duct both are connected to a third duct and configured to receive by the first duct a first fluid flow at a first temperature from the third duct if the second duct does not receive the first fluid flow and to receive by the second duct the first fluid flow from the third duct if the first duct does not receive the first fluid flow. The thermoelectric apparatus is configured to receive at least a second fluid flow at a second temperature. The second fluid flow moves into the thermoelectric apparatus from one or more first perimeter parts of the thermoelectric apparatus in a first direction. The first direction is towards the second duct, and the second temperature is lower than the first temperature. Also, the thermoelectric apparatus is configured to discharge the second fluid flow into a fourth duct, and the fourth duct is the second duct or is substantially parallel with the second duct. For example, the apparatus is implemented according to at least FIGS. 13A-13B, FIGS. 15A-15B, FIGS. 16A-16B, and/or FIGS. 17A-17B.

In another example, the thermoelectric apparatus is further configured to receive at least a third fluid flow at the second temperature. The third fluid flow moves into the thermoelectric apparatus from one or more second perimeter parts of the thermoelectric apparatus in a second direction, and the second direction is towards the second duct. Also, the thermoelectric apparatus is further configured to discharge the third fluid flow into a fifth duct. The fifth duct is the second duct or is substantially parallel with the second duct. In yet another example, the second direction is opposite to the first direction. In yet another example, the heat recovery system includes a fifth duct coupled to the thermoelectric apparatus and connected to the third duct. The fifth duct and the second duct are configured to receive by the fifth duct a third fluid flow at the first temperature from the third duct if the second duct does not receive the third fluid flow and to receive by the second duct the third fluid flow from the third duct if the fifth duct does not receive the third fluid flow. In yet another example, the first duct and the second duct share a first sidewall, and the second duct and the fifth duct share a second sidewall. The first sidewall and the second sidewall are configured to move to a first position and a second position respectively in order to provide the first fluid flow to the first duct but not to the second duct and in order to provide the third fluid flow to the fifth duct but not to the second duct. Also, the first sidewall and the second sidewall are configured to move to a third position and a fourth position respectively in order to provide the first fluid flow and the third fluid flow to the second duct but not to the first duct and not to the fifth duct, wherein the first fluid flow and the third fluid flow are received by the second duct together as one fluid flow. In yet another example, the thermoelectric apparatus is a thermoelectric system. In yet another example, the first duct is a first chimney, the second duct is a second chimney, and the third duct is a third chimney. In yet another example, the thermoelectric apparatus is further configured to discharge the second fluid flow into the fourth duct through a fifth duct. In yet another example, the thermoelectric apparatus is further configured to discharge the second fluid flow into the fourth duct, and the fourth duct is parallel with the second duct.

According to yet another embodiment, a thermoelectric apparatus includes a first heat exchanger configured to transfer heat to or extract heat from a first fluid flow at a first temperature, and a second heat exchanger configured to extract heat from or transfer heat to a second fluid flow at a second temperature. The second temperature is different from the first temperature. Additionally, the apparatus includes a third heat exchanger configured to transfer heat to or extract heat from a third fluid flow at the first temperature, and the third heat exchanger is separated from the first heat exchanger by at least the second heat exchanger. Moreover, the apparatus includes one or more first thermoelectric materials sandwiched between the first heat exchanger and the second heat exchanger, one or more second thermoelectric materials sandwiched between the second heat exchanger and the third heat exchanger, and one or more components extending from the first heat exchanger to the third heat exchanger without making any thermal contact with the second heat exchanger. The one or more first thermoelectric materials, the second heat exchanger, and the one or more second thermoelectric materials are located between the first heat exchanger and the third heat exchanger, and the one or more components are configured to apply one or more compressive forces to at least the one or more first thermoelectric materials, the second heat exchanger, and the one or more second thermoelectric materials. For example, the apparatus is implemented according to at least FIG. 9.

In another example, the one or more components are not in any thermal contact with the one or more first thermoelectric materials and are not in any thermal contact with the one or more second thermoelectric materials. In yet another example, the second temperature is higher than the first temperature. In yet another example, the second temperature is lower than the first temperature. In yet another example, the one or more first thermoelectric materials are not in direct contact with the first heat exchanger or the second heat exchanger, and the one or more second thermoelectric materials are not in direct contact with the second heat exchanger or the third heat exchanger. In yet another example, the one or more components include one or more bolts extending from the first heat exchanger to the third heat exchanger without making any thermal contact with the second heat exchanger.

According to yet another embodiment, a method for generating electricity includes extracting heat from at least a first fluid flow at a first temperature to one or more devices configured to convert thermal energy to electric energy. The first fluid flow is in a first direction. Additionally, the method includes transferring heat to at least a second fluid flow at a second temperature. The second temperature is lower than the first temperature, and the second fluid flow is in a second direction. Each first part of the first fluid flow corresponds to a first shortest distance to the one or more devices, and the first shortest distance is less than half the square root of the total free flow area for a corresponding first cross-section of the first fluid flow. The first cross-section is perpendicular to the first direction. Each second part of the second fluid flow corresponds to a second shortest distance to the one or more devices, and the second shortest distance is less than half the square root of the total free flow area for a corresponding second cross-section of the second fluid flow. The second cross-section is perpendicular to the second direction. For example, the method is implemented according to at least FIGS. 6A-6D. In another example, the one or more devices are one or more thermoelectric devices.

According to yet another embodiment, a thermoelectric method for generating electricity includes receiving, by one or more first channels, one or more first parts of a first fluid flow at a first temperature, and receiving, by one or more second channels, one or more parts of a second fluid flow at a second temperature. The second temperature is lower than the first temperature. Additionally, the method includes receiving, by one or more third channels, one or more second parts of the first fluid flow. The one or more third channels are separated from the one or more first channels by at least the one or more second channels. Moreover, the method includes generating electricity by at least one or more first thermoelectric materials and one or more second thermoelectric materials. The one or more first thermoelectric materials are located between the one or more first channels and the one or more second channels, and the one or more second thermoelectric materials are located between the one or more second channels and the one or more third channels. For example, the method is implemented according to at least FIGS. 2B-2C, FIGS. 3A-3B, FIG. 4B, FIG. 10, FIGS. 11A-11B, FIG. 12, FIG. 14, and/or FIG. 18.

According to yet another embodiment, a method for heat recovery includes receiving, by a first duct, a first fluid flow at a first temperature from a third duct connected to both the first duct and a second duct if the second duct does not receive the first fluid flow. The first duct is coupled to a thermoelectric apparatus, and the second duct is not coupled to the thermoelectric apparatus. Additionally, the method includes receiving, by the second duct, the first fluid flow from the third duct if the first duct does not receive the first fluid flow. Moreover, the method includes receiving, by the thermoelectric apparatus, at least a second fluid flow at a second temperature, and the second fluid flow moves into the thermoelectric apparatus from one or more first perimeter parts of the thermoelectric apparatus in a first direction. The first direction is towards the second duct, and the second temperature is lower than the first temperature. Also, the method includes discharging, by the thermoelectric apparatus, the second fluid flow into a fourth duct. The fourth duct is the second duct or is substantially parallel with the second duct. For example, the method is implemented according to at least FIGS. 13A-13B, FIGS. 15A-15B, FIGS. 16A-16B, and/or FIGS. 17A-17B.

According to yet another embodiment, a method for thermoelectric conversion includes transferring heat to or extracting heat from a first fluid flow at a first temperature by a first heat exchanger, and extracting heat from or transferring heat to a second fluid flow at a second temperature by a second heat exchanger. The second temperature is different from the first temperature. Additionally, the method includes transferring heat to or extracting heat from a third fluid flow at the first temperature by a third heat exchanger, and the third heat exchanger is separated from the first heat exchanger by at least the second heat exchanger. Moreover, the method includes applying, by one or more components, one or more compressive forces to at least one or more first thermoelectric materials, the second heat exchanger, and one or more second thermoelectric materials. The one or more first thermoelectric materials are sandwiched between the first heat exchanger and the second heat exchanger, and the one or more second thermoelectric materials are sandwiched between the second heat exchanger and the third heat exchanger. The one or more first thermoelectric materials, the second heat exchanger, and the one or more second thermoelectric materials are located between the first heat exchanger and the third heat exchanger. The process for applying, by one or more components, one or more compressive forces includes extending the one or more components from the first heat exchanger to the third heat exchanger without making any thermal contact with the second heat exchanger. For example, the method is implemented according to at least FIG. 9.

In another example, the process for applying, by one or more components, one or more compressive forces includes extending the one or more components from the first heat exchanger to the third heat exchanger without making any thermal contact with the one or more first thermoelectric materials and without making any thermal contact with the one or more second thermoelectric materials. In yet another example, the one or more components include one or more bolts.

Although specific embodiments of the present invention have been described, it will be understood by those of skill in the art that there are other embodiments that are equivalent to the described embodiments. For example, various embodiments and/or examples of the present invention can be combined. Accordingly, it is to be understood that the invention is not to be limited by the specific illustrated embodiments, but only by the scope of the appended claims.

What is claimed is:

1. A heat recovery system, the system comprising:
a thermoelectric apparatus;
a first duct coupled to the thermoelectric apparatus;
a second duct;
wherein the first duct and the second duct both are connected to a third duct and configured to receive by the first duct a first fluid flow at a first temperature from the third duct if the second duct does not receive the first fluid flow and to receive by the second duct the first fluid flow from the third duct if the first duct does not receive the first fluid flow;
wherein the thermoelectric apparatus is configured to:
receive at least a second fluid flow at a second temperature, the second fluid flow moving into the thermoelectric apparatus from one or more first perimeter parts of the thermoelectric apparatus in a first direction, the first direction being towards the second duct, the second temperature being lower than the first temperature;
discharge the second fluid flow into a fourth duct, the fourth duct being the second duct or being substantially parallel with the second duct;
receive at least a third fluid flow at the second temperature, the third fluid flow moving into the thermoelectric apparatus from one or more second perimeter parts of the thermoelectric apparatus in a second direction, the second direction being towards the second duct, wherein the second direction is opposite to the first direction; and
discharge the third fluid flow into a fifth duct, the fifth duct being the second duct or being substantially parallel with the second duct.

2. The heat recovery system of claim 1, and further comprising:
a sixth duct coupled to the thermoelectric apparatus and connected to the third duct;
wherein the sixth duct is configured to receive a fourth fluid flow at the first temperature from the third duct if the second duct does not receive the fourth fluid flow and wherein the second duct is configured to receive the fourth fluid flow from the third duct if the sixth duct does not receive the fourth fluid flow.

3. The heat recovery system of claim 2 wherein:
the first duct and the second duct share a first sidewall; and
the second duct and the sixth duct share a second sidewall;
wherein the first sidewall and the second sidewall are configured to:
move to a first position and a second position respectively in order to provide the first fluid flow to the first duct but not to the second duct and in order to provide the fourth fluid flow to the sixth duct but not to the second duct; and
move to a third position and a fourth position respectively in order to provide the first fluid flow and the fourth fluid flow to the second duct but not to the first duct and not to the sixth duct, the first fluid flow and the fourth fluid flow being received by the second duct together as one fluid flow.

4. The heat recovery system of claim 1 wherein the thermoelectric apparatus is a thermoelectric system.

5. The heat recovery system of claim 1 wherein:
the first duct is a first chimney;
the second duct is a second chimney; and
the third duct is a third chimney.

6. The heat recovery system of claim 1 wherein the thermoelectric apparatus is further configured to discharge the second fluid flow into the fourth duct through a seventh duct.

7. The heat recovery system of claim 1 wherein the thermoelectric apparatus is further configured to discharge the second fluid flow into the fourth duct, the fourth duct being parallel with the second duct.

8. A method for heat recovery, the method comprising:
receiving, by a first duct, a first fluid flow at a first temperature from a third duct connected to both the first duct and a second duct while excluding the first fluid flow from the second duct, the first duct being coupled to a thermoelectric apparatus, the second duct being configured so as to fluidically bypass the thermoelectric apparatus;
receiving, by the second duct, the first fluid flow from the third duct so as to directly exhaust the first fluid flow while excluding the first fluid flow from the first duct;
receiving, by the thermoelectric apparatus, at least a second fluid flow at a second temperature, the second fluid flow moving into the thermoelectric apparatus from one or more first perimeter parts of the thermoelectric apparatus in a first direction, the first direction being towards the second duct, the second temperature being lower than the first temperature;
discharging, by the thermoelectric apparatus, the second fluid flow into a fourth duct, the fourth duct being the second duct or being substantially parallel with the second duct;
receiving at least a third fluid flow at the second temperature, the third fluid flow moving into the thermoelectric apparatus from one or more second perimeter parts of the thermoelectric apparatus in a second direction, the second direction being towards the second duct, wherein the second direction is opposite to the first direction; and
discharging the third fluid flow into a fifth duct, the fifth duct being the second duct or being substantially parallel with the second duct.

9. The method of claim 8, and further comprising: receiving by a sixth duct a fourth fluid flow at the first temperature from the third duct if the second duct does not receive the fourth fluid flow and receiving by the second duct the fourth fluid flow from the third duct if the sixth duct does not receive the fourth fluid flow, the sixth duct being coupled to the thermoelectric apparatus and connected to the third duct.

10. The method of claim 9 wherein:
the first duct and the second duct share a first sidewall; and
the second duct and the sixth duct share a second sidewall;
the first sidewall and the second sidewall moving to a first position and a second position respectively in order to provide the first fluid flow to the first duct but not to the second duct and in order to provide the fourth fluid flow to the sixth duct but not to the second duct; and
the first sidewall and the second sidewall moving to a third position and a fourth position respectively in order to provide the first fluid flow and the fourth fluid flow to the second duct but not to the first duct and not to the sixth duct, the first fluid flow and the fourth fluid flow being received by the second duct together as one fluid flow.

11. The method of claim 8 wherein the thermoelectric apparatus is a thermoelectric system.

12. The method of claim 8 wherein:
the first duct is a first chimney;
the second duct is a second chimney; and
the third duct is a third chimney.

13. The method of claim 8 wherein the thermoelectric apparatus further discharges the second fluid flow into the fourth duct through a seventh duct.

14. The method of claim 8 wherein the thermoelectric apparatus further discharges the second fluid flow into the fourth duct, the fourth duct being parallel with the second duct.

\* \* \* \* \*